(12) United States Patent
Nitta et al.

(10) Patent No.: US 7,881,102 B2
(45) Date of Patent: Feb. 1, 2011

(54) SEMICONDUCTOR DEVICE INCLUDING RESISTANCE STORAGE ELEMENT

(75) Inventors: Fumihiko Nitta, Tokyo (JP); Yoshikazu Iida, Tokyo (JP); Takashi Yamaki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 162 days.

(21) Appl. No.: 12/370,283

(22) Filed: Feb. 12, 2009

(65) Prior Publication Data
US 2009/0207652 A1   Aug. 20, 2009

(30) Foreign Application Priority Data
Feb. 19, 2008   (JP) .............................. 2008-037314

(51) Int. Cl.
*G11C 11/00* (2006.01)
(52) U.S. Cl. ...................... 365/163; 365/148
(58) Field of Classification Search ................. 365/163, 365/148
See application file for complete search history.

(56) References Cited

U.S. PATENT DOCUMENTS 6,856,552 B2   2/2005  Takahashi
2002/0028547 A1   3/2002  Ryu et al.
2009/0027954 A1*   1/2009  Kang et al. ................. 365/163
2009/0073753 A1*   3/2009  Osada et al. ................. 365/163

FOREIGN PATENT DOCUMENTS

JP   2001-345390   12/2001
JP   2003-173690   6/2003

OTHER PUBLICATIONS

Gill et al., "Ovonic Unified Memory—A High-Performance Non-volatile Memory Technology for Stand-Alone Memory and Embedded Applications," 2002 IEEE International Solid-State Circuits Conference, Digest of Technical Papers, pp. 202-203.

* cited by examiner

*Primary Examiner*—Anh Phung
(74) *Attorney, Agent, or Firm*—McDermott Will & Emery LLP

(57) ABSTRACT

A phase change memory includes a memory cell with a phase change element storing data according to level change of a resistance value in association with phase change, a write circuit converting the phase change element to an amorphous state or a polycrystalline state according to the logic of write data in a write operation mode, a read circuit reading out stored data from the phase change element in a readout operation mode, and a discharge circuit applying a discharge voltage to the phase change element to remove electrons trapped in the phase change element in a discharge operation mode. Accordingly, variation in the resistance value at the phase change element can be suppressed.

24 Claims, 50 Drawing Sheets

SEMICONDUCTOR DEVICE INCLUDING RESISTANCE STORAGE ELEMENT

BACKGROUND OF THE INVENTION

1. Field of the Invention

The present invention relates to semiconductor devices, particularly a semiconductor device including a resistance storage element storing data according to level change of the resistance value. More particularly, the present invention relates to a semiconductor device including a phase change element storing data according to level change of the resistance voltage in association with phase change.

2. Description of the Background Art

In recent years, advancement is seen in the development of phase change memories as a non-volatile memory allowing increased scale of integration and high-speed operation. In a phase change memory, data is stored taking advantage of level change of the resistance value in association with phase change of the phase change element. Writing data in a phase change element is carried out by conducting a current flow to the phase change element to generate heat.

This writing operation includes a reset operation and a set operation. In a reset operation, the phase change element is converted to an amorphous state of high resistance by maintaining the phase change element at a relatively high temperature. In a set operation, the phase change element is converted to a polycrystalline state of low resistance by maintaining the phase change element at a relatively low temperature for a sufficient long period. Reading out data of a phase change element is carried out by conducting a current flow in a range that does not cause change in the state of the phase change element, and identifying the high or low level of the resistance value of the phase change element (for example, refer to 2002 IEEE International Solid-State Circuits Conference, Digest of Technical Papers, pp. 202-203).

The conventional phase change memory is disadvantageous in that the resistance value of the phase change element will vary even in the period during which a writing operation is not carried out.

SUMMARY OF THE INVENTION

A main object of the present invention is to provide a semiconductor device that can suppress variation in the resistance value of the resistance storage element in a period other than a write operation period.

A semiconductor device according to the present invention includes a memory cell having a resistance storage element storing data according to level change of a resistance value, a write circuit applying a write voltage according to the logic of write data to the resistance storage element to set the resistance value of the resistance storage element in a write operation mode, a read circuit applying a read voltage to the resistance storage element to read out stored data from the resistance storage element based on current flowing to the resistance storage element in a readout operation mode, and a discharge circuit applying a discharge voltage to the resistance storage element to remove charge trapped in the resistance storage element in a discharge operation mode.

In addition to the write circuit and read circuit, the semiconductor device of the present invention includes a discharge circuit that applies a discharge voltage to the resistance storage element to remove charge trapped therein in a discharge operation mode. Therefore, variation in the resistance value of the resistance storage element caused by the charge trapped in the resistance storage element can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
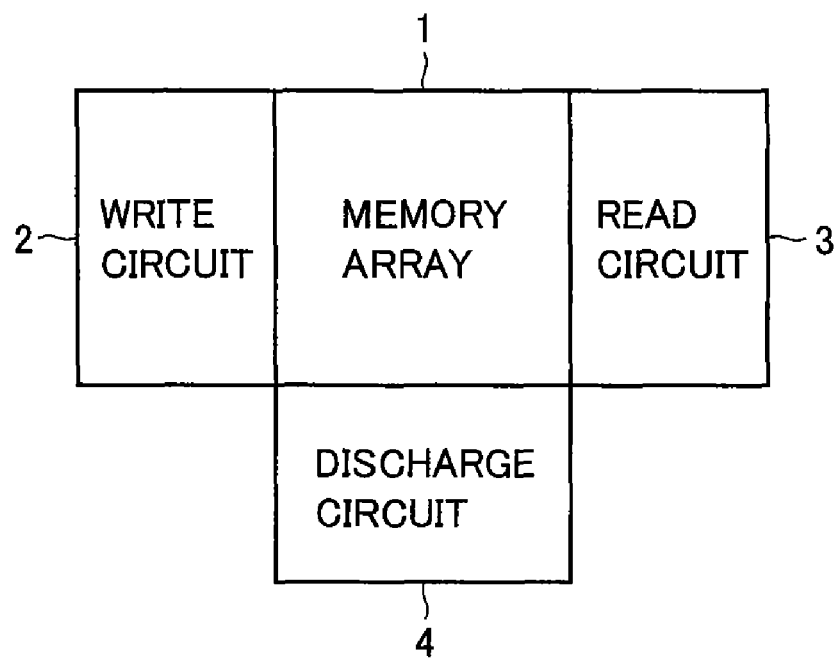
FIG. 1 is a block diagram of an entire configuration of a phase change memory according to a first embodiment of the present invention.

Referring to the block diagram of FIG. 1 representing an entire configuration of a phase change memory according to a first embodiment of the present invention, this phase change memory includes a memory array 1, a write circuit 2, a read circuit 3 and a discharge circuit 4.

Memory array 1 includes a plurality of memory cells arranged in a plurality of rows and columns. Each memory cell includes a phase change element storing data according to level change of the resistance value in association with phase change. Write circuit 2 selects any of the plurality of memory cells in memory array 1 to write data into the selected memory cell in a write operation mode. Read circuit 3 selects any of the plurality of memory cells in memory array 1 to read out stored data from the selected memory cell in a readout operation mode. Discharge circuit 4 discharges electrons trapped in the phase change element of each memory cell to suppress variation in the resistance value of the phase change element in a discharge operation mode.

Figure 2:
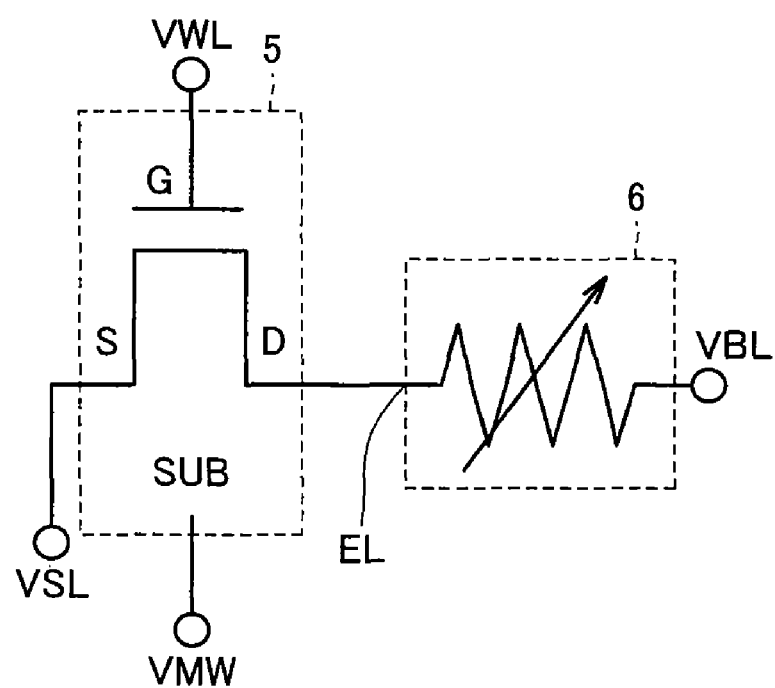
FIG. 2 is a circuit diagram of a configuration of a memory cell in the memory array of FIG. 1.

Referring to the circuit diagram of FIG. 2 representing a configuration of a memory cell in memory array 1, this memory cell includes an N channel MOS transistor 5 and a phase change element 6. N channel MOS transistor 5 has a gate G receiving a word line voltage VWL, a source S receiving source line voltage VSL, a substrate SUB (well, backgate) receiving a well line voltage VMW, and a drain D connected to one electrode EL of phase change element 6. The other electrode of phase change element 6 receives bit line voltage VBL.

Word line voltage VWL and bit line voltage VBL are controlled by write circuit 2, read circuit 3 and discharge circuit 4. Source line voltage VSL and well line voltage VMW are both fixed at ground voltage (reference voltage, 0 V) in the first embodiment.

Write circuit 2 writes, for example, data 1 and data 0 into phase change element 6 by converting phase change element 6 to an amorphous state of high resistance and a polycrystalline state of low resistance, respectively. Write circuit 2 controls the state of phase change element 6 according to the heat and the duration thereof, applied to phase change element 6. The operation of converting phase change element 6 to an amorphous state of high resistance is called a "reset" operation, whereas the operation of converting phase change element 6 to a polycrystalline state of low resistance is called a "set" operation.

Figure 3:
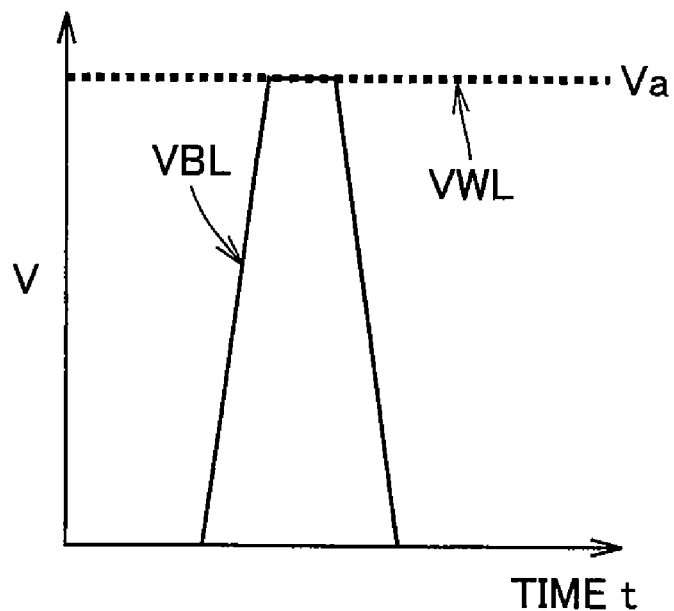
FIG. 3 is a timing chart representing a reset operation of the write circuit shown in FIG. 1.
Figure 4:
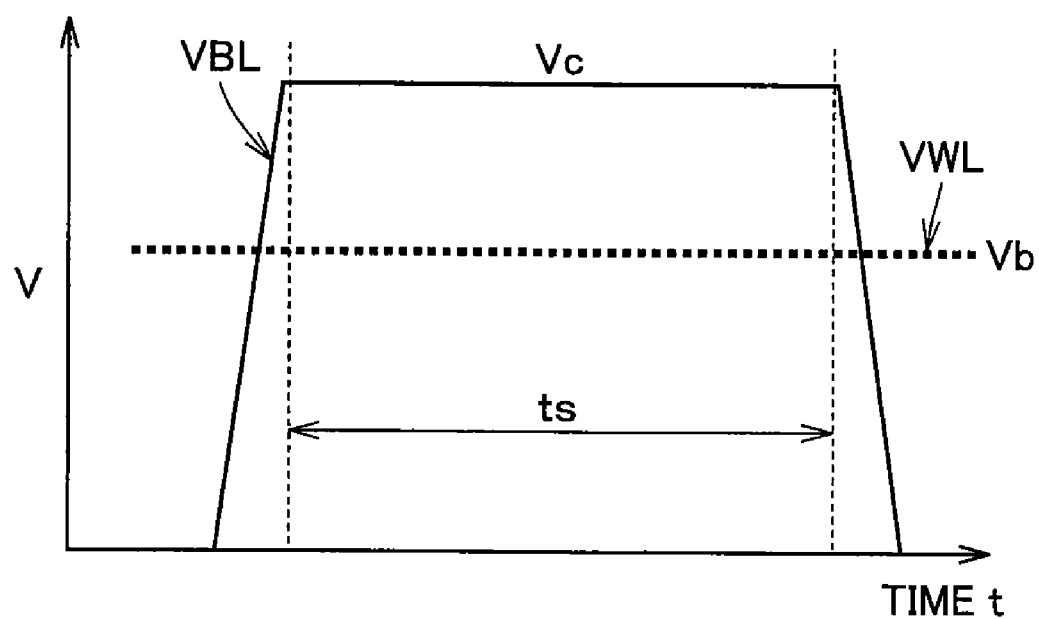
FIG. 4 is a timing chart representing a set operation of the write circuit shown in FIG. 1.
Figure 5:
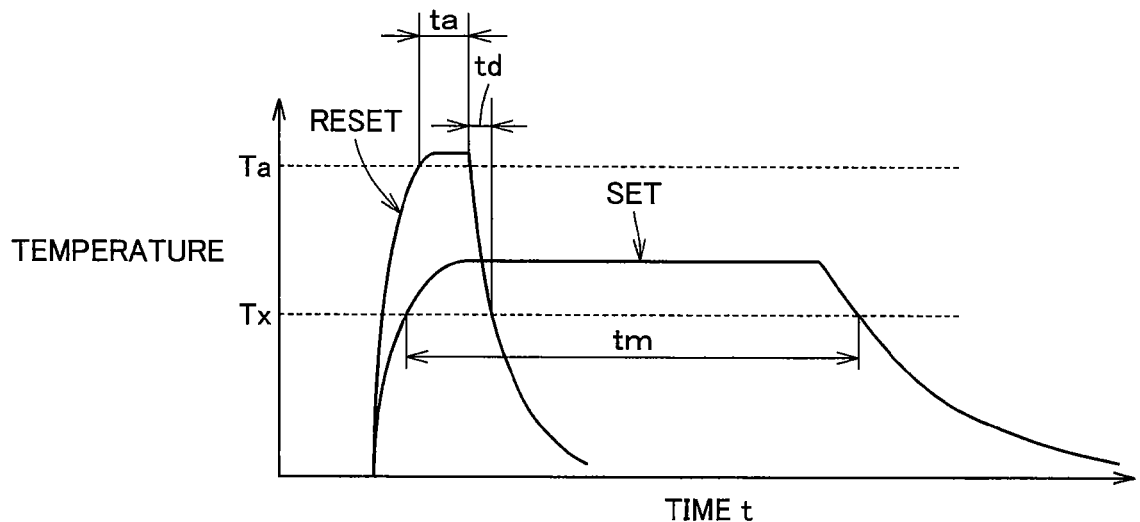
FIG. 5 is a timing chart representing temperature change of the phase change element in a reset operation and set operation shown in FIGS. 3 and 4, respectively.

FIGS. 3 and 4 are timing charts representing an operation of write circuit 2 in a reset operation mode and a set operation mode, respectively. FIG. 5 is a timing chart representing change in temperature of phase change element 6 in a reset operation mode and a set operation mode.

As shown in FIG. 3 corresponding to a reset operation, write circuit 2 sets word line voltage VWL at a constant positive level of voltage Va to render N channel MOS transistor 5 of the memory cell conductive. Then, write circuit 2 sets bit line voltage VBL at the level of positive voltage Va for a short period of time to conduct a reset current flow to phase change element 6. The reset current is set such that the temperature of phase change element 6 becomes higher than a melting point Ta of the phase change material for a short period of time ta, and then becomes lower than a crystallization temperature Tx within a short period of time td, as shown in FIG. 5. Accordingly, phase change element 6 is converted into an amorphous state of high resistance without crystallizing.

In a set operation mode corresponding to FIG. 4, write circuit 2 sets word line voltage VWL at a constant positive level of voltage Vb (<Va) to cause N channel MOS transistor 5 of the memory cell to take a resistance value of a predetermined level. Then, write circuit 2 sets bit line voltage VBL at the level of positive voltage Vc over a relatively long period of time ts to conduct a set current to phase change element 6. The set current is set such that the temperature of phase change element 6 is equal to or higher than crystallization temperature Tx of the phase change material and not more than melting point Ta over a relatively long period of time tm, as shown in FIG. 5. Crystallization temperature Tx is not more than melting point Ta and at least the glass transition point. Thus, phase change element 6 is crystallized.

Figure 6:
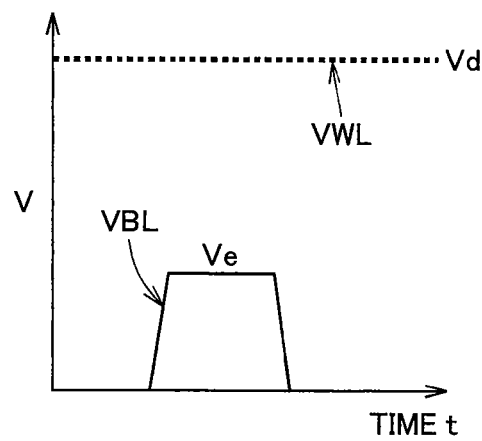
FIG. 6 is a timing chart representing an operation of the read circuit shown in FIG. 1.

Referring to the timing chart of FIG. 6 corresponding to a readout operation, read circuit 3 sets word line voltage VWL at a constant positive level of a voltage Vd to render N channel MOS transistor 5 of the memory cell conductive, and applies positive voltage Ve that is lower than the level in the reset operation and set operation mode to bit line BL. Data is read out according to the read current flowing to phase change element 6. This read current is set at a low level so that phase change element 6 does not change its state.

For example, in the case where the current flowing to phase change element 6 is lower than a predetermined threshold current, read circuit 3 determines that phase change element 6 takes an amorphous state of high resistance, and the stored data in phase change element 6 is "1". In the case where the current flowing to phase change element 6 is higher than the predetermined threshold current, read circuit 3 determines that phase change element 6 takes a polycrystalline state of low resistance, and the stored data in phase change element 6 is "0".

Figure 7:
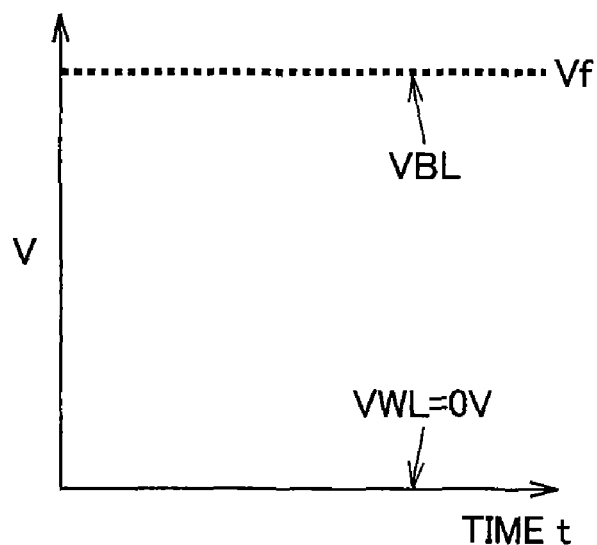
FIG. 7 is a timing chart representing an operation of the discharge circuit shown in FIG. 1.

As shown in the timing chart of FIG. 7 corresponding to a discharge operation mode, discharge circuit 4 sets word line voltage VWL at 0 V to render N channel MOS transistor 5 of the memory cell nonconductive, applies positive voltage Vf to bit line BL to discharge electrons trapped at phase change element 6 to suppress variation in the resistance value of phase change element 6 in a period other than the reset, set, and readout period.

The discharge operation may be carried out at any of the timing of immediately before or immediately after a reset operation, immediately before and also immediately after a reset operation, immediately before or immediately after a set operation, immediately before and also immediately after a set operation, immediately before or immediately after a readout operation, or immediately before and also immediately after a readout operation. Further, the discharge operation may be carried out in a period independent of the reset operation, set operation, and readout operation.

Figure 8:
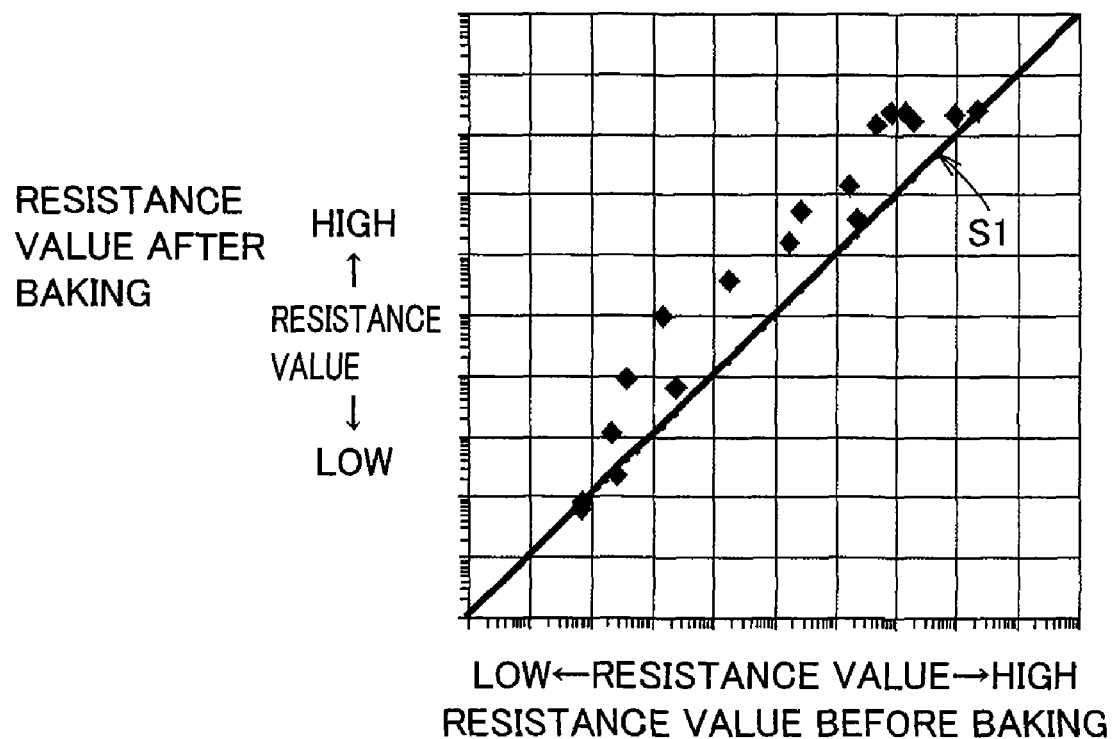
FIGS. 8, 9, 10, and 11 are diagrams to describe the necessity of the discharge operation shown in FIG. 7.

Details of this discharge operation will be described hereinafter. FIG. 8 represents the resistance value of phase change element 6 before and after high-temperature baking. A phase change element 6 subjected to a reset operation, set operation, and readout operation was employed. The horizontal axis and vertical axis of FIG. 8 represent the resistance value of phase change element 6 immediately before and immediately after, respectively, the high-temperature baking. The straight line S1 in FIG. 8 has a slope of 1. It is appreciated from FIG. 8 that the resistance value of phase change element 6 becomes higher by the high-temperature baking.

Figure 9:
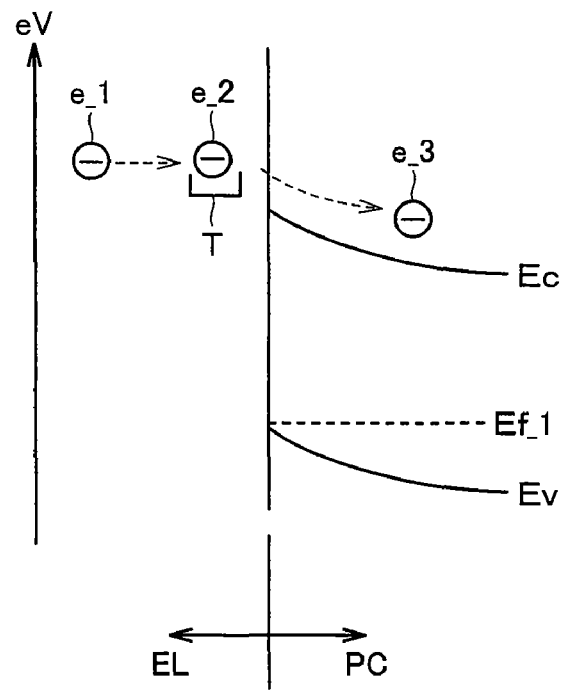

One reason for causing such a phenomenon will be described hereinafter. FIG. 9 represents the energy level in the proximity of the interface between a phase change material layer PC and electrode EL of a phase change element 6 in a reset, set, and readout operation mode. Phase change element 6 has one electrode EL formed at a partial region of one side surface of phase change material layer PC, and the other electrode formed at the entirety of the other side surface. The region of phase change material layer PC in contact with one electrode EL is called a phase change control target region, controlled to attain an amorphous state or a polycrystalline state.

In FIG. 9, Ec represents the conduction band, Ef_1 the Fermi level, Ev the valence band, T the electron trap site present in the proximity of the interface between one electrode EL and phase change material layer PC, and e_1, e_2, and e_3 the electrons. During each period of a reset, set, and readout operation, 0 V is applied to one electrode EL whereas a positive voltage is applied to the phase change material layer PC side. Electrons flow in the order of e_1→e_→e_3.

Figure 10:
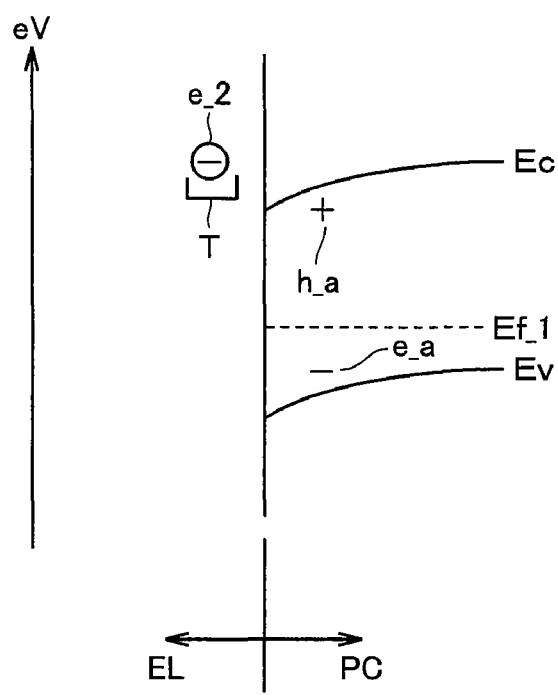

FIG. 10 represents the energy level after the operation of FIG. 9 ends. Voltage is not applied to the side of one electrode EL and phase change material layer PC in FIG. 10. Through the state shown in FIG. 9, electron e_2 is trapped at trap site T in the proximity of the interface between one electrode EL and phase change material layer PC. In the case where phase change material layer PC is amorphous, there are a hole h_a and an electron e_a trapped in the forbidden band of phase change material layer PC.

Figure 11:
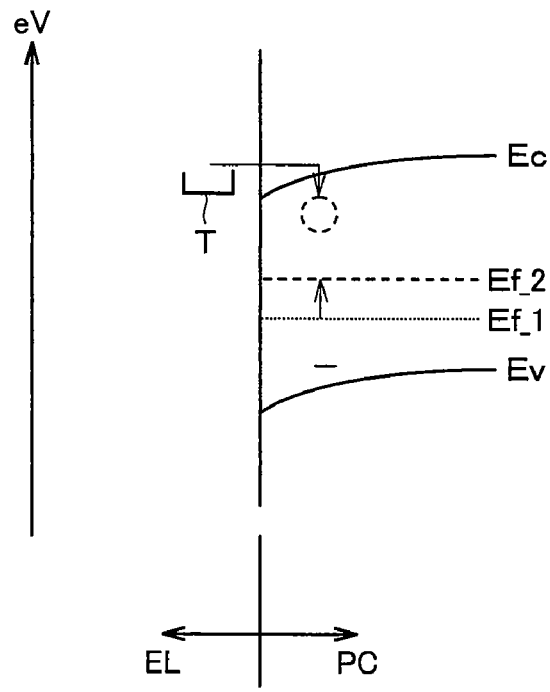

FIG. 11 represents the energy level when the phase change element is continuously left in the state of FIG. 10. When electron e_2 detraps from trap site T to be recoupled with hole h_a, as shown in FIG. 11, the Fermi level of phase change material layer PC varies from Ef_1 to Ef_2, and the carrier path at the phase change material layer PC side is blocked by the aforementioned recoupling. As a result, the resistance value of phase change element 6 becomes higher than that shown in FIG. 10. Accordingly, the variation in resistance shown in FIG. 8 occurs.

In the case where electron e_2 trapped in trap site T of FIG. 10 detraps in a direction other than towards hole h_a present in the forbidden band of phase change material layer PC after the phase change element is left and baked, the phenomenon of the resistance value of phase change element 6 being reduced occurs, caused by the decrease of the energy level of site T in which electron e_2 is trapped. To suppress such a problem, the discharge operation shown in FIG. 7 is carried out in the first embodiment to remove electrons accumulated in the proximity of the interface between phase change material layer PC and one electrode EL.

Figure 12:
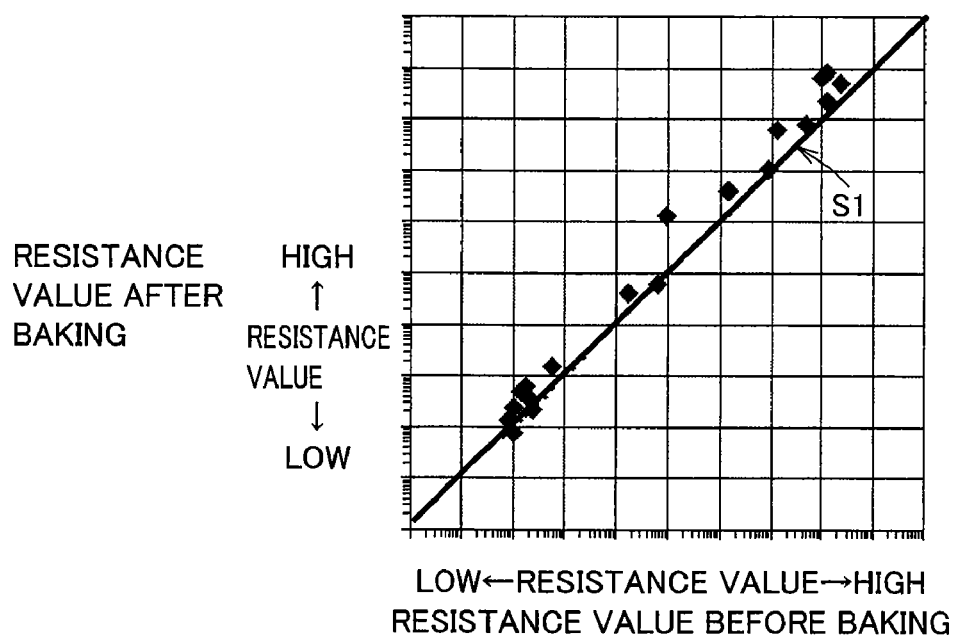
FIGS. 12, 13, 14 and 15 are diagrams to describe the effect of the discharge operation of FIG. 7.

FIG. 12 represents the resistance value of phase change element 6 before and after high-temperature baking, subjected to a discharge operation, comparable to FIG. 8. A phase change element 6 subjected to a reset, set and readout operation after a discharge operation, and further subjected to a discharge operation again, was used.

The measurements shown in FIGS. 8 and 12 are obtained, using the same phase change element 6. In the measurement of FIG. 8, it was confirmed that variation in the resistance value caused by baking converges to an insignificant level. Next, a discharge, reset, set, read out, and discharge operation was carried out a number of times identical in number to that carried out prior to the measurement of FIG. 8. Then, the measurement of FIG. 12 was carried out.

The measurements of FIG. 8 and FIG. 12 were both carried out with the same baking time and baking temperature. Further, the resistance values of a plurality of phase change elements 6 immediately before baking are distributed such that the variance and resistance value range do not have a significant difference between the measurements of FIG. 8 and FIG. 12. Likewise with FIG. 8, the horizontal axis and vertical axis of FIG. 12 represent the resistance value of phase change element 6 immediately before baking and after baking, respectively. Straight line S1 has a slope of 1. As compared with FIG. 8, it is appreciated that variation in the resistance value before and after baking is suppressed in the case of FIG. 12.

Figure 13:
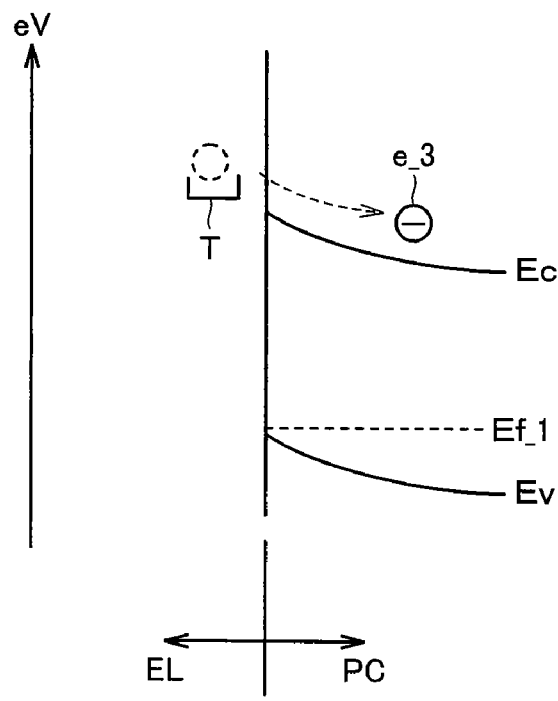
Figure 14:
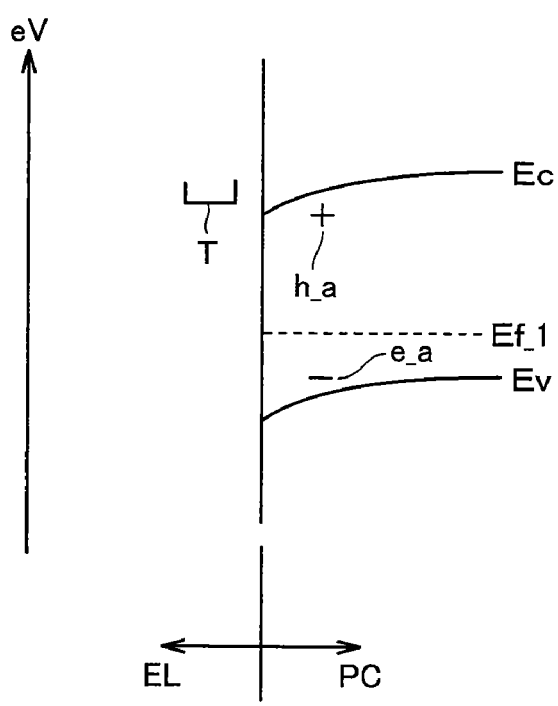

The reason why such an effect is obtained will be described hereinafter. FIG. 13 represents the energy level in the proximity of the interface between phase change material layer PC and electrode EL of phase change element 6 in a discharge operation, comparable to FIG. 9. Since there is no feeding from the one electrode EL side in a discharge operation mode, there is no supply of a new electron e_1 from the one electrode EL side towards trap site T, as shown in FIG. 9. In contrast, positive voltage VBL=Vf is supplied towards phase change material layer PC. Therefore, electron e_3 formally present in trap site T in the proximity of the interface will move towards the side of positive voltage VBL=Vf. As a result, the amount of electrons trapped at the interface region between one electrode EL and phase change material layer PC decreases, as shown in FIG. 14, after the discharge operation is completed. This suppresses variation in the resistance of phase change element 6 that has been left and baked subsequently.

Figure 15:
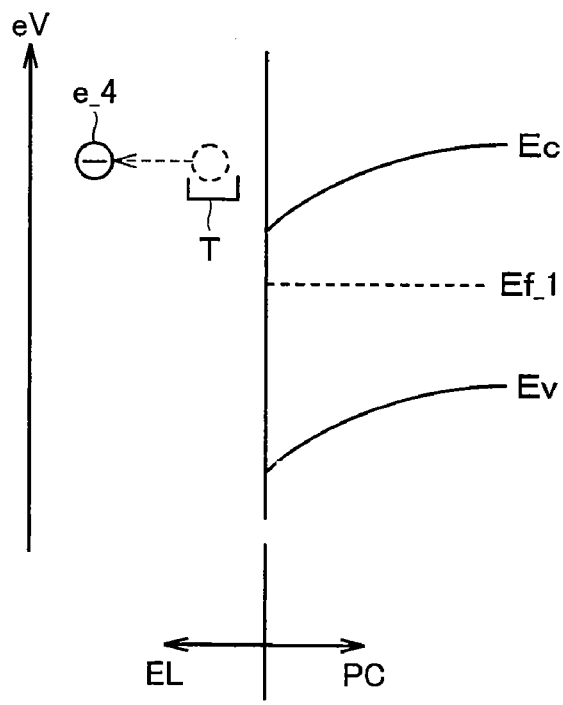

Electron e_2 that was trapped in trap site T shown in FIG. 10 now detrapped in a direction other than towards hole h_a present in the forbidden band of phase change material layer PC in phase change element 6 that has been left and baked causes a lower energy level of site T where electron e_2 was formally trapped, leading to the phenomenon of reducing the resistance value of phase change element 6. This phenomenon is attributed to accumulation of electron e_2 towards trap site T of FIG. 10. By applying a discharge operation, this accumulation of electron e_2 can also be decreased, as shown in FIG. 15. Thus, variation in resistance due to such a phenomenon can be suppressed by carrying out a discharge operation.

Figure 16:
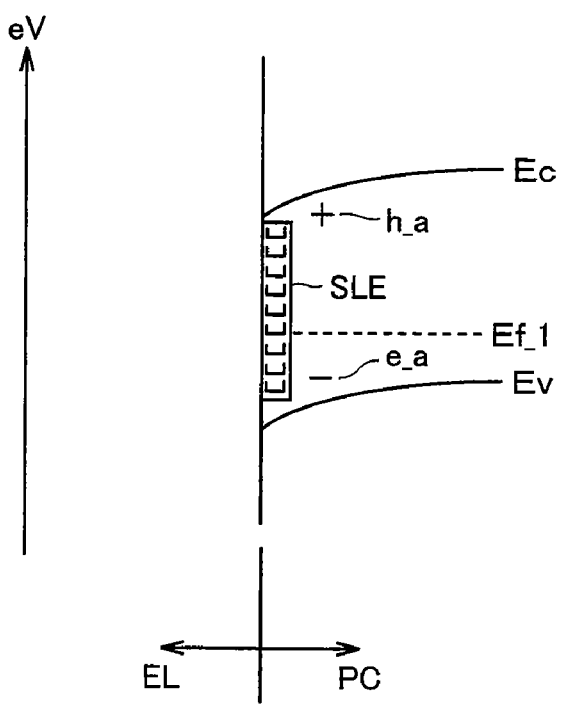
FIG. 16 represents a modification of the first embodiment.
Figure 17:
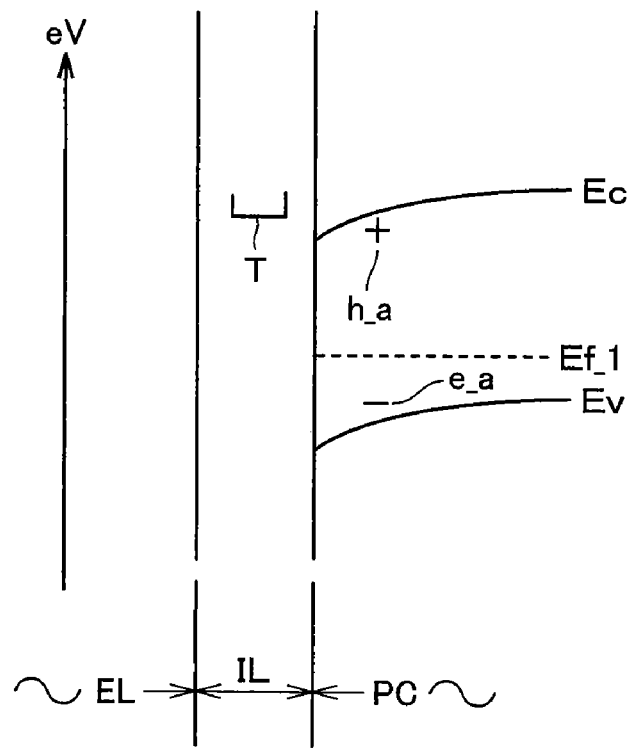
FIG. 17 represents another modification of the first embodiment.

The cause of resistance variation at phase change element 6 and the advantage of a discharge operation similarly apply to a phase change element 6 having a surface level SLE at the interface between one electrode EL and phase change material layer PC, as shown in FIG. 16, and to a phase change element 6 having a configuration in which an insulation layer IL is sandwiched between one electrode EL and phase change material layer PC element, as shown in FIG. 17.

In the first embodiment, the present invention has been described corresponding to a case where a memory cell is based on a configuration in which N channel MOS transistor 5 and phase change element 6 are electrically connected in series. The present invention is also applicable to a memory cell of a different configuration.

Figure 18:
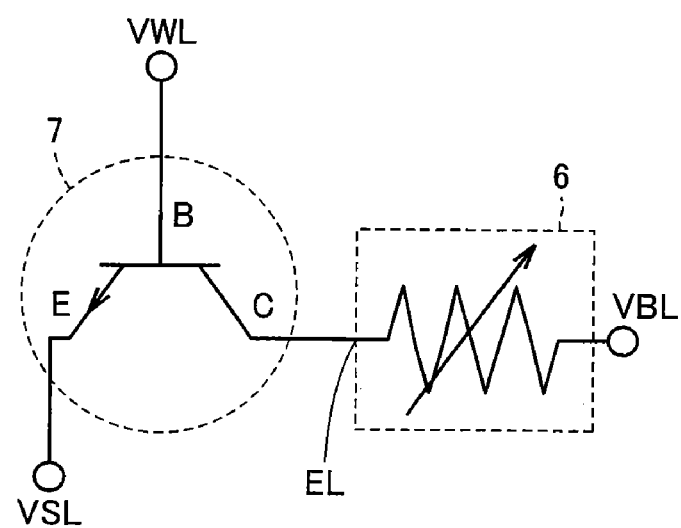
FIGS. 18-21 represent further modifications of the first embodiment.

For example, N channel MOS transistor 5 may be replaced with a P channel MOS transistor, or with a bipolar transistor 7, as shown in FIG. 18. Bipolar transistor 7 has a base B receiving word line voltage VWL, a collector C connected to one electrode EL of phase change element 6, and an emitter E receiving source voltage VSL.

Figure 19:
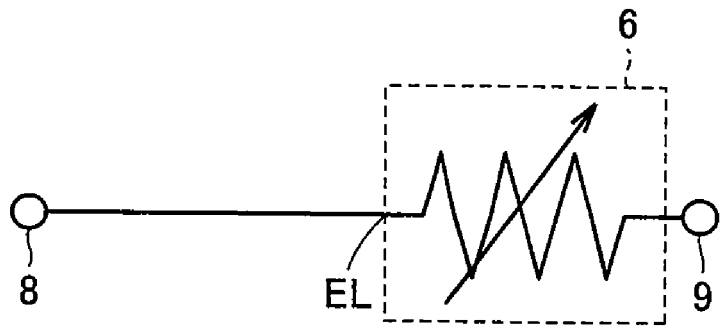

As shown in FIG. 19, the present invention is also applicable to a memory cell formed of just a phase change element 6 and two terminals 8 and 9 at respective ends. Terminal 8 is connected to one electrode EL of phase change element 6. Terminal 9 is connected to the other electrode of phase change element 6. A discharge operation corresponds to the case where one of the two terminals 8 and 9 is set to an open state (floating state, high impedance state) and the other terminal is fed. For example, when one terminal 8 is set at an open state and other terminal 9 is set at the level of a positive voltage, the energy level at the interface region between one electrode EL and phase change material layer PC is as shown in FIG. 13. The state of FIG. 14 can be realized through this operation. In the case where other terminal 9 is set at an open state and one terminal 8 is set at the level of a positive voltage, the energy level at the interface region between one electrode EL and phase change material layer PC is as shown in FIG. 15. Referring to FIG. 15, electron e_4 formerly present in trap site T detraps, so that the state of FIG. 14 can be realized. The resistance variation at phase change element 6 caused by the phenomenon shown in FIG. 11 can be suppressed.

Figure 20:
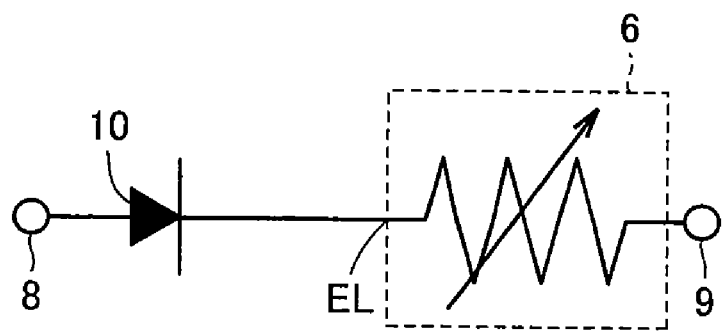

The present invention is also applicable to a memory cell having a configuration in which a diode 10 and phase change element 6 are electrically connected in series between terminals 8 and 9, as shown in FIG. 20. This memory cell corresponds to the memory cell of FIG. 2, with substrate SUB and a region from drain D to the other electrode of phase change element 6 in N channel MOS transistor 5 cut out. In this memory cell, diode 10 has its anode connected to terminal 8, and its cathode connected to one electrode EL of phase change element 6. Based on the reason described with reference to FIG. 13, a discharge operation can be carried out by setting the voltage level of other terminal 9 relatively higher than the voltage of one terminal 8, so that diode 10 operates at reverse bias.

Further, a discharge operation can be carried out by setting one terminal 8 at an open state and other terminal 9 at a positive voltage. Moreover, a discharge operation can be carried out by setting other terminal 9 at an open state and one terminal 8 at a negative voltage. In addition, based on the reason described with reference to FIG. 15, a discharge operation can be carried out by setting other terminal 9 at an open state and one terminal 8 at a positive voltage, or by setting one terminal 8 at an open state and other terminal 9 at a negative voltage, so that diode 10 operates at forward bias.

Figure 21:
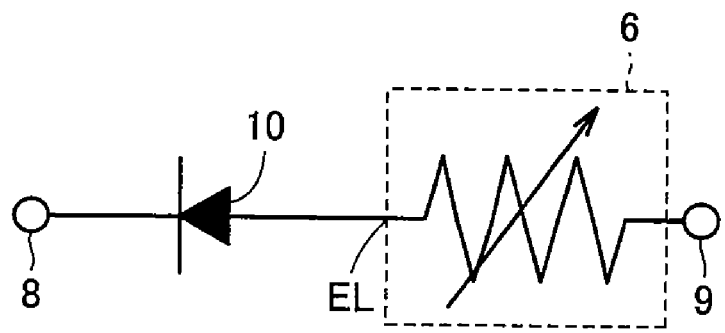

Furthermore, the present invention is applicable to a memory cell having a configuration in which phase change element 6 and diode 10 are electrically connected in series between terminals 9 and 8, as shown in FIG. 21. In this memory cell, diode 10 has its cathode connected to terminal 8 and its anode connected to one electrode EL of phase change element 6.

In this memory cell, based on the reason described with reference to FIG. 15, a discharge operation can be carried out by supplying a voltage that is relatively negative than that of one terminal 8 towards other terminal 9, or supplying a voltage relatively positive than that of other terminal 9 towards one terminal 8, so that diode 10 operates at reverse bias. Further, a discharge operation can be carried out by setting one terminal 8 at an open state and other terminal 9 at a negative voltage, or setting other terminal 9 at an open state and one terminal 8 at a positive voltage. Moreover, based on the reason described with reference to FIG. 13, a discharge operation can be carried out by setting other terminal 9 at an open state and one terminal 8 at a negative voltage, or by setting one terminal 8 at an open state and other terminal 9 at a positive voltage, so that diode 10 operates at forward bias.

Second Embodiment

Figure 22:
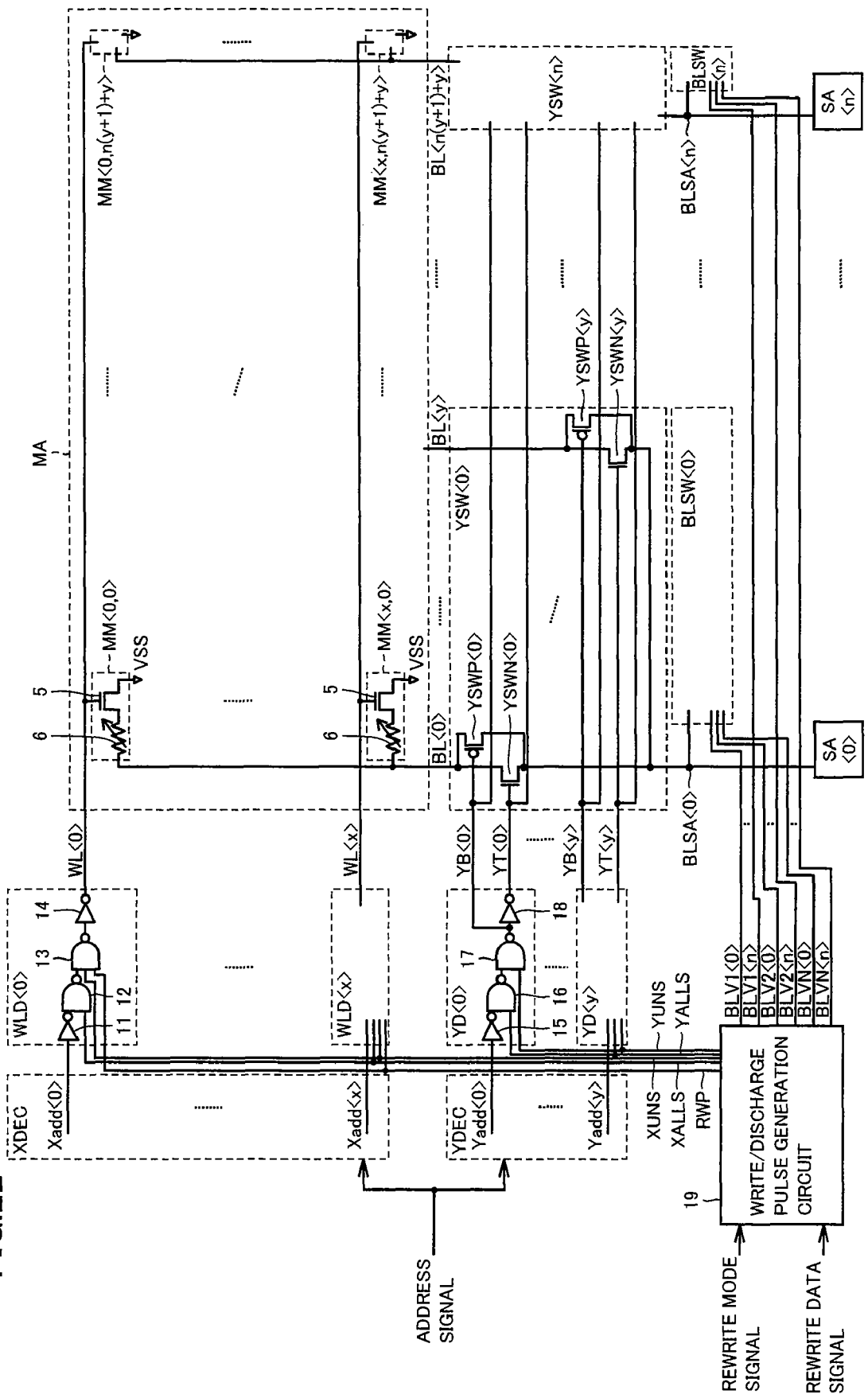
FIG. 22 is a block diagram representing an entire configuration of a phase change memory according to a second embodiment of the present invention.

Referring to the circuit block diagram of FIG. 22 corresponding to a phase change memory of a second embodiment, this phase change memory includes a memory array MA. Memory array MA includes a plurality of memory cells MM <0, 0> to MM <x, n (y+1)+y> arranged in a plurality of rows and columns, a plurality of word lines WL <0> to WL <x> provided corresponding to the plurality of rows, respectively, and a plurality of bit lines BL <0> to BL <n (y+1)+y> provided corresponding to the plurality of columns, respectively, where x, y and n are natural numbers. Bit lines BL <0> to BL <n (y+1)+y> are divided into (n+1) bit line groups for every (y+1) lines.

Each memory cell MM has a configuration identical to that shown in FIG. 2, and include N channel MOS transistor 5 and phase change element 6. N channel MOS transistor 5 has its gate connected to a corresponding word line WL, its source receiving ground voltage VSS (0 V), and its drain connected to a corresponding bit line BL via phase change element 6.

The present phase change memory includes an X decoder XDEC, and word line drivers WLD <0> to WLD <x> provided corresponding to word lines WL <0> to WL <x>, respectively. X decoder XDEC drives any of internal row address signals Xadd <0> to Xadd <x> to an activation level of H (logical high) according to an input address signal.

Each word line driver WLD is formed of a logic circuit including inverters 11 and 14, and NAND gates 12 and 13. Each word line driver WLD pulls up word line WL to a selected level of H according to a read write pulse RWP when a corresponding internal row address signal Xadd attains an H level, an X all-select signal XALLS attains an H level, and an X all-deselect signal XUNS attains an H level.

Further, each word line driver WLD pulls up all word lines WL <0> to WL <x> to the selected level of H when X all-select signal XALLS attains an L level, X all-deselect signal XUNS attains an H level, and read write pulse RWP attains an H level. Further, each word line driver WLD drives all word lines WL <0> to WL <x> to the deselect level of L when X all-deselect signal XUNS attains an L level.

The present phase change memory also includes Y switches YSW <0> to YSW <n> provided corresponding to n+1 bit line groups, respectively. Y switches YSW <0> to YSW <n> are connected to nodes BLSA <0> to BLSA <n>, respectively. Each Y switch YSW includes P channel MOS transistors YSWP <0> to YSWP <y> connected between corresponding (y+1) bit lines BL and a corresponding node BLSA, respectively, and N channel MOS transistors YSWN <0> to YSWN <y> connected between corresponding (y+1) bit lines BL and a corresponding node BLSA, respectively. P channel MOS transistors YSWP <0> to YSWP <y> receive bit line select signals YB <0> to YB <y>, respectively, at their gates. N channel MOS transistors YSWN <0> to YSWN <y> receive bit line select signals YB <0> to YB <y>, respectively, at their gates. Bit line select signals YB <0> to YB <y> are inverted signals of bit line select signals YT <0> to YT <y>, respectively. In a bit line select mode, one or all of bit line select signals YT <0> to YT <y> are set at an H level. Therefore, one or (n+1) bit lines BL are connected to each of nodes BLSA <0> to BLSA <n> by Y switches YSW <0> to YSW <n>.

The present phase change memory further includes a Y decoder YDEC, and Y drivers YD <0> to YD <y> provided corresponding to bit line select signals YB <0> to YB <y> and YT <0> to YT <y>, respectively. Y decoder YDEC drives any of internal column address signals Yadd <0> to Yadd <y> to an activation level of H according to an input address signal.

Each Y driver YD is formed of a logic circuit including inverters 15 and 18, and NAND gates 16 and 17. Each Y driver YD drives corresponding bit lines select signals YB and YT to an L level and an H level, respectively, in response to a corresponding internal column address signal Yadd pulled up to an activation level of H, when Y all-select signal YALLS and Y all-deselect signal YUNS are at an H level. In this case, one bit line BL is connected to each of nodes BLSA <0> to BLSA <n>.

Further, each Y driver YD drives corresponding bit line select signals YB and YT to an L level and H level, respectively, when Y all-select signal YALLS and Y all-deselect signal YUNS attain an L level and an H level, respectively. In this case, (n+1) bit lines BL are connected to each of nodes BLSA <0> to BLSA <n>.

Further, each Y driver YD drives corresponding bit line select signals YB and YT to an H level and an L level, respectively, when deselect signal YUNS is at an L level. In this case, bit lines BL <0> to BL <n (y+1)+y> are not connected with nodes BLSA <0> to BLSA <n> in this case.

Further, the present phase change memory includes write/discharge circuits BLSW <0> to BLSW <n> and read sense amplifier SA <0> to SA <n> connected to nodes BLSA <0> to BLSA <n>, respectively, and a write/discharge pulse generation circuit 19. Write/discharge circuits BLSW <0> to BLSW <n> are under control of pulse signals BLV1 <0> to BLV1 <n>, BLV2 <0> to BLV2 <n>, and BLVN <0> to BLVN <n>, respectively.

Figure 23:
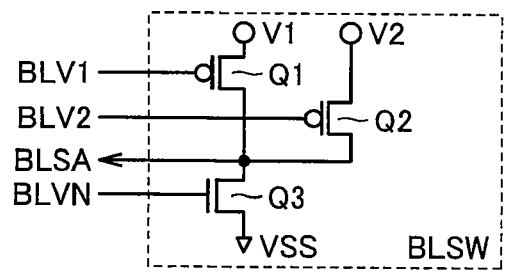
FIG. 23 is a circuit diagram representing a configuration of the write/discharge circuit shown in FIG. 22.

As shown in FIG. 23, each write/discharge circuit BLSW includes P channel MOS transistors Q1 and Q2, and an N channel MOS transistor Q3. P channel MOS transistors Q1 and Q2 have their sources receiving voltages V1 and V2, respectively, have their gates receiving pulse signals BLV1 and BLV2, respectively, and have their drains both connected to node BLSA. N channel MOS transistor Q3 has its drain connected to node BLSA, its gate receiving pulse signal BLVN, and its source receiving ground voltage VSS (0 V).

In the case where pulse signals BLV1, BLV2, and BLVN are at an L level, an H level, and an L level, respectively, P channel MOS transistor Q1 is rendered conductive, and node BLSA attains the level of voltage V1. In the case where pulse signals BLV1, BLV2, and BLVN are at an H level, an L level, and an L level, respectively, P channel MOS transistor Q2 is rendered conductive, and node BLSA attains the level of voltage V2. In the case where pulse signals BLV1, BLV2, and BLVN are all at an H level, N channel MOS transistor Q3 is rendered conductive, and node BLSA attains the level of 0 V. In the case where pulse signals BLV1, BLV2, and BLVN attain an H level, an H level, and an L level, respectively, transistors Q1-Q3 are all rendered nonconductive, and node BLSA attains an open state.

Readout sense amplifier SA applies a predetermined voltage to a corresponding node BLSA in a readout operation mode to read out the stored data from memory cell MM based on the current flowing to the line of ground voltage VSS via corresponding transistors YSWN and YSWP, bit line BL, and memory cell MM.

Write/discharge pulse generation circuit 19 generates X all-select signal XALLS, X all-deselect signal XUNS, Y all-select signal YALLS, Y all-deselect signal YUNS, read write pulse RWP, and pulse signals BLV1 <0> to BLV1 <n>, BLV2 <0> to BLV2 <n>, BLVN <0> to BLVN <n> according to a rewrite mode signal and rewrite data signal.

Figure 24:
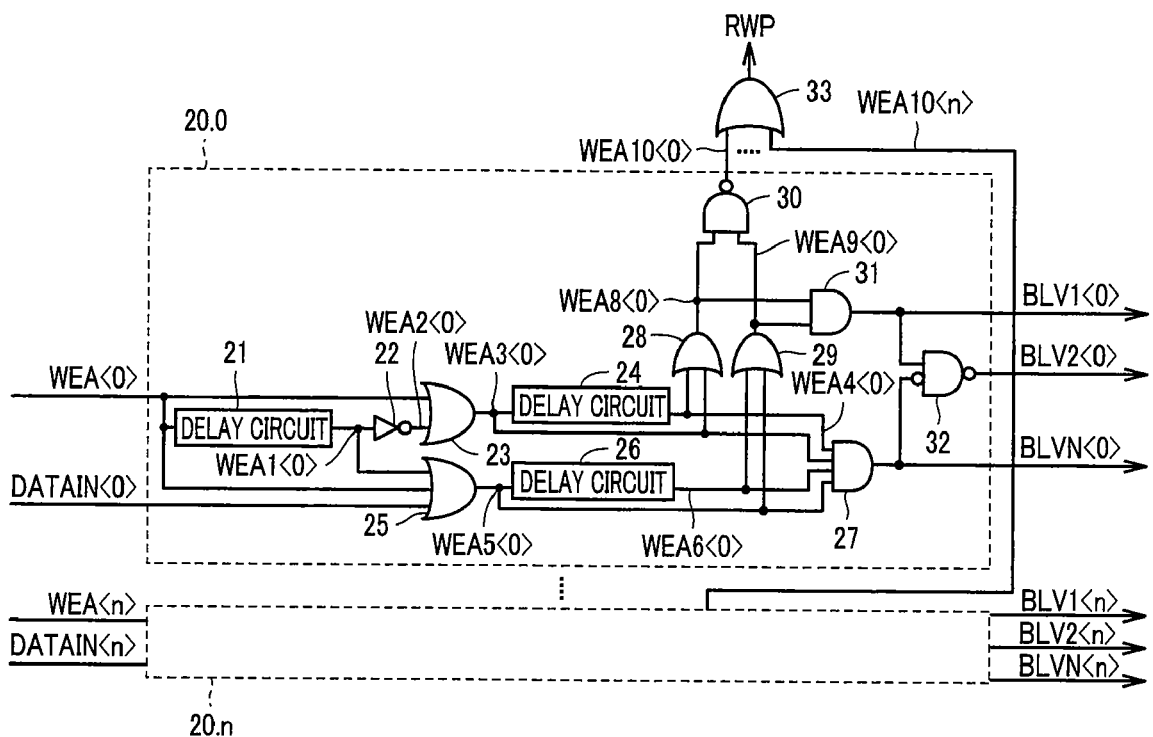
FIG. 24 is a circuit diagram representing a configuration of the write/discharge pulse generation circuit shown in FIG. 22.

Referring to the circuit block diagram of FIG. 24 representing the main parts, write/discharge pulse generation circuit 19 includes pulse generation circuits 20.0 to 20.n provided corresponding to write/discharge circuits BLSW <0> to BLSW <n>, respectively, and an OR gate 33.

Pulse generation circuits 20.0 to 20.n respond to write activation signals WEA <0> to WEA <n> included in the rewrite mode signal, and write data input signals DATAIN <0> to DATAIN <n> included in the rewrite data signal, respectively, to generate pulse signals BLV1 <0> to BLV1 <n>, BLV2 <0> to BLV2 <n>, and BLVN <0> to BLVN <n>, respectively.

Each pulse generation circuit 20 includes delay circuits 21, 24 and 26, an inverter 22, OR gates 23, 25, 28 and 29, AND gates 27 and 31, a NAND gate 30, and a gate circuit 32. Delay circuit 21 causes delay of write activation signal WEA to generate a signal WEA1. Inverter 22 inverts signal WEA1 to generate a signal WEA2. OR gate 23 generates a logical OR signal WEA3 of write activation signal WEA and output signal WEA2 from inverter 22. Delay circuit 24 causes delay of output signal WEA3 from OR gate 23 to generate a signal WEA4.

OR gate 25 generates a logical OR signal WEA5 of output signal WEA1 from delay circuit 21, write activation signal WEA, and write data input signal DATAIN. Delay circuit 26 causes delay of output signal WEA5 from OR gate 25 to generate a signal WEA6. AND gate 27 outputs the logical AND of signals WEA3 to WEA6 as a pulse signal BLVN.

OR gate 28 generates a logical OR signal WEA8 of signals WEA3 and WEA4. OR gate 29 generates a logical OR signal WEA9 of signals WEA5 and WEA6. NAND gate 30 generates an inverted signal WEA10 of the logical AND signal of signals WEA8 and WEA9. AND gate 31 outputs the logical AND of signals WEA8 and WEA9 as pulse signal BLV1. Gate circuit 32 outputs an inverted signal of the logical AND signal between pulse signal BLV1 and the inverted signal of pulse signal BLVN as pulse signal BLV2. OR gate 33 outputs the logical OR signal of signals WEA10 <0> to WEA10 <n> generated at pulse generation circuits 20.0 to 20.n as read write pulse RWP.

Figure 25:
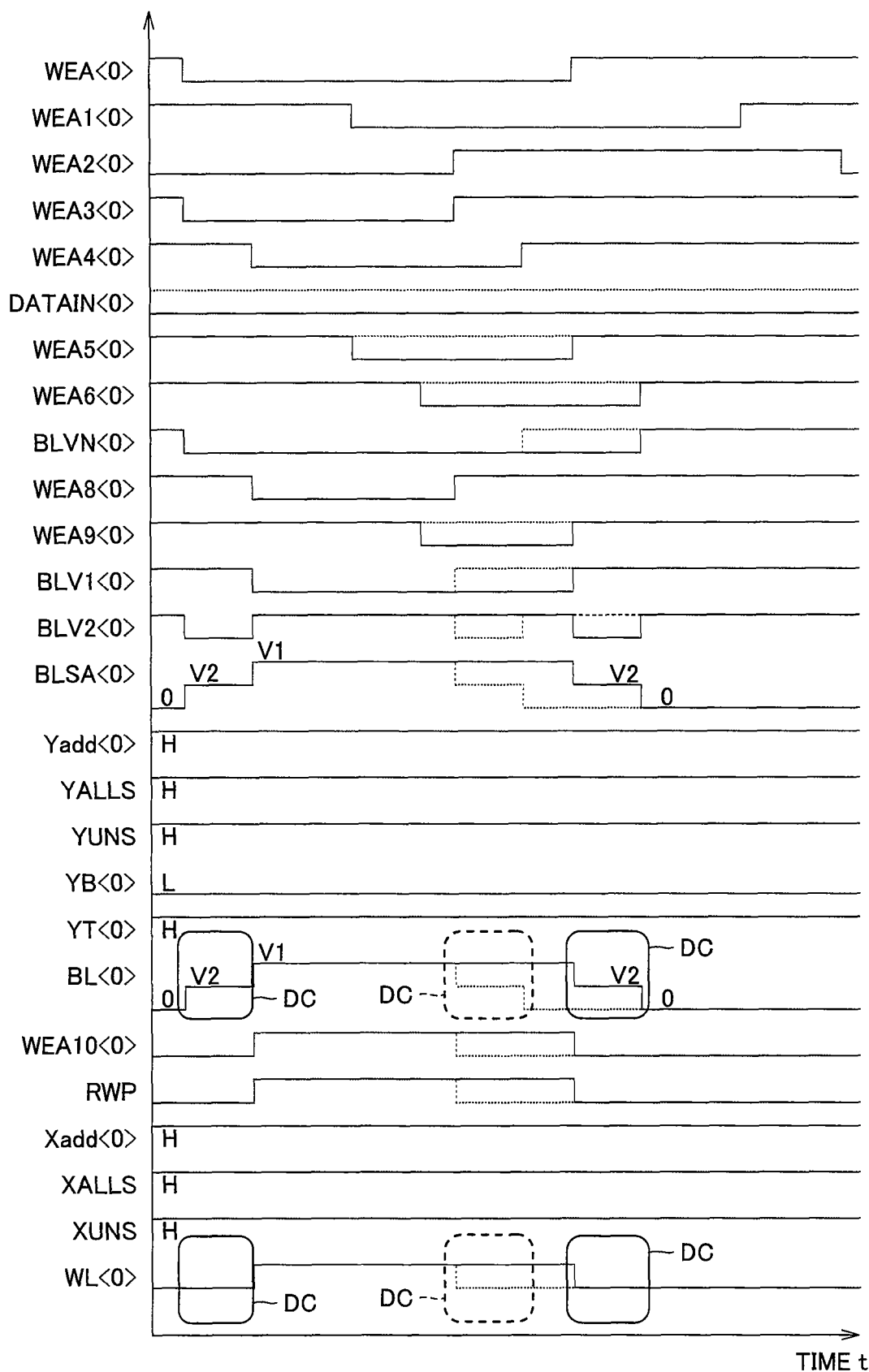
FIG. 25 is a timing chart representing an operation of the phase change memory of FIGS. 22-24.

FIG. 25 is a timing chart representing an operation of the phase change memory of FIGS. 22-24. In FIG. 25, the operation of the portion corresponding to pulse generation circuit 20.0 is illustrated. The operation in association with a signal whose waveform changes depending upon the level of write data input signal DATAIN <0> is represented in dotted lines and solid lines corresponding to the case where write data input signal DATAIN <0> is at an H level (reset operation), and just in solid lines when write data input signal DATAIN <0> is at an L level (set operation).

In FIG. 25, write activation signal WEA <0> is held at an activation level of L for just a predetermined time. Write activation signal WEA <0> is delayed by delay circuit 21 to become signal WEA1 <0>. Signal WEA1 <0> is inverted and delayed by inverter 22 to become signal WEA2 <0>. The logical OR of signals WEA <0> and WEA2 <0> becomes signal WEA3 <0>. Signal WEA3 <0> is delayed by delay circuit 24 to become signal WEA4 <0>.

When write data input signal DATAIN <0> is at an L level, the logical OR of signals WEA <0> and WEA1<0> becomes signal WEA5 <0>. Signal WEA5 <0> is delayed by delay circuit 26 to become signal WEA6 <0>. The logical AND of signals WEA3 to WEA6 becomes a pulse signal BLVN <0>. Pulse signal BLVN <0> is held at an L level during the period starting from the falling edge of write activation signal WEA <0> to the rising edge of signal WEA6 <0>. During this period, N channel MOS transistor Q3 of FIG. 23 attains a nonconductive state.

Further, the logical OR of signals WEA3 <0> and WEA4 <0> becomes signal WEA8 <0>. The logical OR of signals WEA5 <0> and WEA6 <0> becomes signal WEA9 <0>. The logical AND of signals WEA8 <0> and WEA9 <0> becomes pulse signal BLV1 <0>. Pulse signal BLV1 <0> is held at an L level during the period starting from the falling edge of signal WEA8 <0> to the rising edge of signal WEA9 <0>. During this period, P channel MOS transistor Q1 of FIG. 23 is rendered conductive, and voltage V1 is applied to node BLSA <0>.

Pulse signal BLV2 <0> is held at an L level during the period starting from the falling edge of pulse signal BLVN <0> to the falling edge of pulse signal BLV1 <0>, and the period starting from the rising edge of pulse signal BLV1 <0> to the rising edge of pulse signal BLVN <0>. During both periods, P channel MOS transistor Q2 of FIG. 23 is conductive, and voltage V2 is applied to node BLSA <0>.

Further, internal column address signal Yadd <0>, Y all-select signal YALLS, and Y all-deselect signal YUNS are all held at an H level. Accordingly, bit line select signals YB <0> and YT <0> are driven to an L level and an H level, respectively. Transistors YSWP <0> and YSWN <0> of FIG. 22 are both rendered conductive, and bit line BL <0> is electrically connected to node BLSA <0>. Therefore, the voltage of bit line BL <0> varies likewise with the voltage at node BLSA <0>.

Further, the inverted signal of the logical AND of signals WEA8 <0> and WEA9 <0> becomes signal WEA10 <0>. Signal WEA10 <0> is qualified as read write pulse RWP. Read write pulse RWP is an inverted version of pulse signal BLV1 <0>. Further, internal row address signal Xadd <0>, X all-select signal XALLS, and X all-deselect signal XUNS are all set at an H level. Therefore, by word line driver WLD <0> of FIG. 22, word line WL <0> is held at the select level of H during the H level period of read write pulse RWP.

Therefore, in the period during which read write pulse RWP is at an H level, word line WL <0> is driven to the select level of H, and voltage V1 is applied to bit line BL<0>. A set operation is carried out on phase change element 6 in memory cell MM <0, 0>. During the two periods of immediately before and immediately after the set operation, word line WL <0> is set at the deselect level of L, and voltage V2 is applied to bit line BL <0>. A discharge operation is carried out on phase change element 6 in memory cell MM <0, 0>. At this stage, a discharge operation is also carried out on phase change element 6 of other memory cells MM <1, 0> to MM <x, 0> connected to bit line BL <0>.

In the entire phase change memory, a discharge operation is carried out simultaneously to phase change element 6 in memory cell MM corresponding to the (n+1) bit lines BL. Moreover, when all bit lines BL are selected by setting Y all-select signal YALLS at an L level and Y all-deselect signal YUNS at an H level, a discharge operation is simultaneously carried out on phase change element 6 in all memory cells MM.

Further, when write data input data DATAIN <0> is at an H level, signals WEA5 <0>, WEA6 <0>, and WEA9 <0> are fixed at an H level. Pulse signal BLVN <0> is the logical AND signal of signals WEA3 <0> and WEA4 <0>. Pulse signal BLVN <0> is held at an L level during the period starting from the falling edge of write activation signal WEA <0> to the rising edge of signal WEA4 <0>. During this period, N channel MOS transistor Q3 of FIG. 23 is nonconductive. This period is shorter as compared to the case where write data input data DATAIN <0> is at an L level. This corresponds to, as shown in FIGS. 3-5, the period of time of conducting a current flow to phase change element 6 in a reset operation being shorter than the period of time of conducting a current flow to phase change element 6 in a set operation.

Moreover, the period of pulse signal BLV1 <0> held at an L level and the period of pulse signal BLV2 <0> held at an H level also becomes shorter. However, the pull down of pulse signal BLV2 <0> to an L level immediately before and immediately after the period of pulse signal BLV2 <0> being held at an H level does not change. As a result of signal WEA9 <0> being fixed at an H level, the pulse width of signal WEA10 <0> and read write pulse RWP also becomes shorter.

In the period during which read write pulse RWP is at an H level, word line WL <0> is set at the select level of H, and voltage V1 is applied to bit line BL <0>. A reset operation is carried out on phase change element 6 in memory cell MM <0, 0>. In a set operation mode and reset operation mode, the level of voltage V1 is switched by a switching circuit not shown.

Further, during the two periods of immediately before and immediately after a reset operation, word line WL <0> is set at the deselect level of L, and voltage V2 is applied to bit line BL <0>. A discharge operation is carried out on phase change element 6 in memory cell MM <0, 0>. At this stage, a discharge operation is also carried out on phase change element 6 in other memory cells MM <1, 0> to MM <x, 0> connected to bit line BL <0>. Further, in the case where all bit lines BL are selected by driving Y all-select signal YALLS to an L level and Y all-deselect signal YUNS to an H level, a discharge operation is carried out simultaneously to phase change element 6 in all memory cells MM.

Since a discharge operation is carried out at both the periods immediately before and immediately after a set operation and a reset operation in the second embodiment, resistance variation at phase change element 6 can be suppressed.

First Modification

Figure 26:
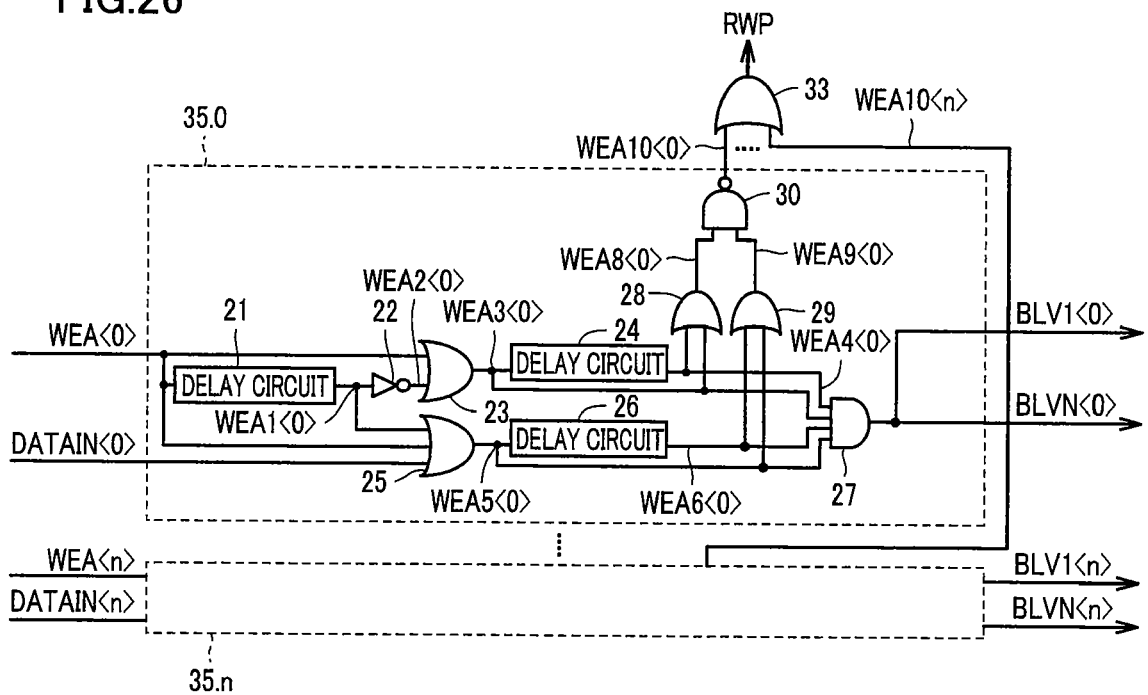
FIG. 26 is a circuit diagram representing a first modification of the second embodiment.

FIG. 26 is a circuit block diagram of a first modification of the second embodiment, comparable to FIG. 24. In the first modification of FIG. 26, pulse generation circuits 20.0 to 20.n are replaced with pulse generation circuits 35.0 to 35.n. Pulse generation circuit 35 corresponds to pulse generation circuit 20 with AND gate 31 and gate circuit 32 removed. The output signal from AND gate 27 is employed as pulse signals BLV1 and BLVN. Pulse signal BLV2 is not generated. P channel MOS transistor Q2 of FIG. 23 is fixed at a nonconductive state, or removed.

Figure 27:
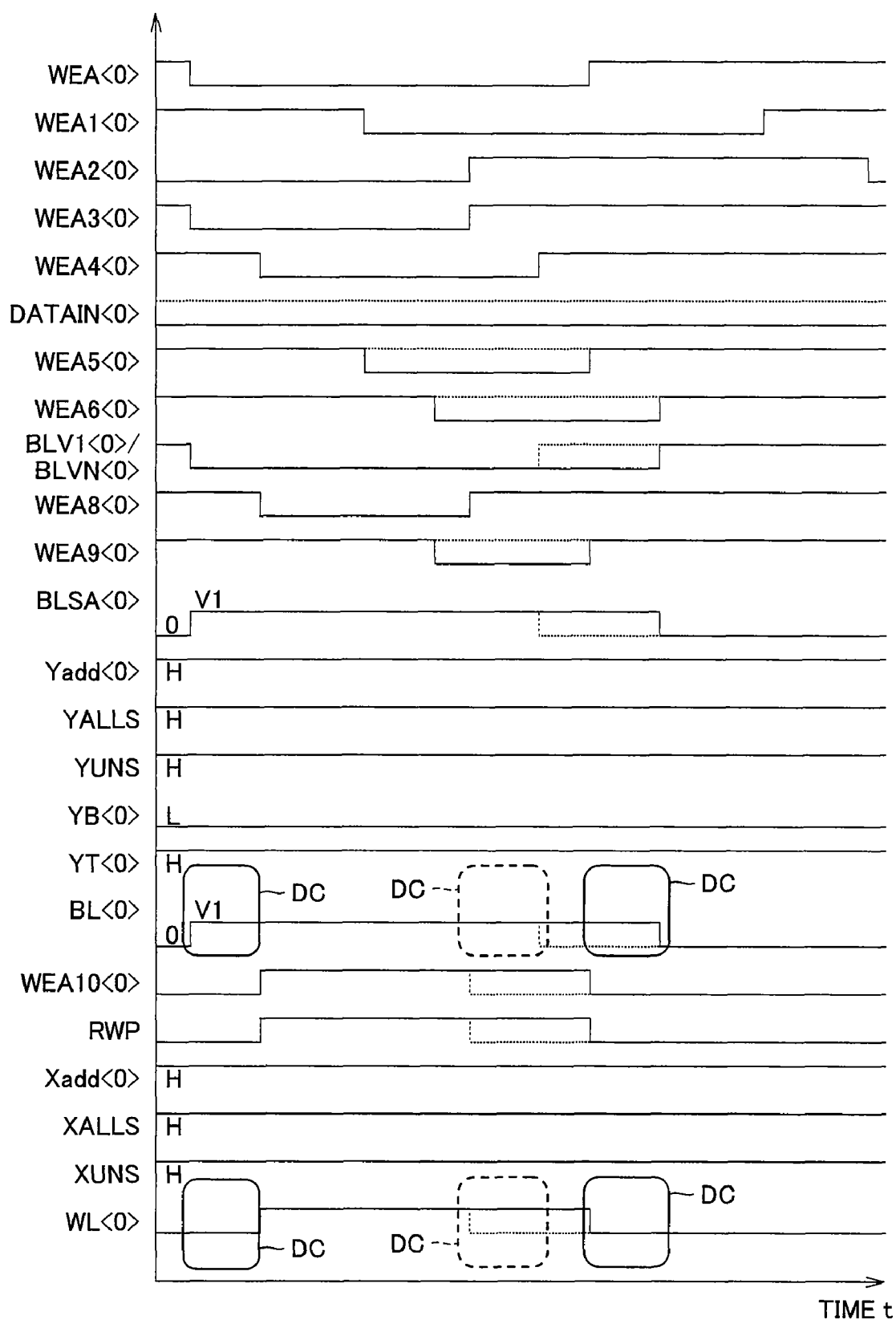
FIG. 27 is a timing chart representing an operation of the phase change memory of FIG. 26.

FIG. 27 is a timing chart representing an operation of the first modification, comparable to FIG. 25. In FIG. 27, node BLSA <0> is at the level of 0 V and the level of voltage V1 when pulse signals BLV1 <0> and BLVN <0> are held at an H level and an L level, respectively.

In the first modification, the voltage applied to bit line BL <0> in a set operation mode (or reset operation mode) and the voltage applied to bit line BL <0> in a discharge operation mode take the same voltage V1. The feature of carrying out a discharge operation at both the periods immediately before and immediately after a set operation, and immediately before and immediately after a reset operation is identical to that of the second embodiment set forth above.

Second Modification

Figure 28:
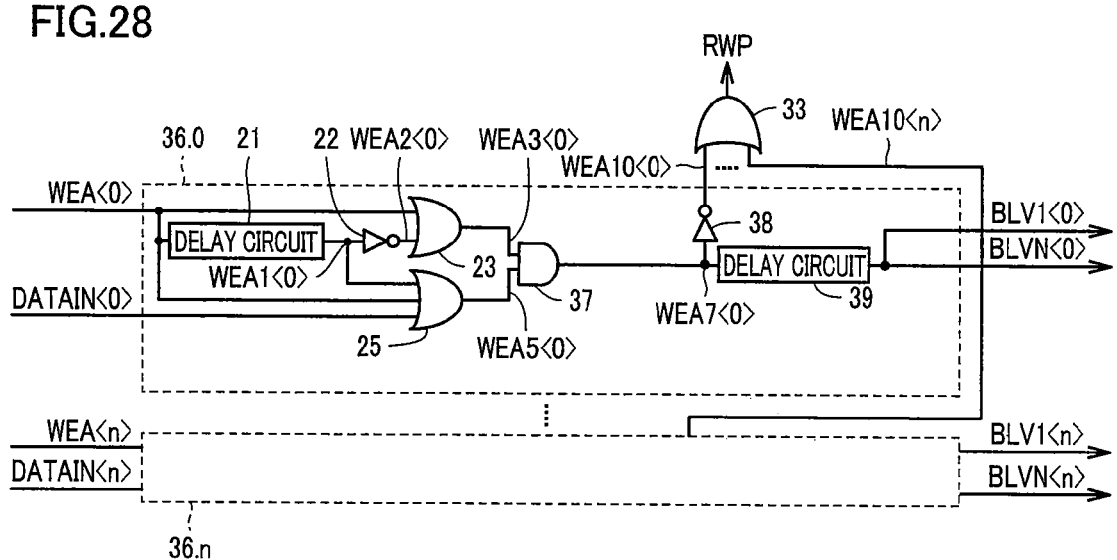
FIG. 28 is a circuit diagram representing a second modification of the second embodiment.

FIG. 28 is a circuit block diagram representing a second modification of the second embodiment, comparable to FIG. 26. In the second modification, pulse generation circuits 35.0 to 35.n are replaced with pulse generation circuits 36.0 to 36.n. Pulse generation circuit 36 corresponds to pulse generation circuit 35 with delay circuits 24 and 26, AND gate 27, OR gates 28, 29, and NAND gate 30 removed, and provided with an AND gate 37, an inverter 38 and a delay circuit 39.

AND gate 37 generates a logical AND signal WEA7 of output signals WEA3 and WEA5 from OR gates 23 and 25. Inverter 38 generates a signal WEA10 that is an inverted version of output signal WEA7 from AND gate 37 and provides the inverted signal to OR gate 33. Delay circuit 39 causes delay of output signal WEA7 from AND gate 37 to generate pulse signals BLV1 and BLVN.

Figure 29:
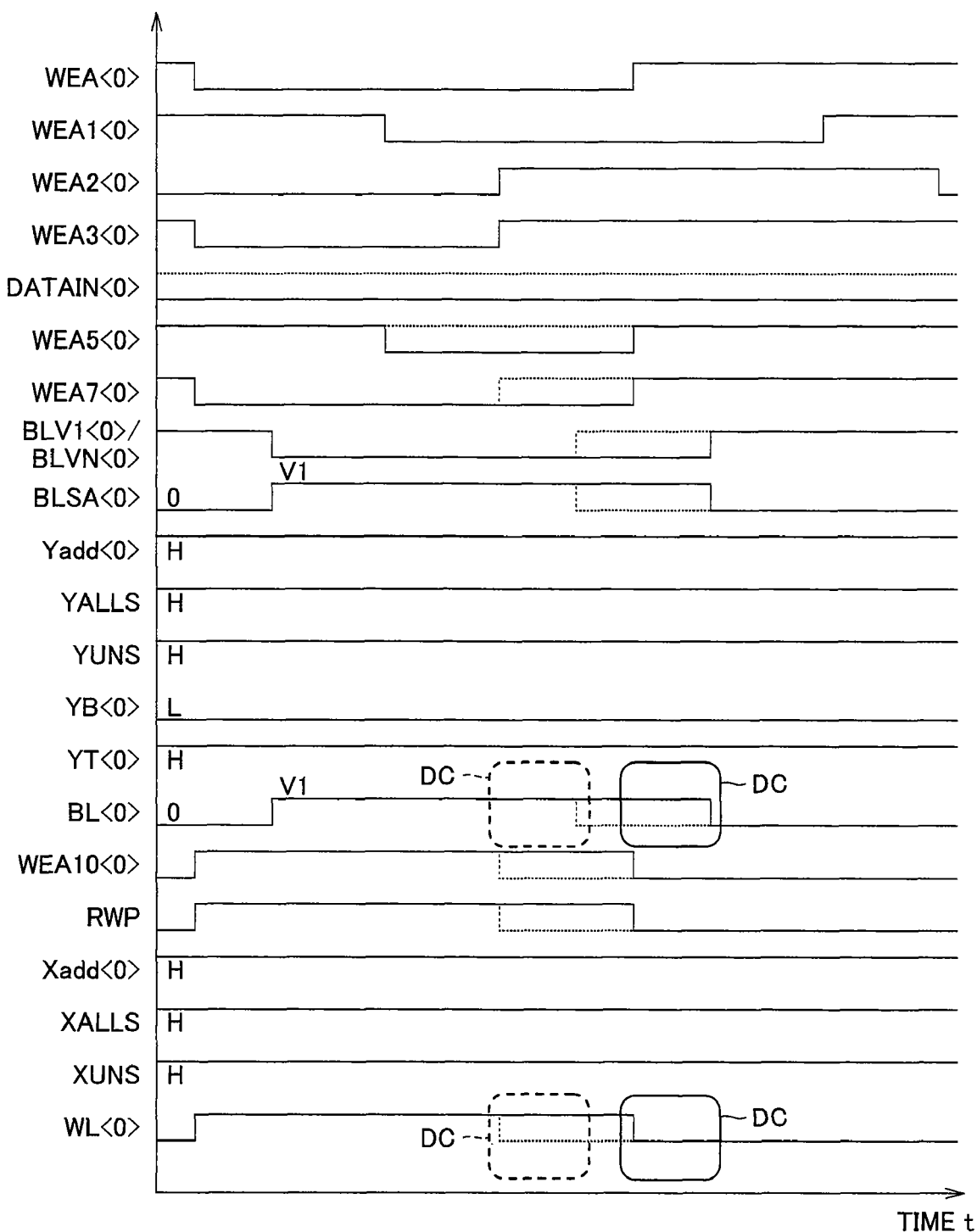
FIG. 29 is a timing chart representing an operation of the phase change memory of FIG. 28.

FIG. 29 is a timing chart representing an operation of the second modification, comparable to FIG. 27. In FIG. 29, the logical AND of signals WEA3 <0> and WEA5 <0> is qualified as signal WEA7 <0>. Inverted signal WEA10 of signal WEA7 <0> is qualified as read write pulse RWP. Word line WL <0> is driven to a select level of H in response to read write pulse RWP.

Further, signal WEA7 <0> is delayed to become pulse signals BLV1 <0> and BLVN <0>. Node BLSA <0> is at the level of 0 V and voltage V1 when pulse signals BLV1 <0> and BLVN <0> are at an H level and L level, respectively.

In the second modification, bit line BL <0> attains the level of voltage V1 and 0 V after word line WL <0> attains an H level and an L level, respectively. A discharge operation is carried out immediately after a set operation and also immediately after a reset operation. Further, the voltage applied to bit line BL <0> in a set operation mode (or reset operation mode) and the voltage applied to bit line BL <0> in a discharge operation mode are both set at the level of voltage V1.

Third Modification

Figure 30:
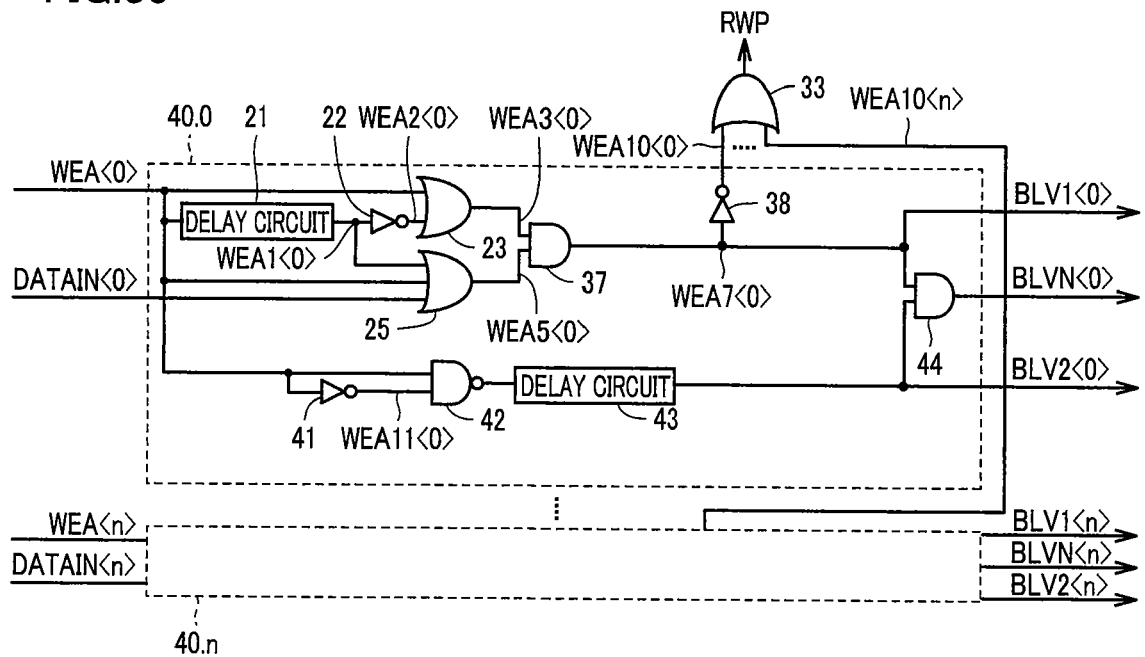
FIG. 30 is a circuit diagram representing a third modification of the second embodiment.

FIG. 30 is a circuit block diagram representing a third modification of the second embodiment, comparable to FIG. 28. Referring to FIG. 30, pulse generation circuits 36.0 to 36.n are replaced with pulse generation circuits 40.0 to 40.n in the third modification. Pulse generation circuit 40 corresponds to pulse generation circuit 36 with delay circuit 39 removed, and is provided with an inverter 41, a NAND gate 42, a delay circuit 43, and an AND gate 44.

Inverter 41 inverts and causes delay of write activation signal WEA to generate signal WEA11. NAND gate 42 generates an inverted signal of the logical AND signal of signals WEA and WEA11. Delay circuit 43 causes delay of the output signal from NAND gate 42 to generate pulse signal BLV2. The output signal WEA7 from AND gate 37 is qualified as pulse signal BLV1. AND gate 44 outputs the logical AND of pulse signals BLV1 and BLV2 as pulse signal BLVN.

Figure 31:
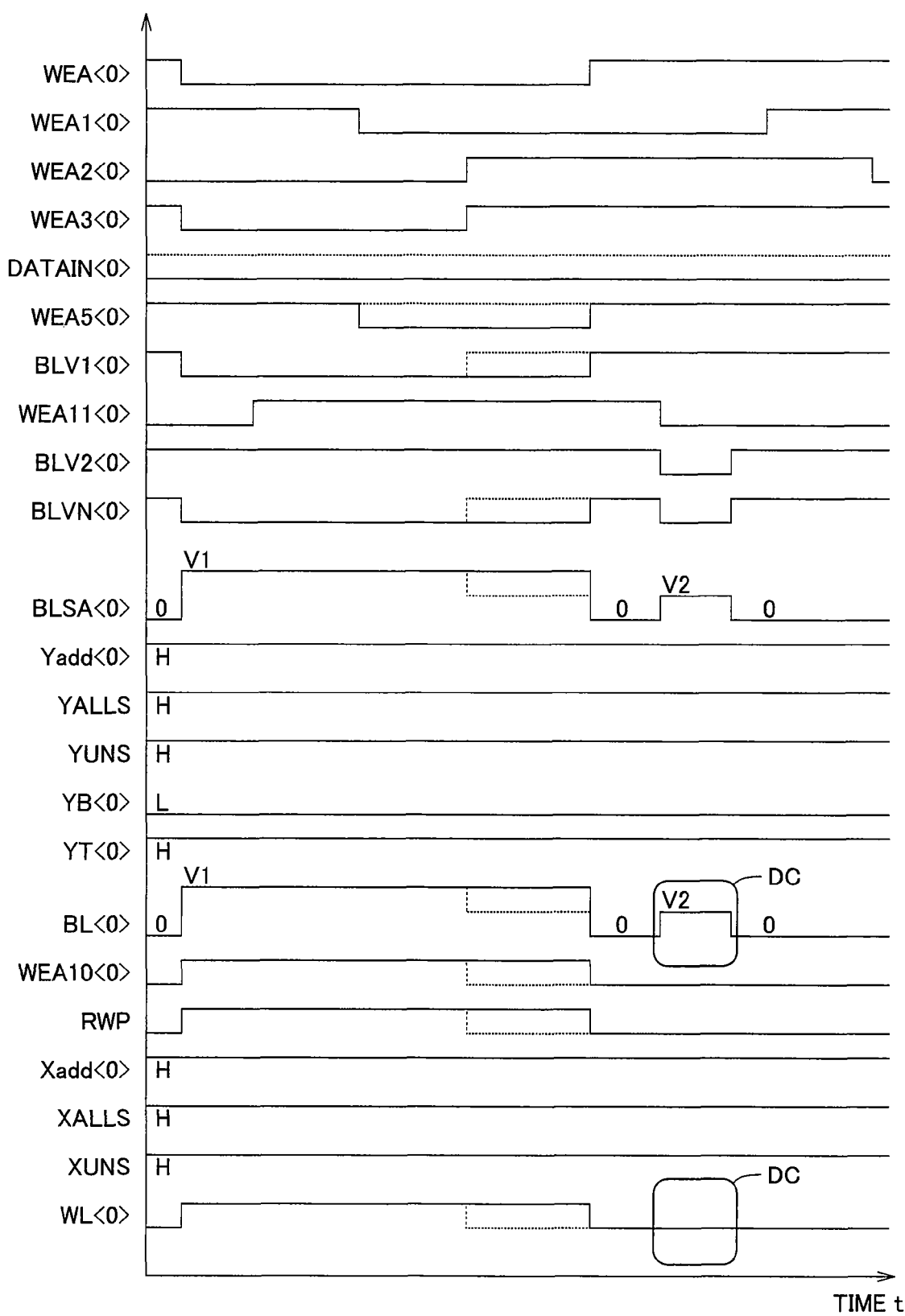
FIG. 31 is a timing chart representing an operation of the phase change memory of FIG. 30.

FIG. 31 is a timing chart representing an operation of the third modification, comparable to FIG. 29. In FIG. 31, logical AND signal WEA7 <0> of signals WEA3 <0> and WEA5 <0> is qualified as pulse signal BLV1 <0>. Further, write activation signal WEA <0> is inverted and delayed by inverter 41 to become signal WEA11 <0>. The inverted signal of the logical AND of signals WEA <0> and WEA11 <0> is delayed by delay circuit 43 to become pulse signal BLV2 <0>. The logical AND of pulse signals BLV1 <0> and BLV2 <0> is qualified as pulse signal BLVN <0>.

In the third modification, bit line BL <0> takes the level of voltage V1 and 0 V simultaneously to word line WL <0> attaining an H level and L level, respectively. Then, bit line BL <0> is driven to the level of voltage V2. Accordingly, a discharge operation is carried out in a period after completion of a set operation, independent of the set operation, and in a period after completion of a reset operation, independent of the reset operation. Further, voltage V1 and V2 is applied to bit line BL <0> in a set operation mode (or reset operation mode) and a discharge operation mode, respectively.

Fourth Modification

Figure 32:
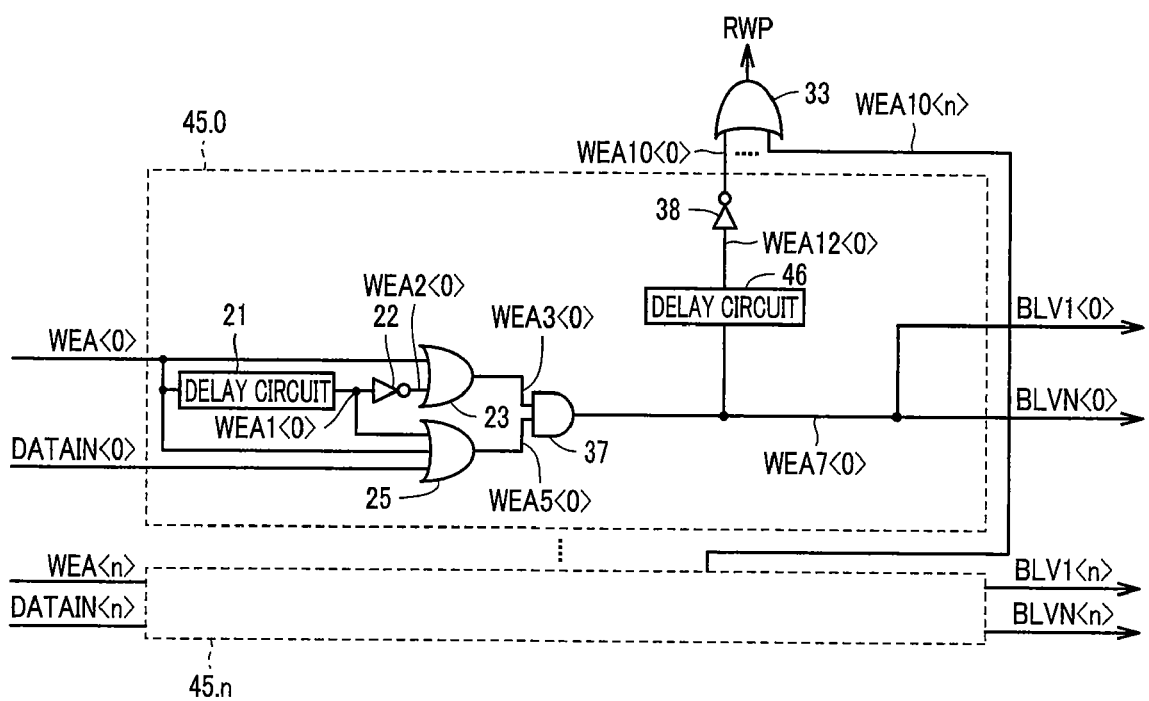
FIG. 32 is a circuit diagram representing a fourth modification of the second embodiment.

FIG. 32 is a circuit block diagram representing a fourth modification of the second embodiment, comparable to FIG. 28. Referring to FIG. 32, pulse generation circuits 36.0 to 36.n are replaced with pulse generation circuits 45.0 to 45.n, respectively, in the fourth modification. Pulse generation circuit 45 corresponds to pulse generation circuit 36 with delay circuit 39 removed, and is provided with a delay circuit 46.

Output signal WEA7 from AND gate 37 becomes pulse signals BLV1 and BLVN. Delay circuit 49 causes delay of output signal WEA7 from AND gate 37 to generate signal WEA12. Inverter 38 generates signal WEA10 that is an inverted version of signal WEA12 output from delay circuit 46, and provides the inverted signal to OR gate 33.

Figure 33:
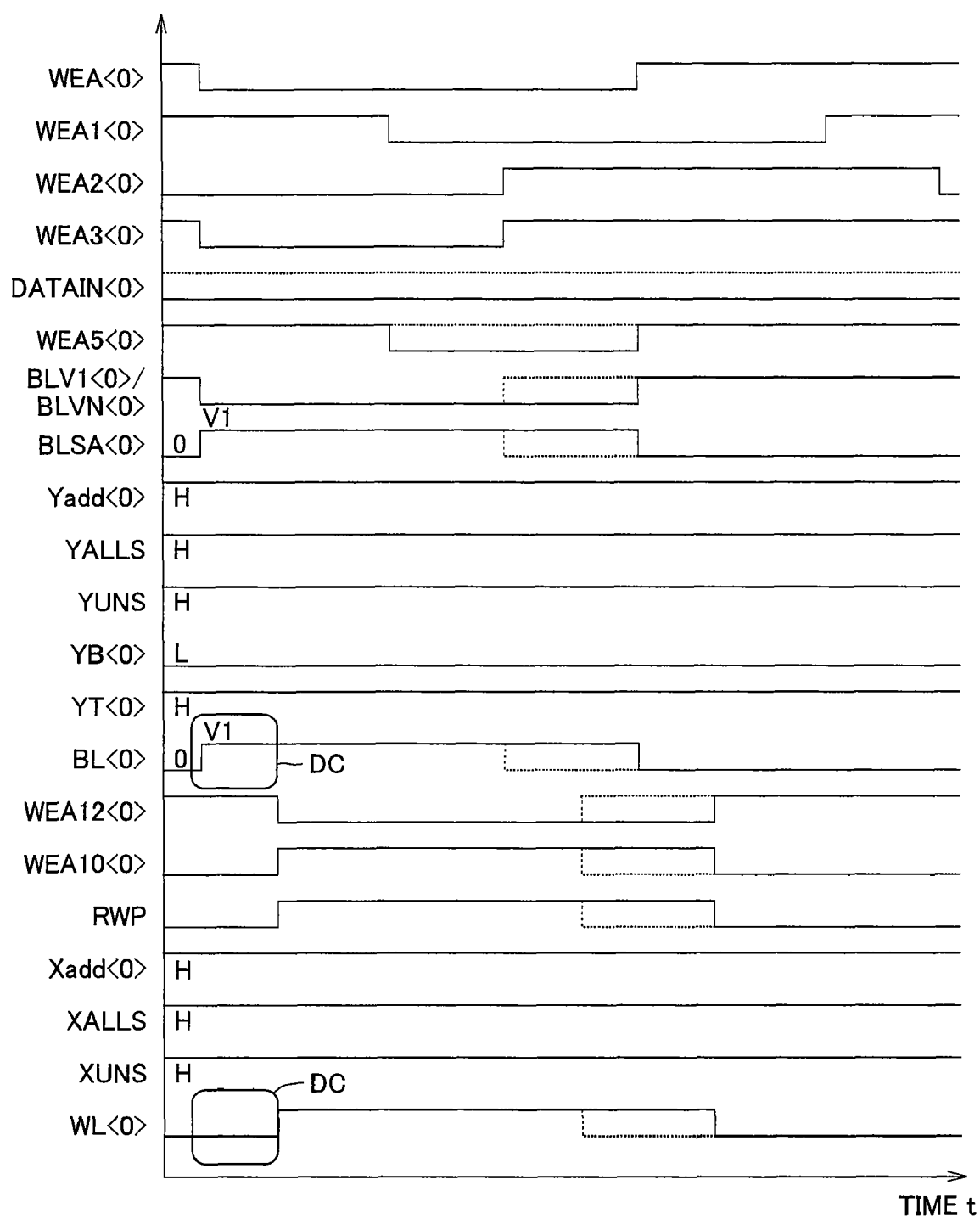
FIG. 33 is a timing chart representing an operation of the phase change memory of FIG. 32.

FIG. 33 is a timing chart representing an operation of the fourth modification, comparable to FIG. 29. In FIG. 33, logical AND signal WEA7 <0> of signals WEA3 <0> and WEA5 <0> becomes pulse signals BLV1 <0> and BLVN <0>. Node BLSA <0> attains the level of 0 V and voltage V1 when pulse signals BLV1 <0> and BLVN <0> are at an H level and L level, respectively. Inverted signal WEA10 of the delayed signal of signal WEA7 <0> is qualified as read write pulse RWP. Word line WL <0> attains the select level of H in response to read write pulse RWP.

In the fourth modification, word line WL <0> attains an H level and an L level after bit line BL <0> attains the level of voltage V1 and 0 V, respectively. A discharge operation is carried out immediately before a set operation and immediately before a reset operation. Further, the voltage applied to bit line BL <0> in a set operation mode (or reset operation mode) and the voltage applied to bit line BL <0> in a discharge operation mode both take the same voltage V1.

Fifth Modification

Figure 34:
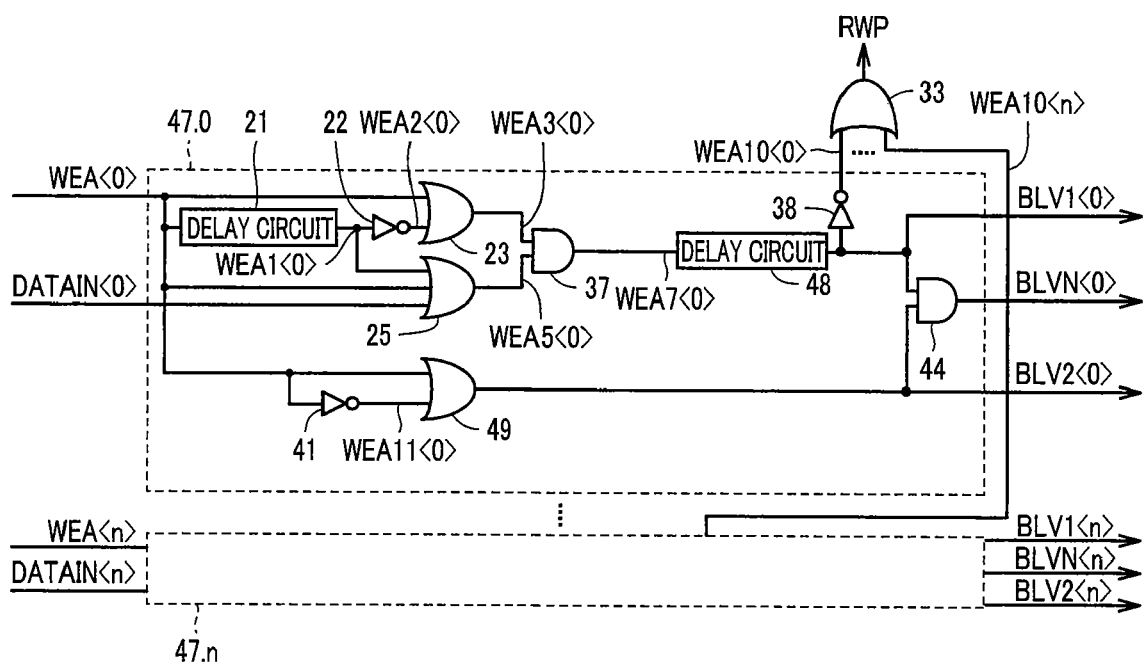
FIG. 34 is a circuit diagram representing a fifth modification of the second embodiment.

FIG. 34 is a circuit block diagram representing a fifth modification of the second embodiment, comparable to FIG. 30. Referring to FIG. 34, pulse generation circuits 40.0 to 40.n are replaced with pulse generation circuits 47.0 to 47.n, respectively, in the fifth modification. Pulse generation circuit 47 corresponds to pulse generation circuit 40 with delay circuit 43 and NAND gate 42 removed, and is provided with a delay circuit 48 and an OR gate 49.

Delay circuit 48 causes delay of signal WEA7 <0> output from AND gate 37 to generate pulse signal BLV1 <0>. Inverter 38 generates signal WEA10 that is an inverted version of pulse signal BLV1 <0>, and provides the generated signal to OR gate 33. OR gate 49 outputs the logical OR of write activation signal WEA and signal WEA11 as pulse signal BLV2.

Figure 35:
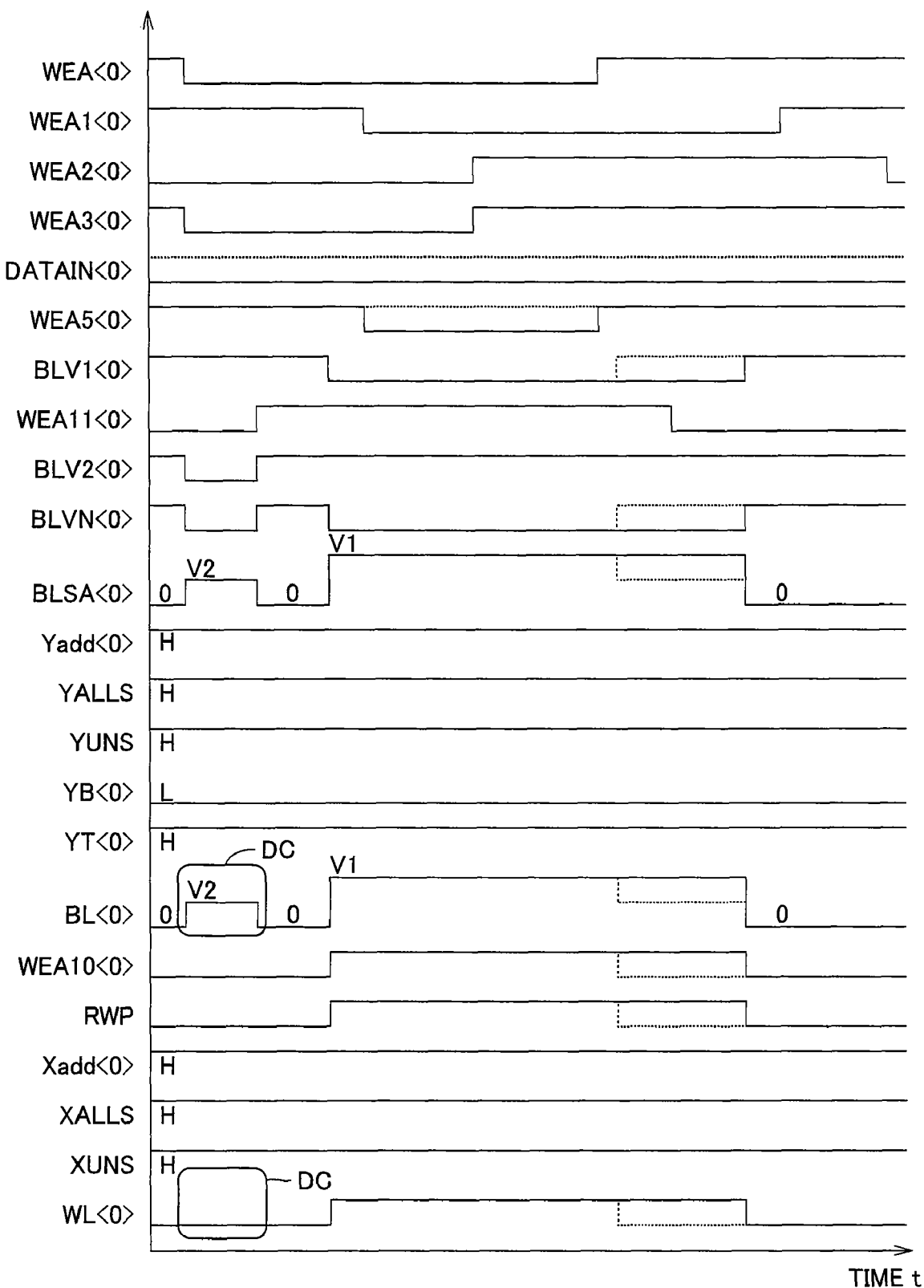
FIG. 35 is a timing chart representing an operation of the phase change memory of FIG. 34.

FIG. 35 is a timing chart representing an operation of the fifth embodiment, comparable to FIG. 31. In FIG. 35, logical AND signal WEA7 <0> of signals WEA3 <0> and WEA5 <0> is delayed by delay circuit 48 to become pulse signal BLV1 <0>. Pulse signal BLV1 <0> is inverted by inverter 38 to be qualified as read write pulse RWP. Write activation signal WEA <0> is inverted and delayed by inverter 41 to become signal WEA11 <0>. The logical OR of signals WEA <0> and WEA11 <0> is qualified as pulse signal BLV2 <0>. The logical AND of pulse signals BLV1 <0> and BLV2 <0> is qualified as pulse signal BLVN <0>.

In the fifth modification, during the period over which word line WL <0> is held at an L level, bit line BL <0> is set at the level of voltage V2 and a discharge operation is carried out. Then, a set operation or a reset operation is carried out after completion of the discharge operation. Namely, a discharge operation is carried out in a period before a set operation is initiated, independent of the set operation, and in a period before a reset operation is initiated, independent of the reset operation. Further, voltage V1 and V2 is applied to bit line BL <0> in a set operation mode (or reset operation mode) and a discharge operation mode, respectively.

Sixth Modification

Figure 36:
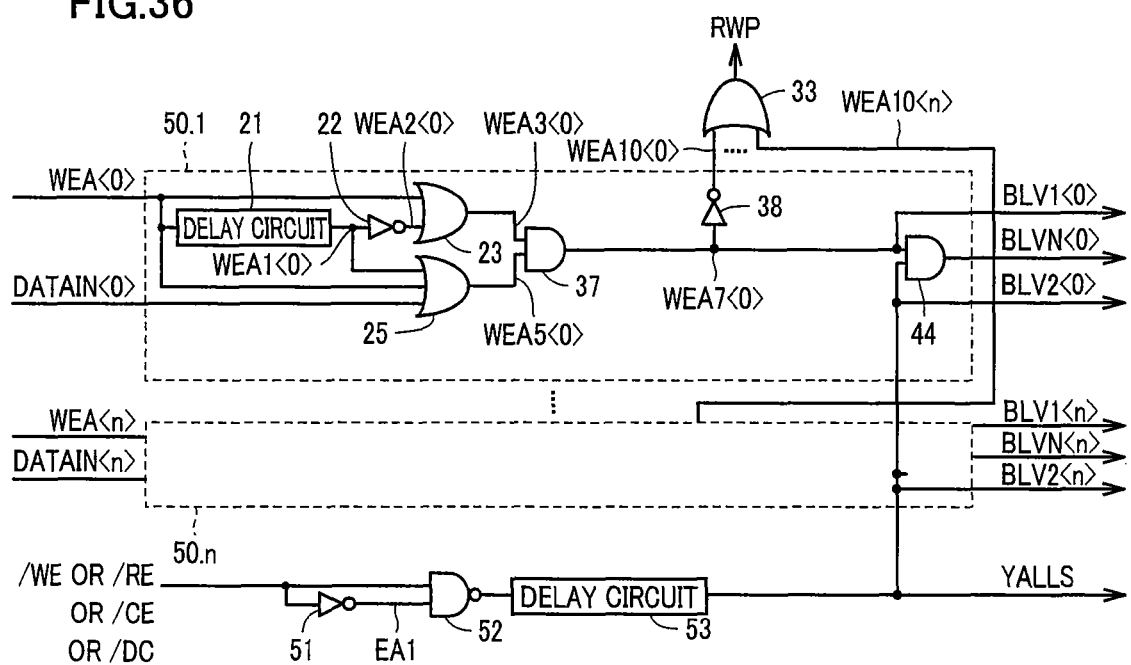
FIG. 36 is a circuit diagram representing a sixth modification of the second embodiment.

FIG. 36 is a circuit block diagram representing a sixth modification of the second embodiment, comparable to FIG. 30. Referring to FIG. 36, pulse generation circuits 40.0 to 40.n are replaced with pulse generation circuits 50.0 to 50.n, respectively, in the sixth modification. Pulse generation circuit 50 corresponds to pulse generation circuit 40 with inverter 41, NAND gate 42 and delay circuit 43 removed. In the sixth modification, an inverter 51, a NAND gate 52, and a delay circuit 53 are provided common to pulse generation circuits 50.0 to 50.n.

Inverter 51 inverts and causes delay of write activation signal /WE to generate signal EA1. Write activation signal /WE designates activation of a circuit related to a write operation. Alternatively, a read activation signal /RE designating activation of a circuit related to a readout operation, a chip activation signal /CE designating activation of a phase change memory, a module activation signal /CE designating activation of a module in which the phase change memory is located, or a discharge designation signal /DC designating execution of a discharge operation may be employed instead of write activation signal /WE. Further, a logical AND signal of two or more signals /WE, /RE, /CE, and /DC may be used instead of write activation signal /WE.

NAND gate 52 generates an inverted signal of the logical AND of signals /WE and EA1. Delay circuit 53 causes delay of the signal output from NAND gate 52 to generate pulse signals BLV2 <0> to BLV2 <n> and Y all-select signal YALLS. It is to be noted that delay circuit 53 may be omitted, and the output signal from NAND gate 52 may be used as pulse signals BLV2 <0> to BLV2 <n> and Y all-select signal YALLS.

Figure 37:
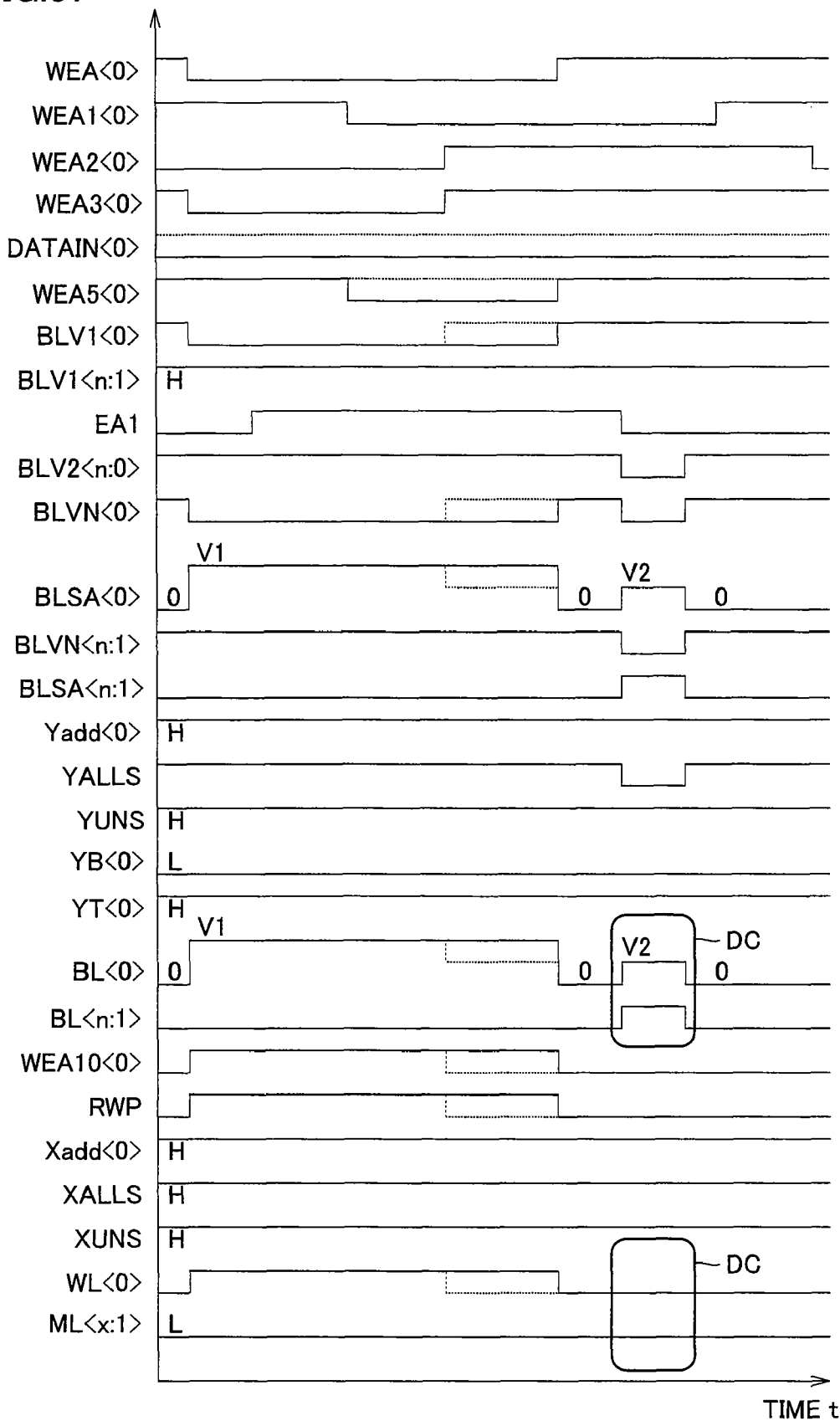
FIG. 37 is a timing chart representing an operation of the phase change memory of FIG. 36.

FIG. 37 is a timing chart representing an operation of the sixth modification, comparable to FIG. 29. In FIG. 37, write activation signal WEA <0> changes its level at the same timing as write activation signal /WE. Write activation signal is inverted and delayed by inverter 51 to become signal EA1. The inverted signal of the logical AND of signals /WE and EA1 is delayed by delay circuit 53 to become pulse signals BLV2 <0> to BLV2 <n> and Y all-select signal YALLS. The delay time of delay circuit 53 is set such that pulse signals BLV2 <0> to BLV2 <n> and Y all-select signal YALLS are held at an L level for just a predetermined time after completion of a set operation (or reset operation). For the sake of simplification, signals BLV2 <0> to BLV2 <n> are represented as BLV2 <n:1> in FIG. 37. The same applies to other signals and drawings hereinafter.

In the sixth modification, bit line BL <0> attains the level of voltage V1 and 0 V simultaneous to word line WL <0> attaining an H level and L level, respectively. Then, bit line BL <0> is set at the level of voltage V2. Therefore, a discharge operation of all memory cells MM is carried out in a period after completion of a set operation, independent of the set operation, and in a period after completion of a reset operation, independent of the reset operation. Further, voltage V1 is applied to bit line BL <0> in a set operation mode (or reset operation mode). Voltage V2 is applied to all bit lines BL in a discharge operation mode.

It is to be noted that a discharge operation for all memory cells MM may be carried out in a period immediately before initiating a set operation, independent of the set operation, and in a period immediately before initiating a reset operation, independent of the reset operation.

Third Embodiment

Figure 38:
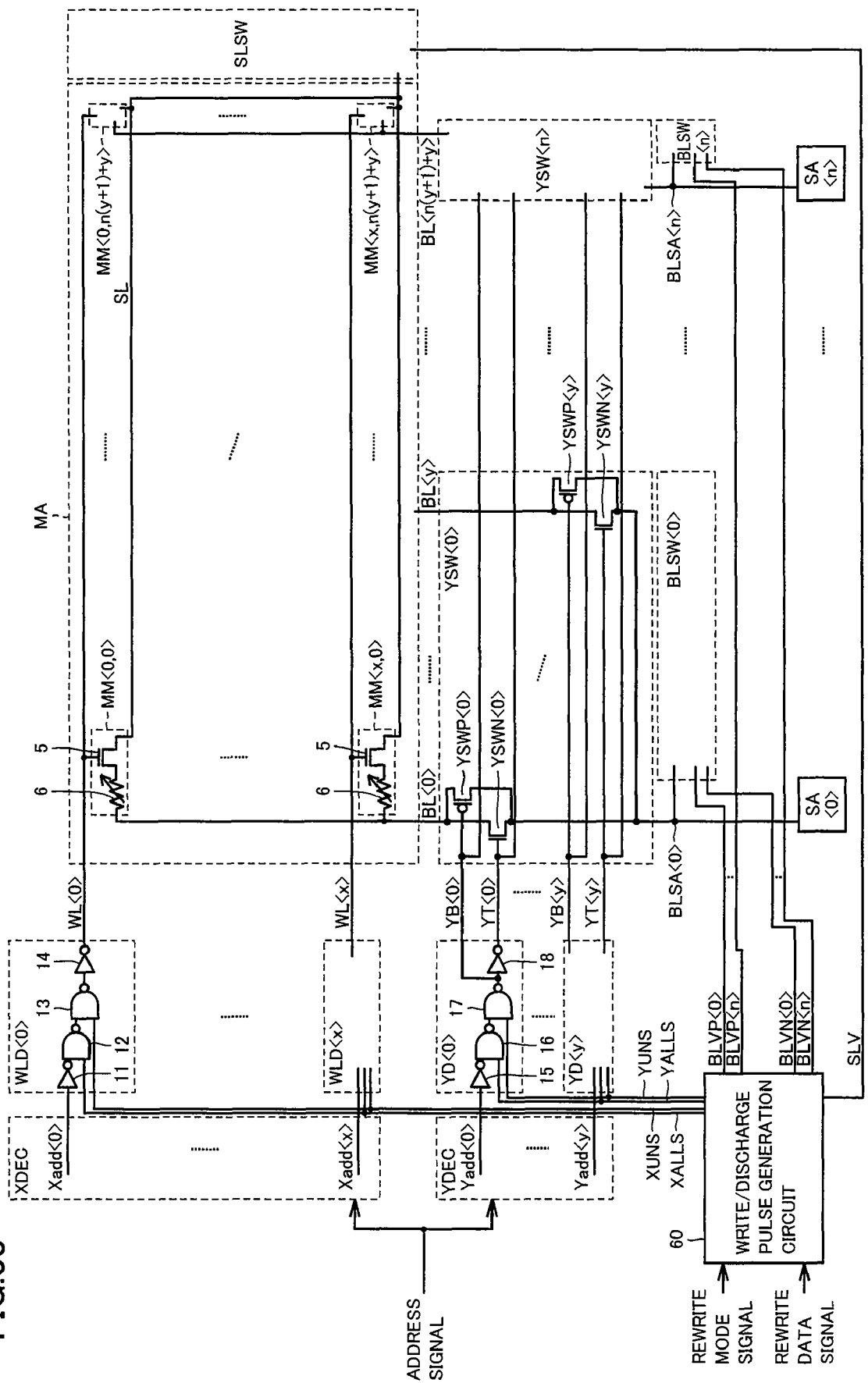
FIG. 38 is a block diagram representing an entire configuration of the phase change memory according to a third embodiment of the present invention.

FIG. 38 is a circuit diagram representing an entire configuration of a phase change memory according to a third embodiment of the present invention, comparable to FIG. 22. The phase change memory of FIG. 3 8 differs from the phase change memory of FIG. 22 mainly in that a source line SL and a source switching circuit SLSW are added, and that write/discharge pulse generation circuit 19 is replaced with a write/discharge pulse generation circuit 60. The source of N channel MOS transistor 5 in each memory cell MM is connected to source line SL instead of the line of ground voltage VSS.

Figure 39:
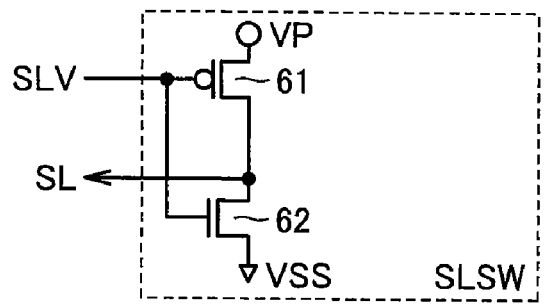
FIG. 39 is a circuit diagram representing a configuration of the source switching circuit shown in FIG. 38.

Referring to FIG. 39, source switching circuit SLSW includes a P channel MOS transistor 61 and an N channel MOS transistor 62. P channel MOS transistor 61 receives voltage VP at its gate, signal SLV at its gate, and has its drain connected to source line SL. N channel MOS transistor 62 has its drain connected to source line SL, and receives signal SLV and ground voltage VSS (0 V) at its gate and at its source, respectively. Signal SLV is generated at write/discharge pulse generation circuit 60.

When signal SLV is at an H level, transistor 61 is rendered nonconductive whereas transistor 62 is rendered conductive. Source line SL is set at the level of ground voltage VSS. When signal SLV is at an L level, transistor 62 is rendered nonconductive whereas transistor 61 is rendered conductive. Source line SL is set at the level of voltage VP.

Figure 40:
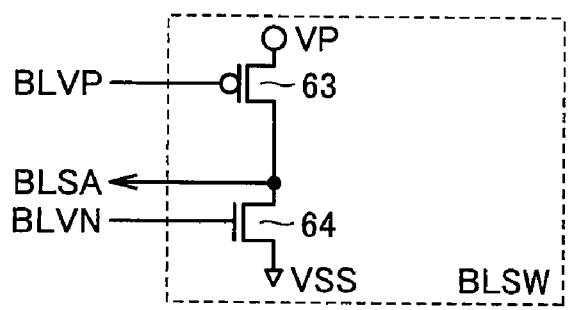
FIG. 40 is a circuit diagram representing a configuration of the write/discharge circuit shown in FIG. 38.

Referring to FIG. 40, write/discharge circuit BLSW includes a P channel MOS transistor 63 and an N channel MOS transistor 64. P channel MOS transistor 63 receives voltage VP at its source, receives signal BLVP at its gate, and has its drain connected to node BLSA. N channel MOS transistor 64 has its drain connected to node BLSA, and receives signal BLVP and ground voltage VSS (0 V) at its gate and at its source, respectively. Signals BLVP and BLVN are generated at write/discharge pulse generation circuit 60.

When signals BLVP and BLVN both attain an H level, transistor 63 is rendered nonconductive whereas transistor 64 is rendered conductive. Node BLSA is set at ground voltage VSS. When signals BLVP and BLVN both attain an L level, transistor 63 is rendered conductive whereas transistor 64 is rendered nonconductive. Node BLSA is set at the level of voltage VP. When signal BLVP and BLVN attain an H level and L level, respectively, transistors 63 and 64 are both rendered nonconductive. Node BLSA is set at an open state.

When X all-select signal XALLS is set at an H level and X all-deselect signal XUNS is set at an H level, word line driver WLD drives corresponding word line WL to the select level of H and the deselect level of L in response to corresponding internal row address signal Xadd attaining an H level and an L level, respectively. It is to be noted that read write pulse RWP is not generated.

Figure 41:
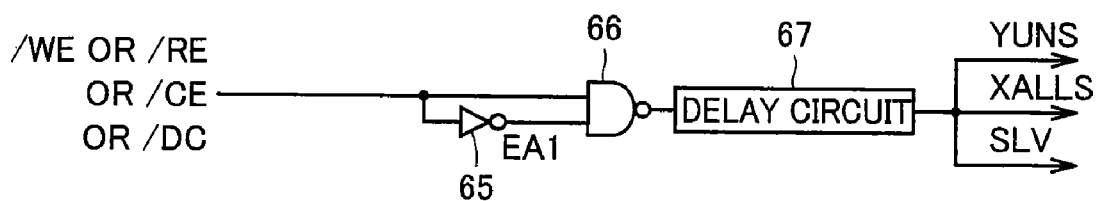
FIG. 41 is a circuit diagram representing a configuration of the write/discharge pulse generation circuit shown in FIG. 38.

FIG. 41 is a circuit block diagram representing the main part of write/discharge pulse generation circuit 60. Referring to FIG. 41, write/discharge pulse generation circuit 60 includes an inverter 65, a NAND gate 66, and a delay circuit 67. Inverter 65 inverts and causes delay of write activation signal /WE to generate signal EA1. A read activation signal /RE, a chip activation signal /CE, a module activation signal /CE, or a discharge pulse signal /DC may be used instead of write activation signal /WE. Alternatively, a logical AND signal of two or more of signals /WE, /RE, /CE and /DC may be used instead of write activation signal /WE. Usage of these signals instead of write activation signal /WE is similarly allowed in the embodiments and modifications set forth below.

NAND gate 66 generates an inverted signal of the logical AND of signals /WE and EA1. Delay circuit 67 causes delay of the signal output from NAND gate 66 to generate Y all-deselect signal YUNS, X all-select signal XALLS, and signal SLV. Delay circuit 67 may be omitted, and take the output signal from NAND gate 66 as Y all-deselect signal YUNS, X all-select signal XALLS, and signal SLV.

Figure 42:
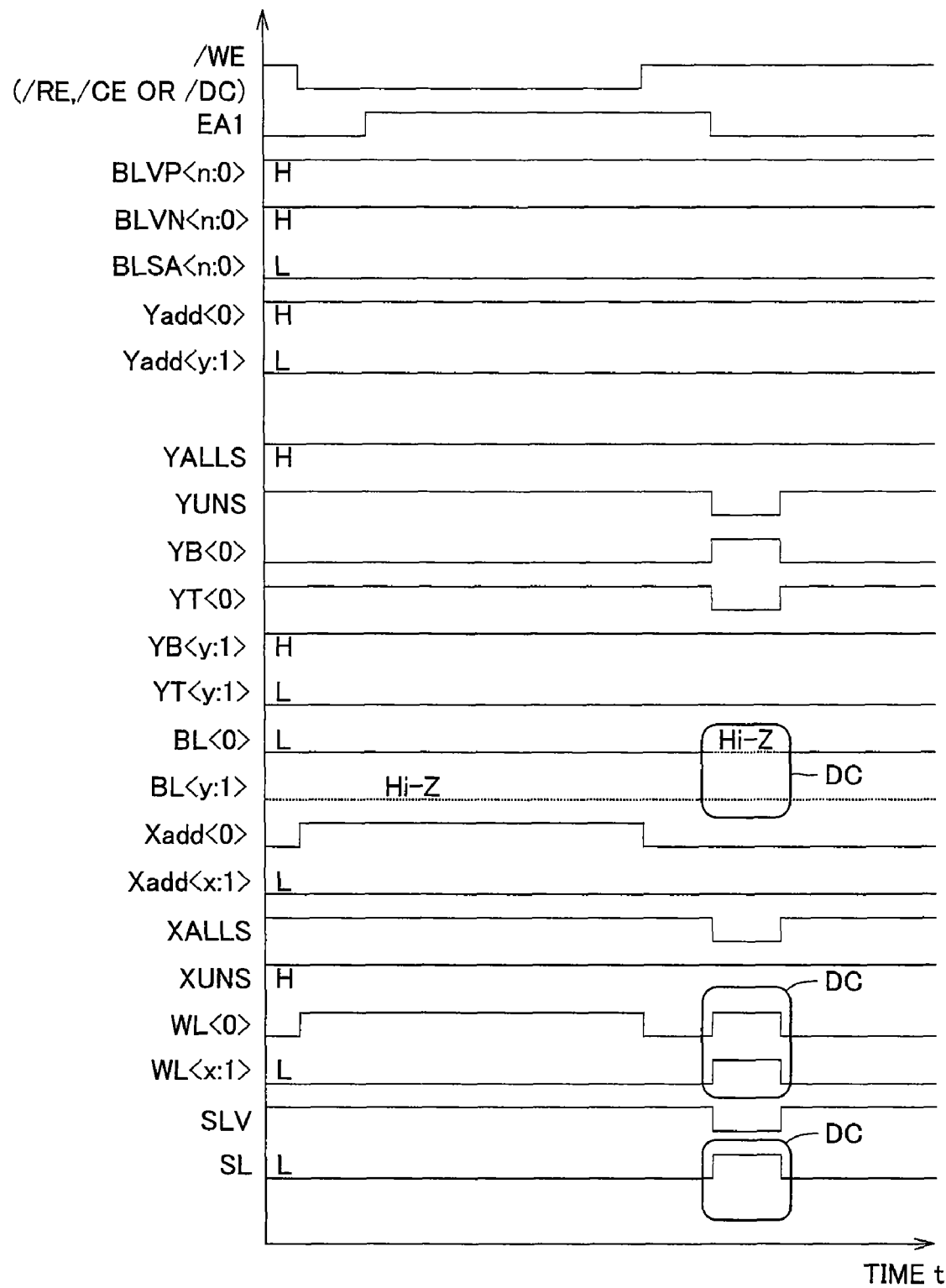
FIG. 42 is a timing charge representing an operation of the phase change memory shown in FIGS. 38-41.

FIG. 42 is a timing chart representing a discharge operation of the present phase change memory. At the initial state in FIG. 42, pulse signals BLVP <0> to BLVP <n> and BLVN <0> to BLVN <n> are held at an H level, and nodes BLSA <0> to BLSA <n> are held at an L level (0 V).

Further, internal column address signal Yadd <0> is held at an H level, and other internal column address signals Yadd <1> to Yadd <y> are held at an L level. Y all-select signal YALLS is held at an H level, and Y all-deselect signal YUNS is held at an H level.

Therefore, bit line select signal YB <0> is held at an L level, and other bit line select signals YB <1> to YB <y> are held at an H level. Further, bit line select signal YT <0> is held at an H level, and other bit line select signals YT <1> to YT <y> are held at an L level. Therefore, bit line BL <0> is held at an L level and other bit lines BL <1> to BL <y> are held at an open state.

Further, internal row address signals Xadd <0> to Xadd <x> are held at an L level, and X all-select signal XALLS is held at an H level. X all-deselect signal XUNS is held at an H level. Therefore, all word lines WL <0> to WL <x> are held at an L level. Further, signal SLV is held at an H level and source line SL is held at an L level.

When write activation signal /WE is held at an L level for just a predetermined time and internal row address signal Xadd <0> is held at an H level for just a predetermined time, word line WL <0> is pulled up to an H level for just a predetermined time. Moreover, signal EA1 that is an inverted and delayed version of write activation signal /WE is generated. The inverted signal of the logical AND of signals /WE and EA1 become signals YUNS, XALLS and SLV. The delay time of delay circuit 67 is set such that each of signals YUNS, XALLS and SLV is held at an L level for just a predetermined time after word line is pulled down to an L level.

When Y all-deselect signal YUNS is set at an L level, bit line select signals YB <0> to YB <y> are driven to an H level and bit line select signals YT <0> to YT <y> are driven to an L level. All bit lines BL <0> to BL <y> are set at an open state. Further, when X all-select signal XALLS is set at an L level, all word lines WL <0> to WL <x> are driven to an H level. Further, when signal SLV is set at an L level, source line SL is driven to an H level. Accordingly, N channel MOS transistor 5 of all memory cells MM is rendered conductive. H level is applied to one electrode of phase change element 6, and the other electrode is set at an open state. Thus, a discharge operation is carried out on all memory cells MM (refer to FIG. 15).

Since a discharge operation is carried out independent of a set operation and reset operation in the third embodiment, resistance variation at phase change element 6 can be suppressed.

Although the same voltage VP is applied to the source of P channel MOS transistor 61 of FIG. 39 and to the source of P channel MOS transistor 63 of FIG. 40 in the third embodiment, different voltages may be applied instead.

The above description is based on the case where one source line SL is provided with respect to all memory cells MM in memory array MA. Alternatively, memory array MA may be divided into a plurality of memory blocks, each including a plurality of memory cells MM, and a source line SL and source switching circuit SLSW may be provided for each memory block.

Fourth Embodiment

Figure 43:
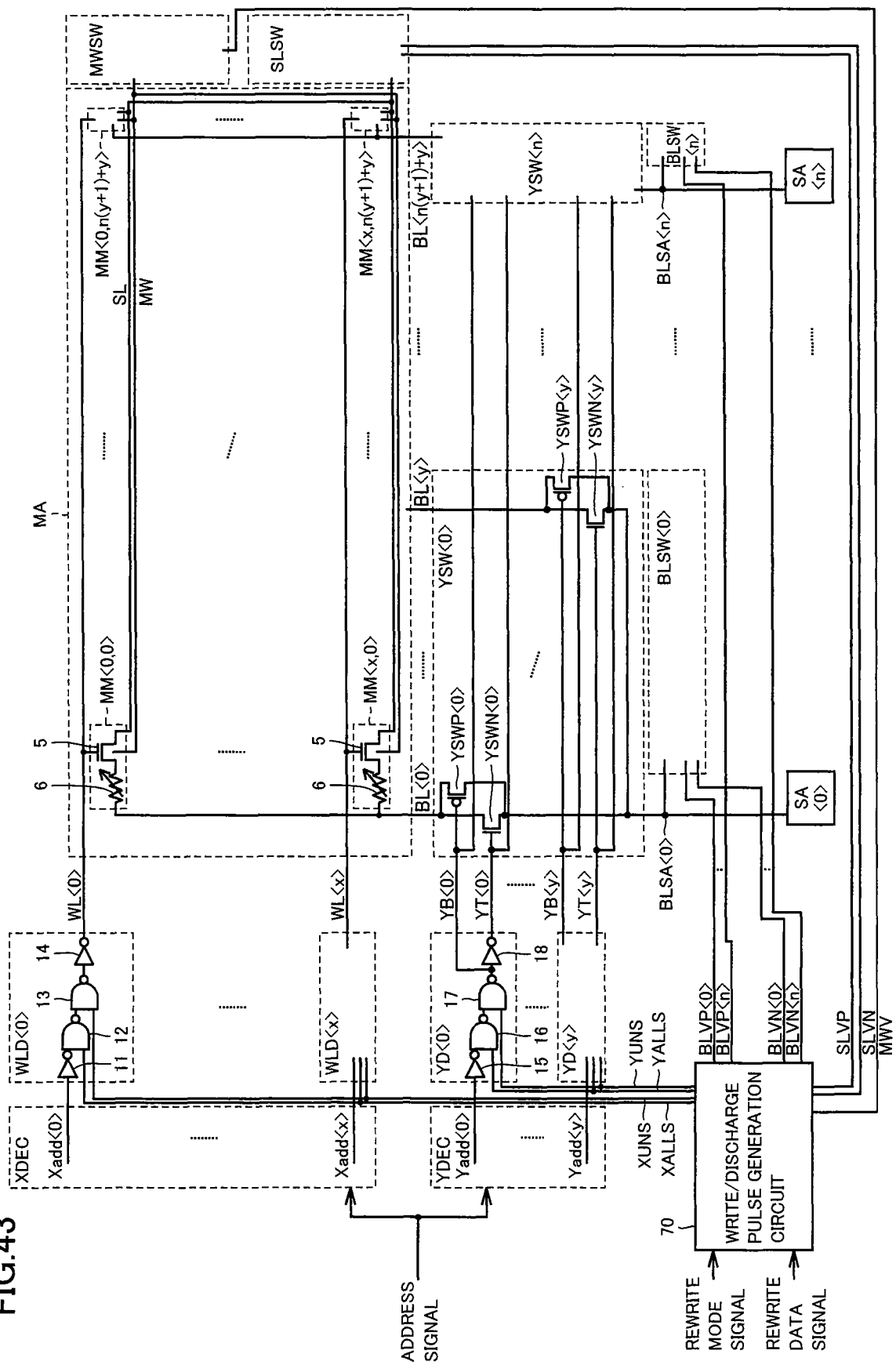
FIG. 43 is a block diagram representing an entire configuration of a phase change memory according to a fourth embodiment of the present invention.

FIG. 43 is a circuit block diagram representing an entire configuration of a phase change memory according to a fourth embodiment of the present invention, comparable to FIG. 38. The phase change memory of FIG. 43 differs from the phase change memory of FIG. 38 mainly in that a well line MW and a well switching circuit MWSW are added, and that write/discharge pulse generation circuit 60 is replaced with write/discharge pulse generation circuit 70. The well (substrate, backgate) of N channel MOS transistor 5 in each memory cell MM is connected to well line MW instead of the line of ground voltage VSS.

Figure 44:
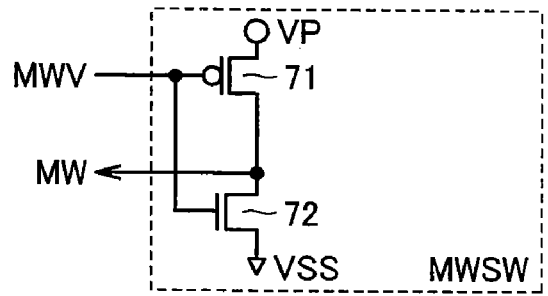
FIG. 44 is a circuit diagram representing a configuration of the well switching circuit shown in FIG. 43.

Referring to FIG. 44, well switching circuit MWSW includes a P channel MOS transistor 71 and an N channel MOS transistor 72. P channel MOS transistor 71 receives voltage VP and signal MWV at its source and gate, respectively, and has its drain connected to well line MW. N channel MOS transistor 72 has its drain connected to well line MW, and receives signal MWV and ground voltage VSS (0 V) at its gate and source, respectively. Signal MWV is generated at write/discharge pulse generation circuit 70.

When signal MWV is at an H level, transistor 71 is rendered nonconductive whereas transistor 72 is rendered conductive. Well line MW is set at the level of ground voltage VSS. When signal MWV is at an L level, transistor 72 is rendered nonconductive whereas transistor 71 is rendered conductive. Well line MW is set at the level of voltage VP.

Figure 45:
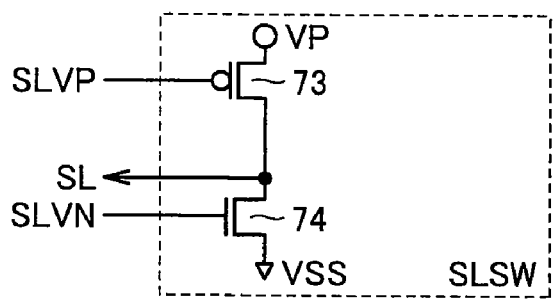
FIG. 45 is a circuit diagram representing a configuration of the source switching circuit shown in FIG. 43.

Referring to FIG. 45, source switching circuit SLSW includes a P channel MOS transistor 73 and an N channel MOS transistor 74. P channel MOS transistor 73 receives voltage VP and signal SLVP at its source and gate, respectively, and has its drain connected to source line SL. N channel MOS transistor 74 has its drain connected to source line SL, and receives signal SLVN and voltage VSS (0 V) at its gate and source, respectively. Signals SLVP and SLVN are generated at write/discharge pulse generation circuit 70.

When signals SLVP and SLVN are both at an H level, transistor 73 is rendered nonconductive whereas transistor 74 is rendered conductive. Source line SL is set at the level of ground voltage VSS. When signals SLVP and SLVN are both at an L level, transistor 73 is rendered conductive whereas transistor 74 is rendered nonconductive. Source line SL is set at the level of voltage VP. When signals SLVP and SLVN are at an H level and an L level, respectively, both transistors 73 and 74 are rendered nonconductive, and source line SL is set at an open state.

Figure 46:
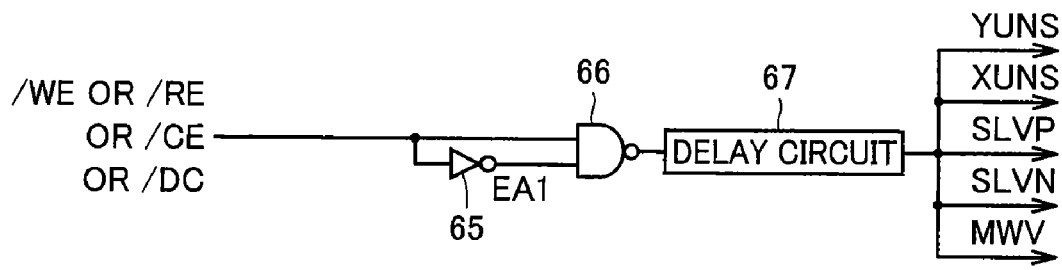
FIG. 46 is a circuit diagram representing a configuration of the write/discharge pulse generation circuit shown in FIG. 43.

FIG. 46 is a circuit block diagram representing the main part of write/discharge pulse generation circuit 70, comparable to FIG. 41. Referring to FIG. 46, write/discharge pulse generation circuit 70 includes inverter 65, NAND gate 66, and delay circuit 67 connected in a manner similar to that of write/discharge pulse generation circuit 60. It is to be noted that the output signal from delay circuit 67 is used as Y all-deselect signal YUNS, X all-deselect signal XUNS, and signals SLVP, SLVN and MWV. Delay circuit 67 may be omitted, and take the output signal from NAND gate 66 as Y all-deselect signal YUNS, X all-deselect signal XUNS, and signals SLVP, SLVN and MWV.

Figure 47:
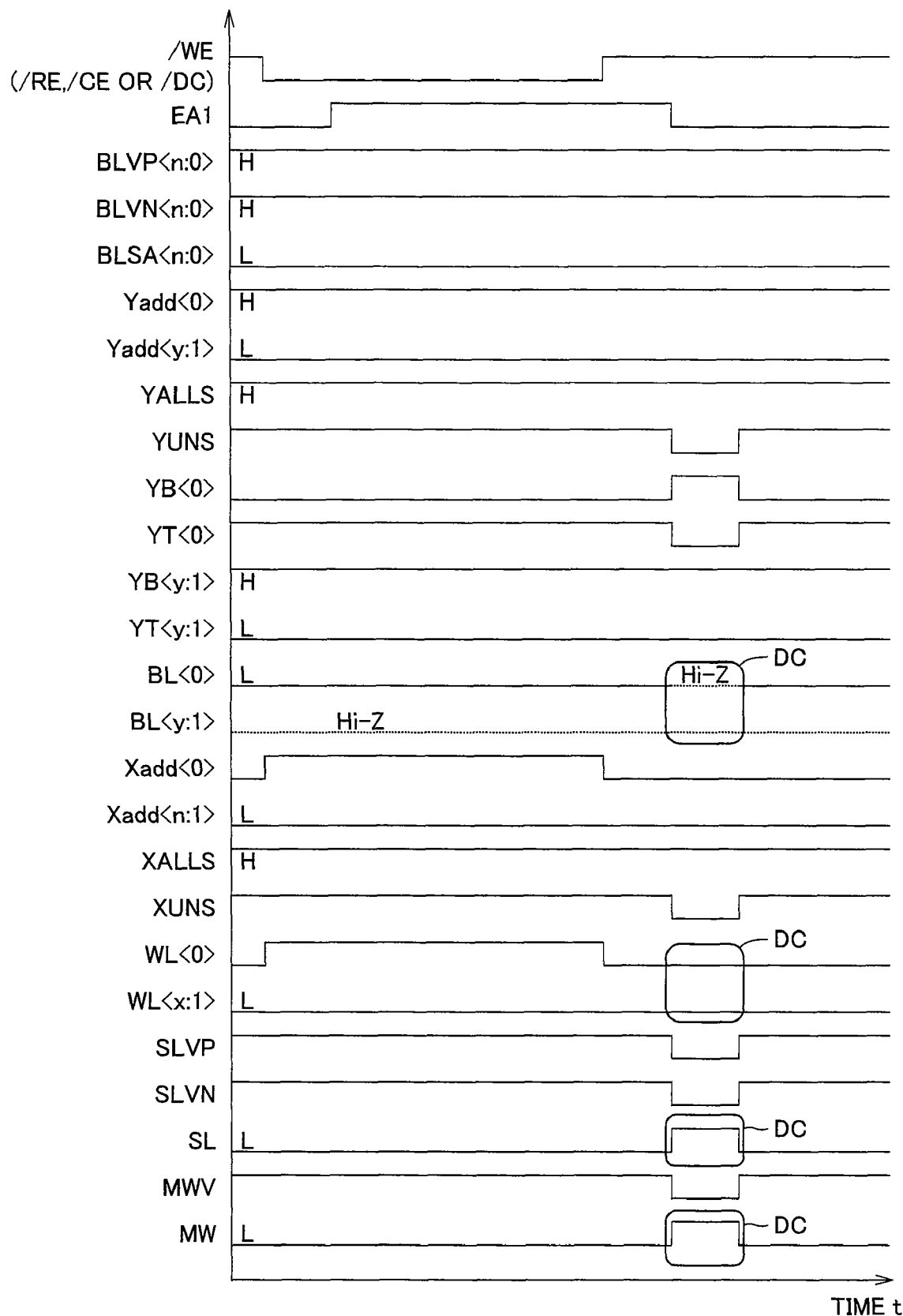
FIG. 47 is a timing chart representing an operation of the phase change memory shown in FIGS. 43-46.

FIG. 47 is a timing chart representing a discharge operation of the present phase change memory, comparable to FIG. 42. Referring to FIG. 47, when write activation signal /WE is held at an L level for just a predetermined time and internal row address signal Xadd <0> is held at an H level for just a predetermined time, word line WL <0> is pulled up to an H level for just a predetermined time. Further, signal EA1 that is an inverted and delayed version of write activation signal /WE is generated. The inverted signal of the logical AND of signals /WE and EA1 becomes signals YUNS, XUNS, SLVP, SLVN, and MWV. Therefore each of signals YUNS, XUNS, SLVP, SLVN, and MWV is set an L level for just a predetermined time after word line WL <0> is pulled down to an L level.

When Y all-deselect signal YUNS is set an L level, bit line select signals YB <0> to YB <y> are driven to an H level and bit line select signals YT <0> to YT <y> are driven to an L level. All bit lines BL <0> to BL <y> are set at an open state. Further, when X all-deselect signal XUNS is set at an L level, all word lines WL <0> to WL <x> are driven to an L level. When signals SLVP and SLVN are set at an L level, source line SL is driven to an H level. Further, when signal MWV is set at an L level, well line MW is driven to an H level. Accordingly, H level is applied to one electrode of phase change element 6 in all memory cells MM, and the other electrode is set at an open state. Thus, a discharge operation is carried out on all memory cells MM (refer to FIG. 15).

Since a discharge operation is carried out independent of a set operation and a reset operation in the fourth embodiment, resistance variation at phase change element 6 can be suppressed.

Although the same voltage VP is applied to the source of P channel MOS transistor 63 of FIG. 40, to the source of P channel MOS transistor 71 of FIG. 44, and to the source of P channel MOS transistor 75 of FIG. 45 in the fourth embodiment, different voltages may be applied instead.

The above description is based on the case where one source line SL and one well line MW are provided with respect to all memory cells MM in memory array MA. Alternatively, memory array MA may be divided into a plurality of memory blocks, each including a plurality of memory cells MM, and a source line SL, source switching circuit SLSW, well line MW, and well switching circuit MWSW may be provided for each memory block.

Figure 48:
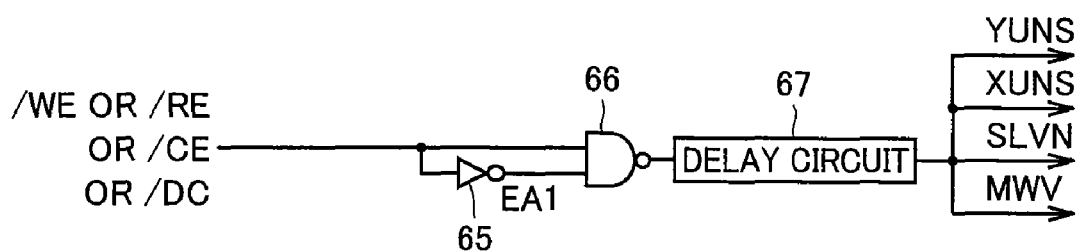
FIG. 48 is a circuit diagram representing a modification of the fourth embodiment.
Figure 49:
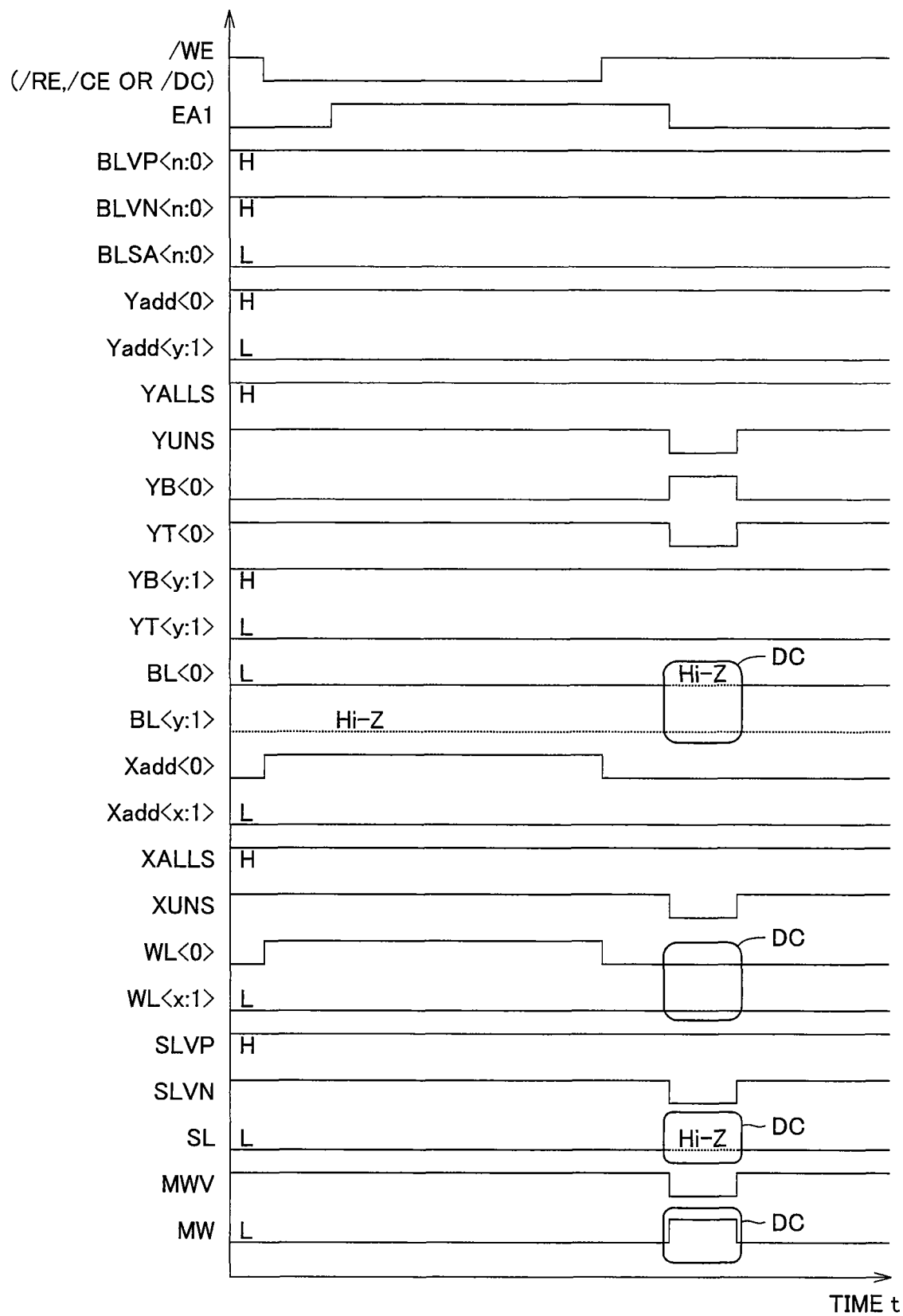
FIG. 49 is a timing chart representing an operation of the phase change memory of FIG. 48.

FIG. 48 is a circuit block diagram representing a modification of the fourth embodiment, comparable to FIG. 46. FIG. 49 is a timing chart representing an operation of this modification, comparable to FIG. 47. In the present modification of FIGS. 48 and 49, signal SLVP is fixed at an H level. Therefore, when signal SLVP attains an L level, transistors 73 and 74 of FIG. 45 are both rendered nonconductive, and source line SL is set at an open state. In this case, H level is applied to one electrode of phase change element 6 in all memory cells MM via well line MW, and the other electrode is set at an open state. Thus, a discharge operation is carried out on all memory cells MM (refer to FIG. 15).

Fifth Embodiment

Figure 50:
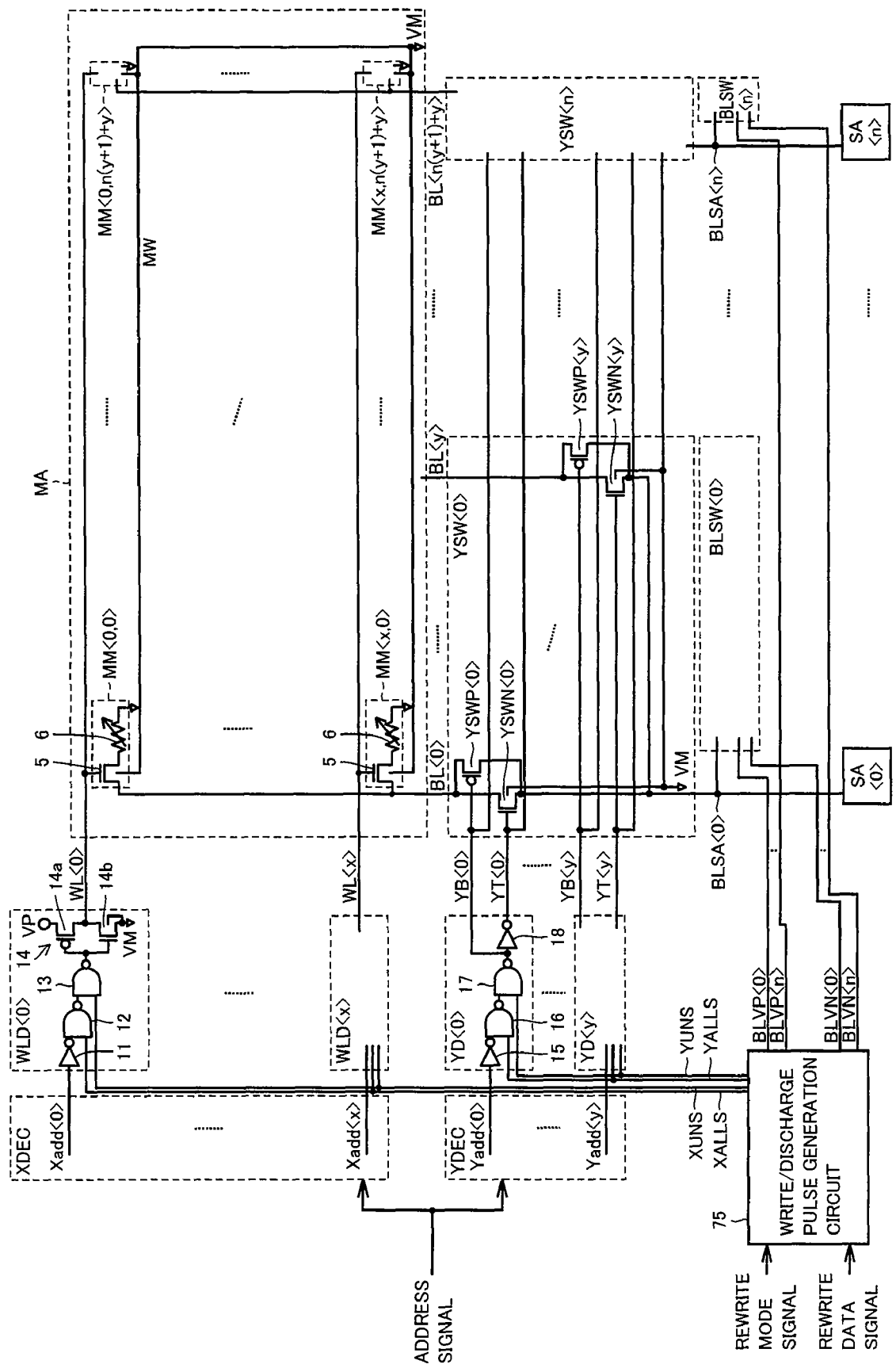
FIG. 50 is a block diagram representing an entire configuration of a phase change memory according to a fifth embodiment of the present invention.

FIG. 50 is a circuit block diagram representing an entire configuration of a phase change memory according to a fifth embodiment of the present invention, comparable to FIG. 43. The phase change memory of FIG. 50 differs from the phase change memory of FIG. 43 mainly in that source line SL and switching circuits SLSW and MWSW are removed, and that voltage VM is applied to well line MW. Further, N channel MOS transistor 5 and phase change element 6 of each memory cell MM are connected between bit line BL and the line of ground voltage VSS, and write/discharge pulse generation circuit 70 is replaced with a write/discharge pulse generation circuit 75. Voltage VM takes the level of a negative voltage in a discharge operation mode, and the level of ground voltage VSS at other modes.

The last stage inverter 14 of word line driver WLD includes a P channel MOS transistor 14a and an N channel MOS transistor 14b. P channel MOS transistor 14a receives voltage VP at its source, has its drain connected to word line WL, and receives the output signal from NAND gate 13 at its gate. N channel MOS transistor 14b has its drain connected to word line WL, receives voltage VM at its source and well, and receives the output signal from NAND gate 13 at its gate. Further, the well of N channel MOS transistor YSWN of Y switch YSW receives voltage VM.

Figure 51:
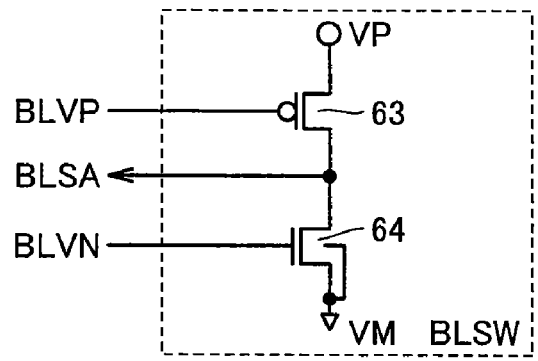
FIG. 51 is a circuit diagram representing a configuration of the write/discharge circuit shown in FIG. 50.

Referring to FIG. 51, N channel MOS transistor 64 of write/discharge circuit BLSW receives voltage VM at its source and well. When signals BLVP and BLVN both attain an H level, transistor 63 is rendered nonconductive whereas transistor 64 is rendered conductive. Node BLSA is set at the level of voltage VM. When signals BLVP and BLVN both attain an L level, transistor 63 is rendered conductive and transistor 64 is rendered nonconductive. Node BLSA is set at the level of voltage VP. When signals BLVP and BLVN attain an H level and an L level, respectively, transistors 63 and 64 are both rendered nonconductive, and node BLSA is set at an open state.

Figure 52:
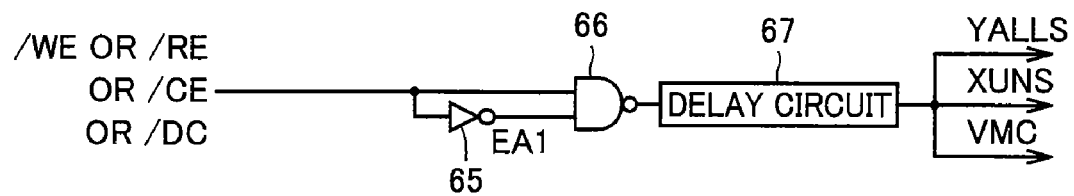
FIG. 52 is a circuit diagram representing a configuration of the write/discharge pulse generation circuit shown in FIG. 50.

FIG. 52 is a circuit block diagram representing the main part of a write/discharge pulse generation circuit 75, comparable to FIG. 46. Referring to FIG. 52, write/discharge pulse generation circuit 75 includes inverter 65, NAND gate 66, and delay circuit 67 connected in a manner similar to that of write/discharge pulse generation circuit 60. It is to be noted that the output signal from delay circuit 67 is used as Y all-select signal YALLS, X all-deselect signal XUNS, and signal VMC. Delay circuit 67 may be omitted, and take the output signal from NAND gate 66 as Y all-select signal YALLS, X all-deselect signal XUNS, and signal VMC. Voltage VM is set at level of ground voltage VSS and a negative voltage when signal VMC is at an H level and an L level, respectively, by a voltage switching circuit (not shown).

Figure 53:
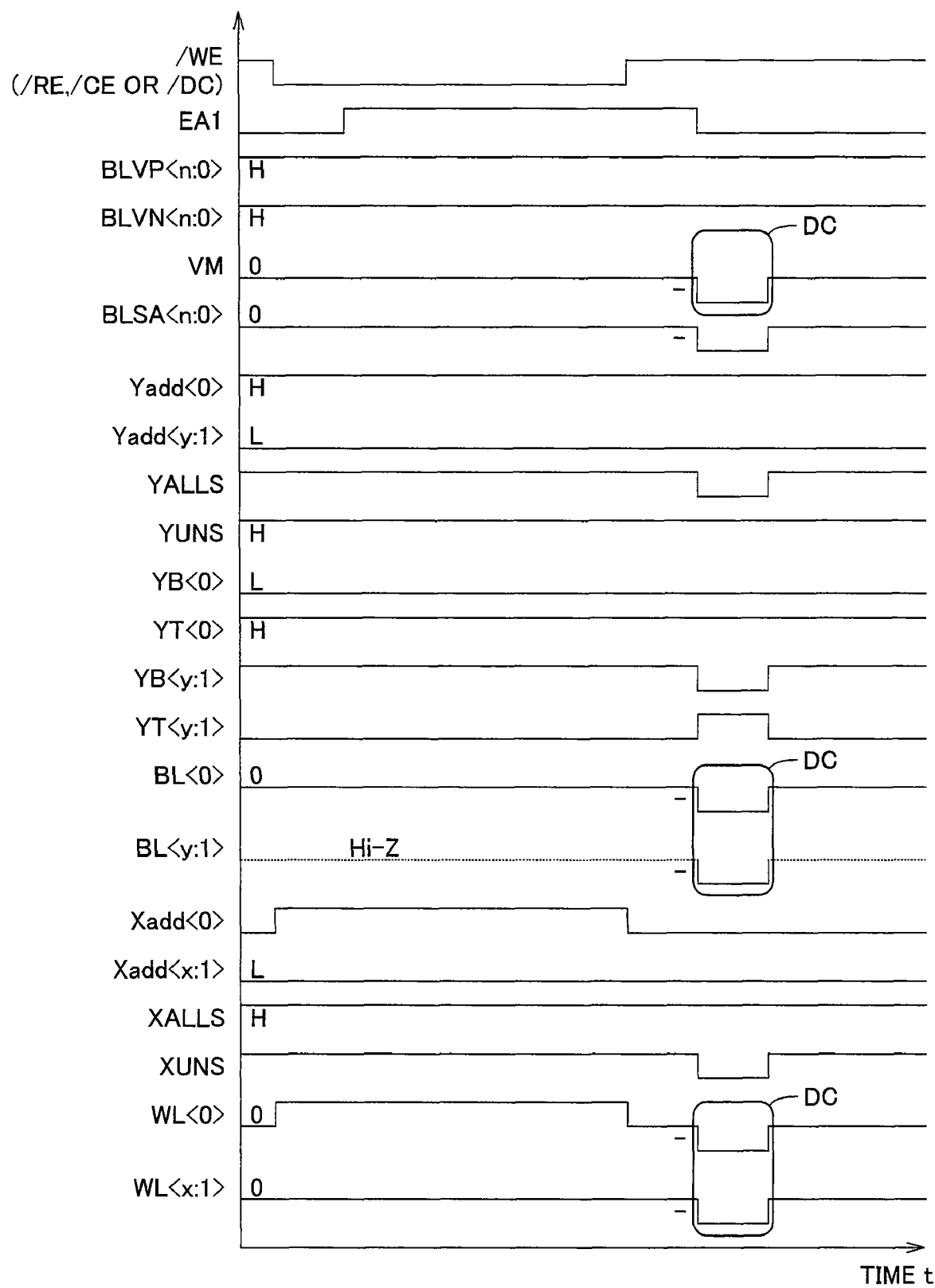
FIG. 53 is a timing chart representing an operation of the phase change memory shown in FIGS. 50-52.

FIG. 53 is a timing chart representing a discharge operation of the present phase change memory, comparable to FIG. 47. Referring to FIG. 53, when write activation signal /WE is held at an L level for just a predetermined time and internal row address signal Xadd <0> is held at an H level for just a predetermined time, word line WL <0> is pulled up to an H level for just a predetermined time. Further, signal EA1 that is an inverted and delayed version of write activation signal /WE is generated. The inverted signal of the logical AND of signals /WE and EA1 becomes signals YALLS, XUNS, and VMC. Therefore, each of signals YALLS, XUNS, and VMC is held an L level for just a predetermined time after word line WL <0> is pulled down to an L level.

In response to signal VMC attaining an L level, voltage VM takes the level of a negative voltage, and nodes BLSA <0> to BLSA <n> are set at a negative voltage. In response to Y all-select signal YALLS attaining an L level, bit line select signals YB <0> to YB <y> are driven to an L level and bit line select signals YT <0> to YT <y> are driven to an H level. All bit lines BL <0> to BL <y> attain the level of a negative voltage. In response to X all-deselect signal XUNS attaining an L level, all word lines WL <0> to WL <x> are set at a negative voltage. Accordingly, phase change element 6 of all memory cells MM has one electrode set at an open state, and the other electrode set at the level of ground voltage VSS. A discharge operation is carried out on all memory cells MM (refer to FIG. 13).

In the present fourth embodiment, since a discharge operation is carried out independent of a set operation and reset operation in the present fourth embodiment, resistance variation at phase change element 6 can be suppressed.

Figure 54:
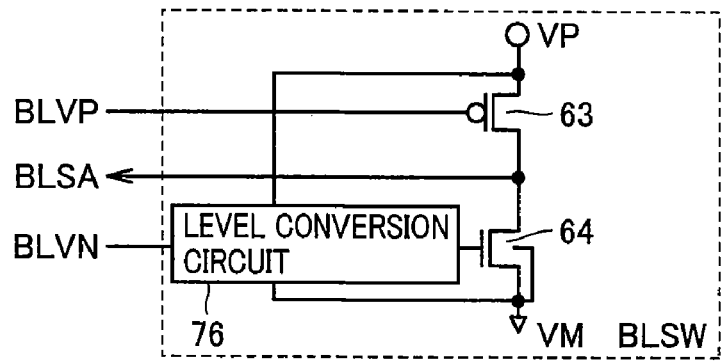
FIG. 54 is a circuit diagram exemplifying another configuration of the write/discharge circuit of FIG. 50.

It is to be noted that a level conversion circuit 76 may be added to write/discharge circuit BLSW, as shown in FIG. 54. Level conversion circuit 76 applies voltage VP and voltage VM to the gate of N channel MOS transistor 64 when signal BLVN is at an H level and L level, respectively.

Figure 55:
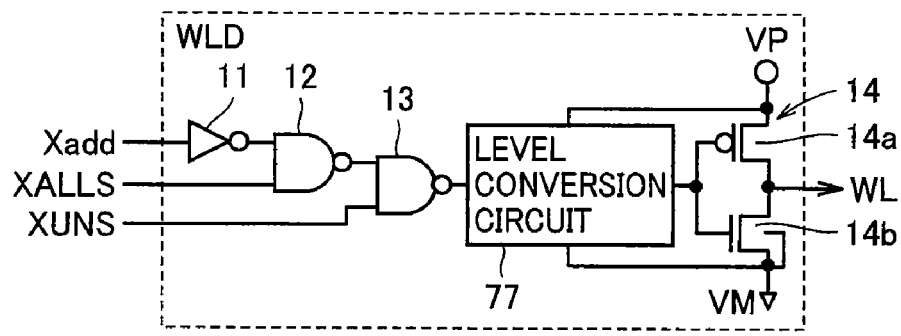
FIG. 55 is a circuit diagram exemplifying another configuration of the word line driver of FIG. 50.

Further, a level conversion circuit 77 may be added to word line driver WLD, as shown in FIG. 55. Level conversion circuit 77 applies voltage VP and voltage VM to the input node of inverter 14 when the output signal from NAND gate 13 is at an H level and L level, respectively.

Figure 56:
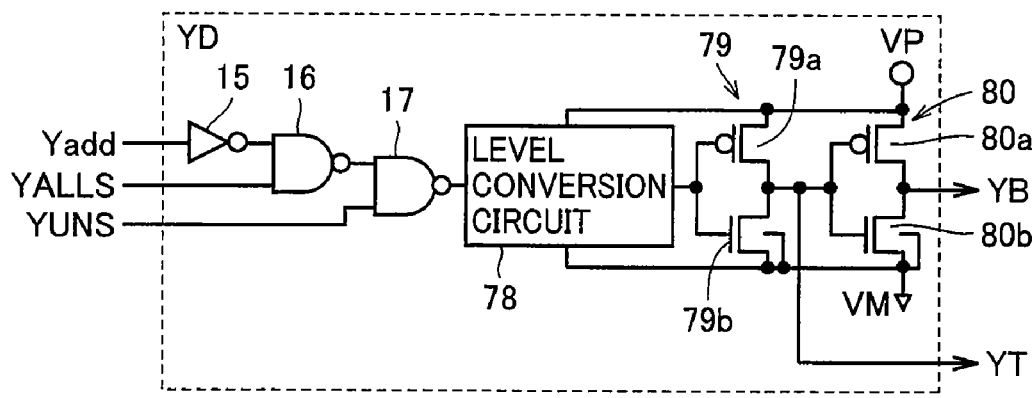
FIG. 56 is a circuit diagram exemplifying another configuration of the Y driver of FIG. 50.

Further, the last stage inverter 18 of Y driver YD may be replaced with a level conversion circuit 78 and inverters 79 and 80, as shown in FIG. 56. Level conversion circuit 78 outputs voltage VP and voltage VM when the output signal from NAND gate 17 is at an H level and L level, respectively. Inverter 79 includes a P channel MOS transistor 79a and an N channel MOS transistor 79b to generate signal YT that is an inverted version of the output signal from level conversion circuit 78. Inverter 80 includes a P channel MOS transistor 80a and an N channel MOS transistor 80b to output signal YB that is an inverted version of output signal YT from inverter 79. P channel MOS transistors 79a and 80a receive voltage VP at their sources. N channel MOS transistors 79b and 80b receive voltage VM at their sources. When the output signal from level conversion circuit 78 is at an H level (voltage VP), output signals YT and YB from inverters 79 and 80 attain an L level (voltage VM) and an H level (voltage VP), respectively. When the output signal from level conversion circuit 78 is at an L level (voltage VM), output signals YT and YB from inverters 79 and 80 attain an H level (voltage VP) and an L level (voltage VM), respectively.

Sixth Embodiment

Figure 57:
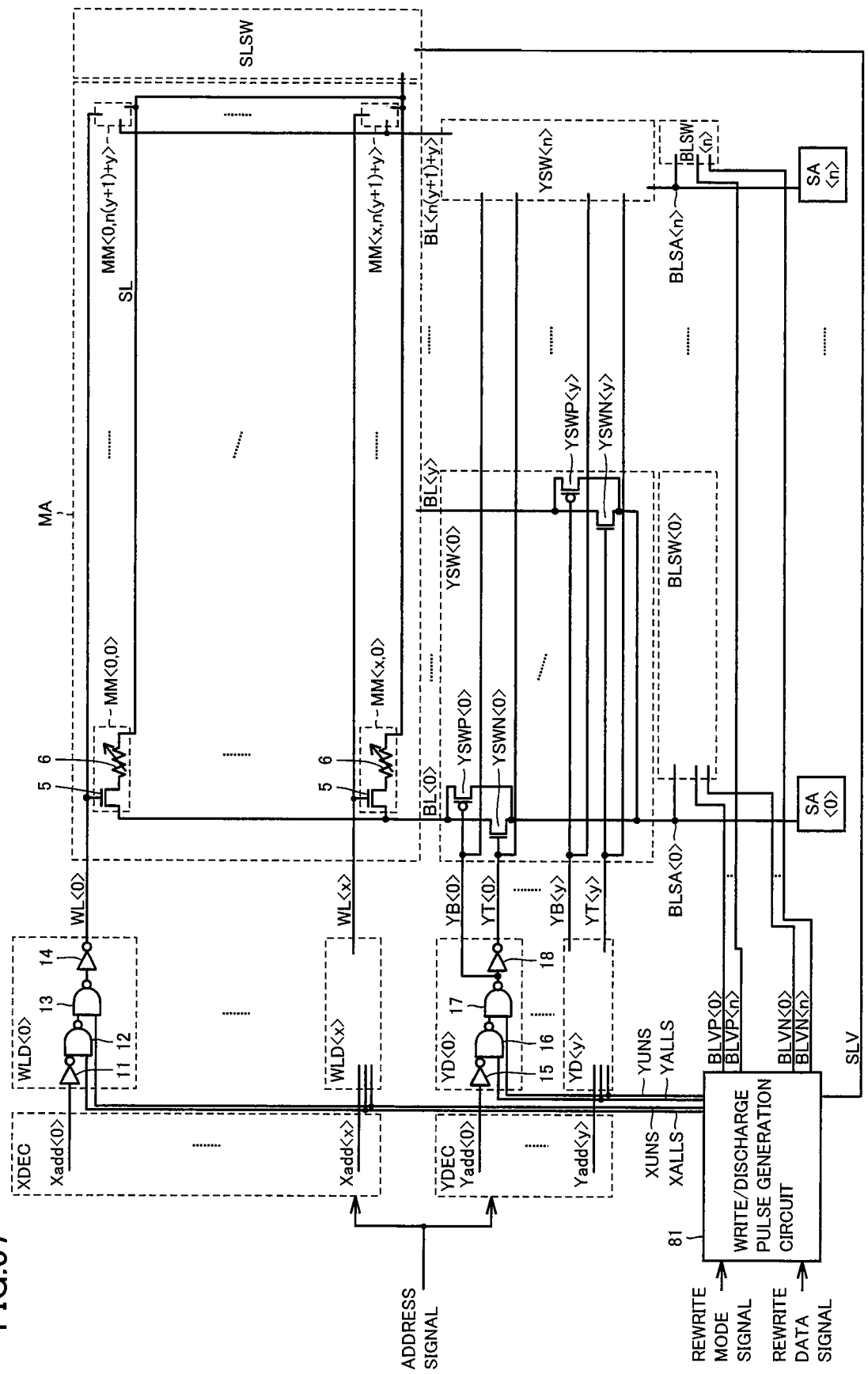
FIG. 57 is a block diagram representing an entire configuration of a phase change memory according to a sixth embodiment of the present invention.

FIG. 57 is a circuit block diagram representing an entire configuration of a phase change memory according to a sixth embodiment of the present invention, comparable to FIG. 38. The phase change memory of FIG. 57 differs from the phase change memory of FIG. 38 mainly in that N channel MOS transistor 5 and phase change element 6 of each memory cell MM are connected between bit line BL and source line SL, and that write/discharge pulse generation circuit 60 is replaced with a write/discharge pulse generation circuit 81.

Figure 58:
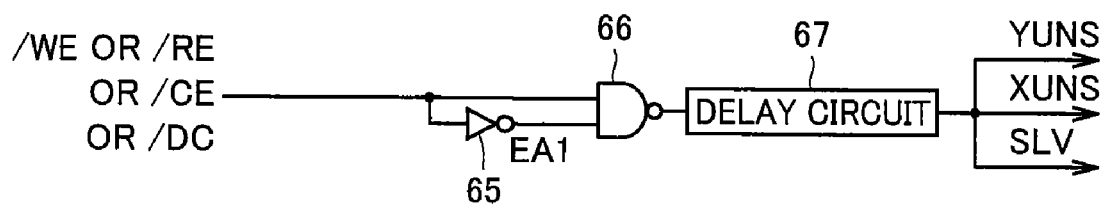
FIG. 58 is a circuit diagram representing a configuration of the write/discharge pulse generation circuit shown in FIG. 57.

FIG. 58 is a circuit block diagram representing the main part of write/discharge pulse generation circuit 81, comparable to FIG. 41. Referring to FIG. 58, write/discharge pulse generation circuit 81 includes inverter 65, NAND gate 66, and delay circuit 67 connected in a manner similar to that of write/discharge pulse generation circuit 60. It is to be noted that the output signal from delay circuit 67 is used as Y all-deselect signal YUNS, X all-deselect signal XUNS, and signal SLV. Delay circuit 67 may be omitted, and take the output signal from NAND gate 66 as Y all-deselect signal YUNS, X all-deselect signal XUNS, and signal SLV.

Figure 59:
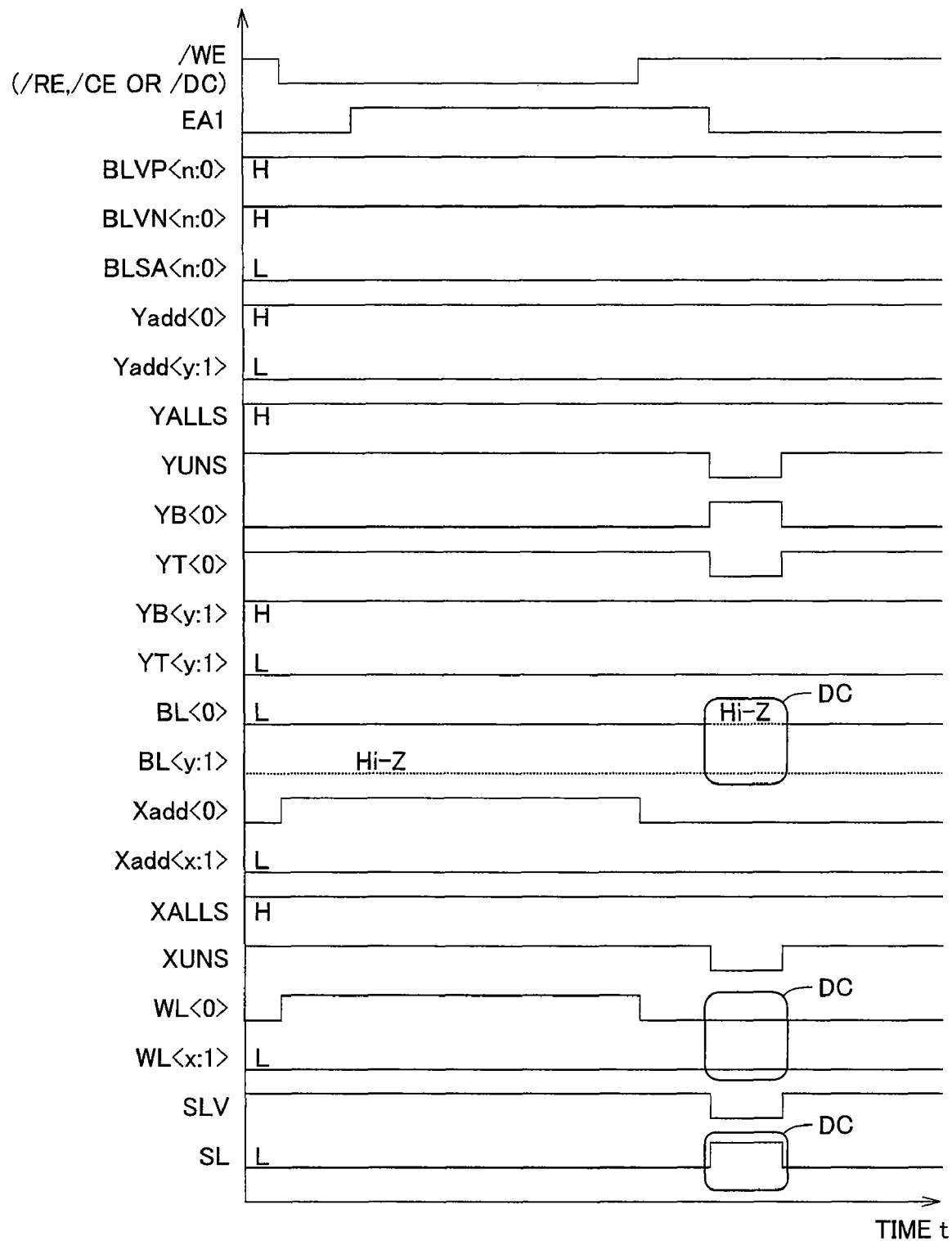
FIG. 59 is a timing chart representing an operation of the phase change memory of FIGS. 57 and 58.

FIG. 59 is a timing chart representing a discharge operation of the present phase change memory, comparable to FIG. 42. Referring to FIG. 59, when write activation signal /WE is held at an L level for just a predetermined time and internal row address signal Xadd <0> is held at an H level for just a predetermined time, word line WL <0> is pulled up to an H level for just a predetermined time. Further, signal EA1 that is an inverted and delayed version of write activation signal /WE is generated. The inverted signal of the logical AND of signals /WE and EA1 becomes signals YUNS, XUNS, and SLV. Therefore, each of signals YUNS, XUNS, and SLV attains an L level for just a predetermined time after word line WL <0> is pulled down to an L level.

In response to Y all-deselect signal YUNS attaining an L level, bit line select signals YB <0> to YB <y> are driven to an H level and bit line select signals YT <0> to YT <y> are driven to an L level. All bit lines BL <0> to BL <y> are set at an open state. Further, in response to X all-deselect signal XUNS attaining an L level, all word lines WL <0> to WL <x> are driven to an L level. Further, in response to signal SLV attaining an L level, source line SL is driven to an H level. Accordingly, one electrode of phase change element 6 in all memory cells MM is set at an open state, and the other electrode is set at an H level. Thus, a discharge operation is carried out on all memory cells MM (refer to FIG. 13).

Since a discharge operation is carried out independent of a set operation and a reset operation in the sixth embodiment, resistance variation at phase change element 6 can be suppressed.

Seventh Embodiment

Figure 60:
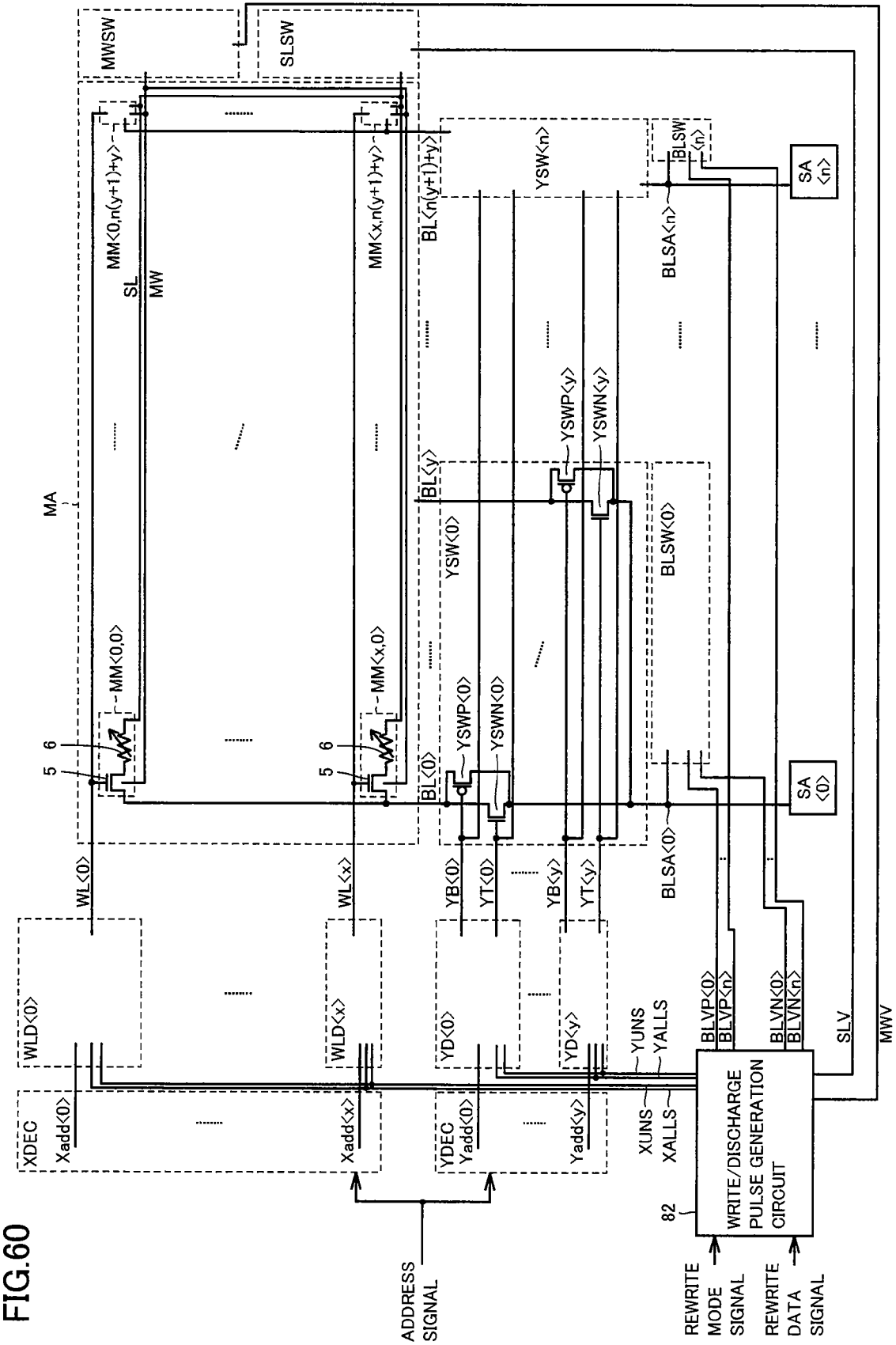
FIG. 60 is a block diagram representing an entire configuration of a phase change memory according to a seventh embodiment of the present invention.

FIG. 60 is a circuit block diagram representing an entire configuration of a phase change memory according to a seventh embodiment of the present invention, comparable to FIG. 43. The phase change memory of FIG. 60 differs from the phase change memory of FIG. 43 mainly in that N channel MOS transistor 5 and phase change element 6 in each memory cell MM are connected between bit line BL and source line SL, and that write/discharge pulse generation circuit 70 is replaced with write/discharge pulse generation circuit 82.

Figure 61:
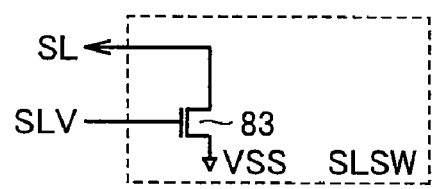
FIG. 61 is a circuit diagram representing a configuration of the write/discharge circuit shown in FIG. 60.

Referring to FIG. 61, source switching circuit SLSW includes an N channel MOS transistor 83, as shown in FIG. 61. N channel MOS transistor 83 has its drain connected to source line SL, and receives signal SLV and ground voltage VSS at its gate and source, respectively. In the case where signal SLV is at an H level, N channel MOS transistor 83 is rendered conductive, and source line SL is set at ground voltage VSS. When signal SLV is at an L level, N channel MOS transistor 83 is rendered nonconductive, and source line SL is set at an open state.

Figure 62:
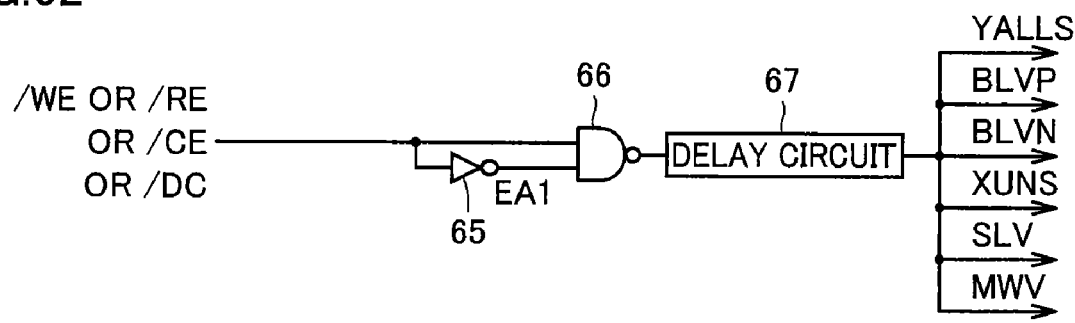
FIG. 62 is a circuit diagram representing a configuration of the write/discharge pulse generation circuit shown in FIG. 60.

FIG. 62 is a circuit block diagram representing the main parts of write/discharge pulse generation circuit 82, comparable to FIG. 46. Referring to FIG. 62, write/discharge pulse generation circuit 82 includes inverter 65, NAND gate 66, and delay circuit 67 connected in a manner similar to that of write/discharge pulse generation circuit 60. It is to be noted that the output signal from delay circuit 67 is used as Y all-select signal YALLS, X all-deselect signal XUNS, and signals BLVP, BLVN, SLV, and MWV. Delay circuit 67 may be omitted, and take the output signal from NAND gate 66 as Y all-deselect signal YUNS, X all-deselect signal XUNS, and signals BLVP, BLVN, SLV, and MWV.

Figure 63:
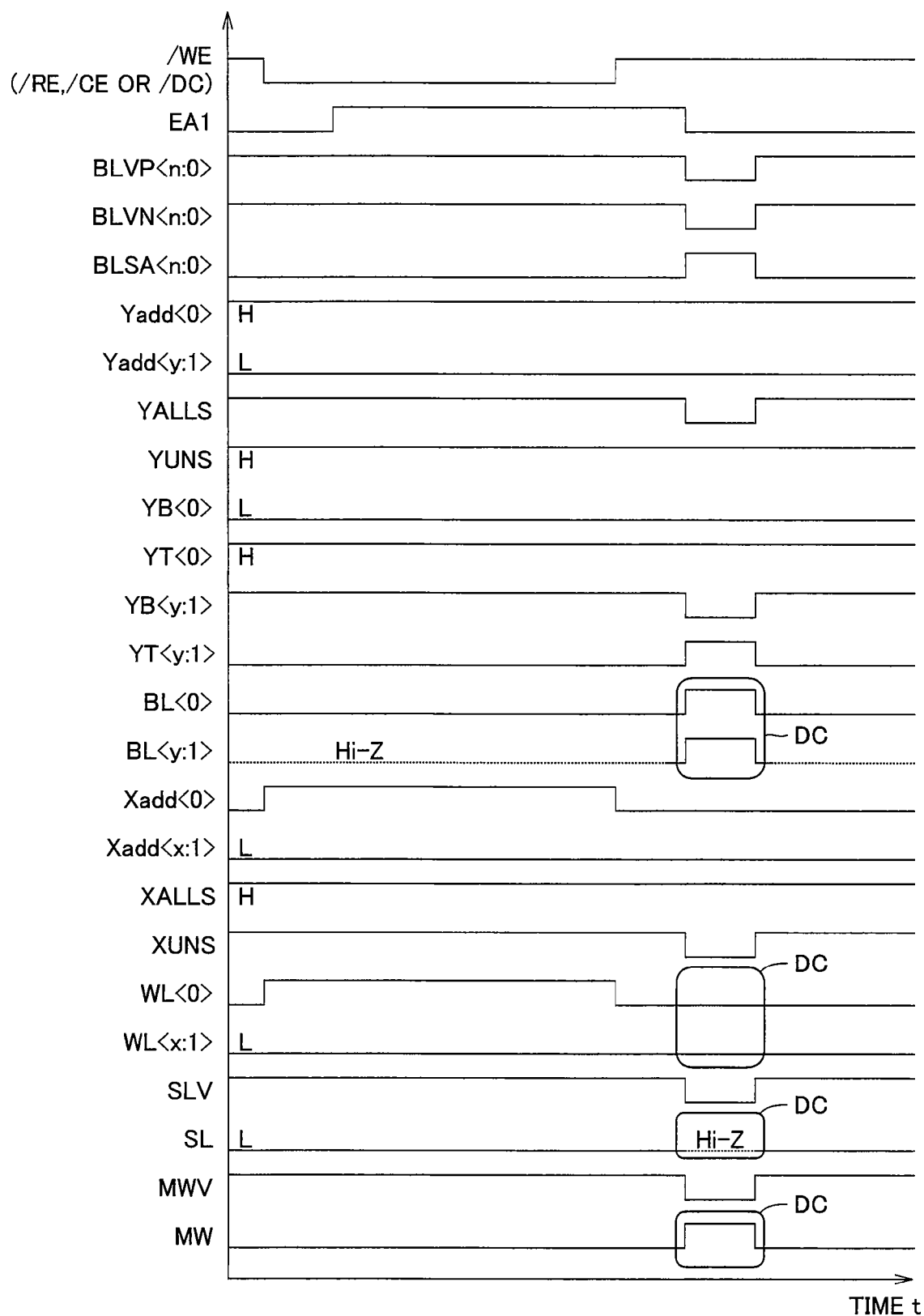
FIG. 63 is a timing chart representing an operation of the phase change memory of FIGS. 60-62.

FIG. 63 is a timing chart representing a discharge operation of the present phase change memory, comparable to FIG. 47. Referring to FIG. 63, when write activation signal /WE is held at an L level for just a predetermined time, and internal row address signal Xadd <0> is held at an H level for just a predetermined time, word line WL <0> is pulled up to an H level for just a predetermined time. Further, signal EA1 that is an inverted and delayed version of write activation signal /WE is generated. The inverted signal of the logical AND of signals /WE and EA1 becomes signals YALLS, XUNS, BLVP, BLVN, SLV, and MWV. Therefore, each of signals YALLS, XUNS, BLVP, BLVN, SLV, and MWV is held at an L level for just a predetermined time after word line WL <0> is pulled down to an L level.

In response to signals BLVP <0> to BLVP <n> and BLVN <0> to BLVN <n> attaining an L level, nodes BLSA <0> to BLSA <n> are driven to an H level. In response to Y all-select signal YALLS attaining an L level, bit line select signals YB <0> to YB <y> are driven to an L level and bit line select signals YT <0> to YT <y> are driven to an H level. All bit lines BL <0> to BL <y> are driven to an H level. In response to X all-deselect signal XUNS attaining an L level, all word lines WL <0> to WL <x> are driven to an L level. In response to signal SLV attaining an L level, source line SL is set at an open state. In response to signal MWV attaining an L level, well line MW is driven to an H level. Accordingly, one electrode of phase change element 6 in all memory cells MM is set at a positive voltage, and the other electrode is set at an open state. A discharge operation is carried out on all memory cells MM (refer to FIG. 15).

Since a discharge operation can be carried out independent of a set operation and reset operation in the seventh embodiment, resistance variation at phase change element 6 can be suppressed.

Figure 64:
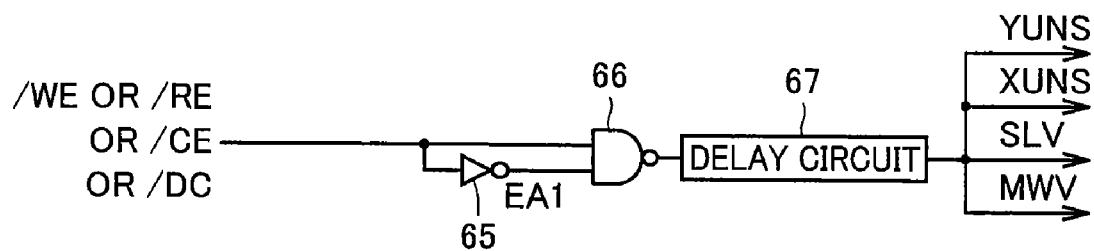
FIG. 64 is a circuit diagram representing a modification of the seventh embodiment.
Figure 65:
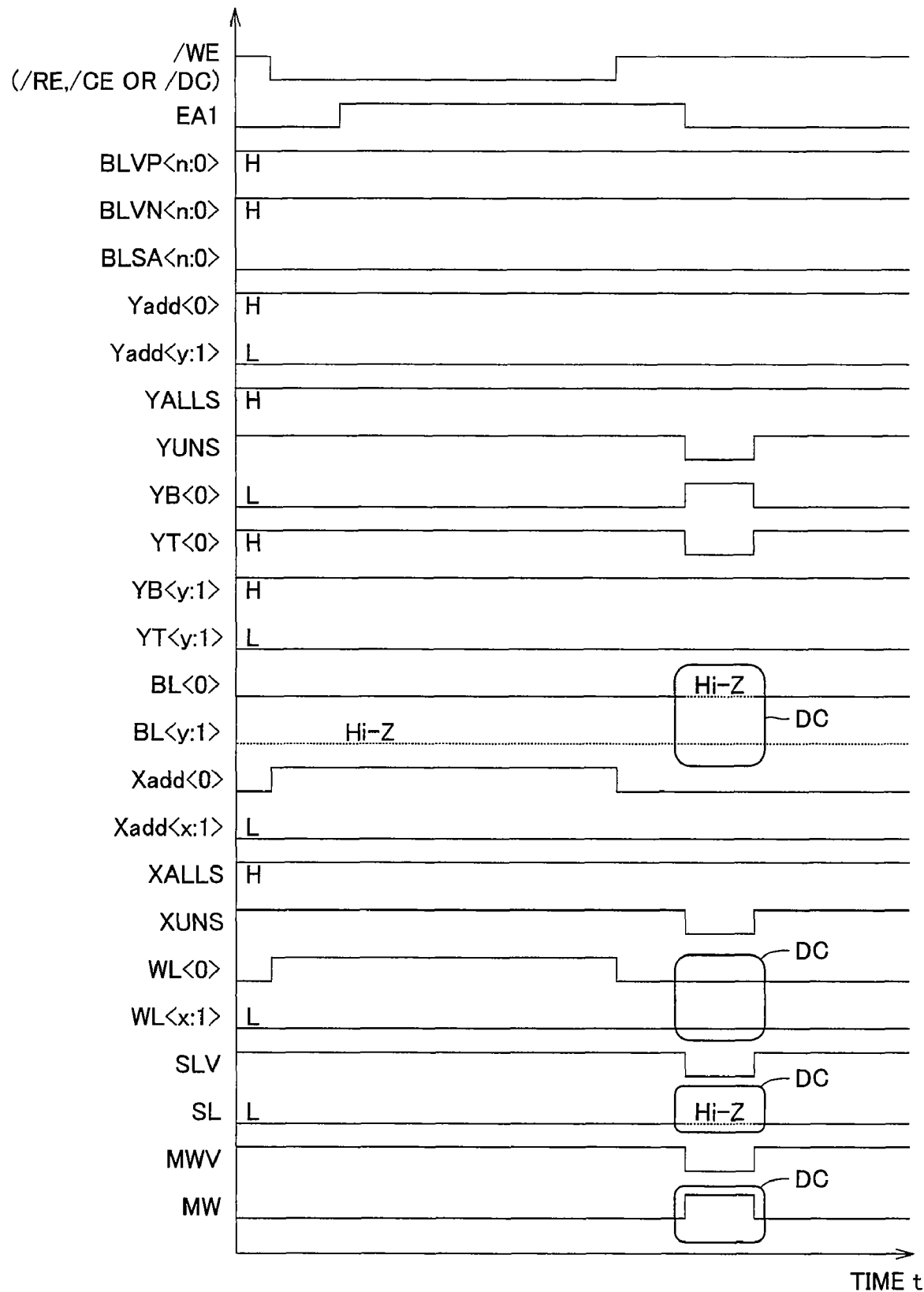
FIG. 65 is a timing chart representing an operation of the phase change memory of FIG. 64.

FIG. 64 is a circuit block diagram representing a modification of the seventh embodiment, and FIG. 65 is a timing chart representing an operation of this modification. Referring to FIG. 64, the output signal from delay circuit 67 of write/discharge pulse generation circuit 82 is used as Y all-deselect signal YUNS, X all-deselect signal XUNS, and signals SLV and MWV in the present modification. Delay circuit 67 may be omitted, and take the output signal from NAND gate 66 as Y all-deselect signal YUNS, X all-deselect signal XUNS, and signals SLV and MWV.

Referring to FIG. 65, when write activation signal /WE is held at an L level for just a predetermined time and internal row address signal Xadd <0> is held at an H level for just a predetermined time, word line WL <0> is pulled up to an H level for just a predetermined time. Further, signal EA1 that is an inverted and delayed version of write activation signal /WE is generated. The inverted signal of the logical AND of signals /WE and EA1 becomes signals YUNS, XUNS, SLV, and MWV. Therefore each of signals YUNS, XUNS, SLV, and MWV is held at an L level for just a predetermined time after word line WL <0> is pulled down to an L level.

In response to Y all-deselect signal YUNS attaining an L level, bit line select signals YB <0> to YB <y> is driven to an H level, and bit line select signals YT <0> to YT <y> are driven to an L level. All bit lines BL <0> to BL <y> are set at an open state. In response to X all-deselect signal XUNS attaining an L level, all word lines WL <0> to WL <x> are driven to an L level. In response to signal SLV attaining an L level, source line SL is set at an open state. In response to signal MWV attaining an L level, well line MW set at an H level. Accordingly, one electrode of phase change element 6 in all memory cells MM is set at the level of a positive voltage, and the other electrode is set at an open state. A discharge operation is carried out on all memory cells MM (refer to FIG. 15).

Eighth Embodiment

Figure 66:
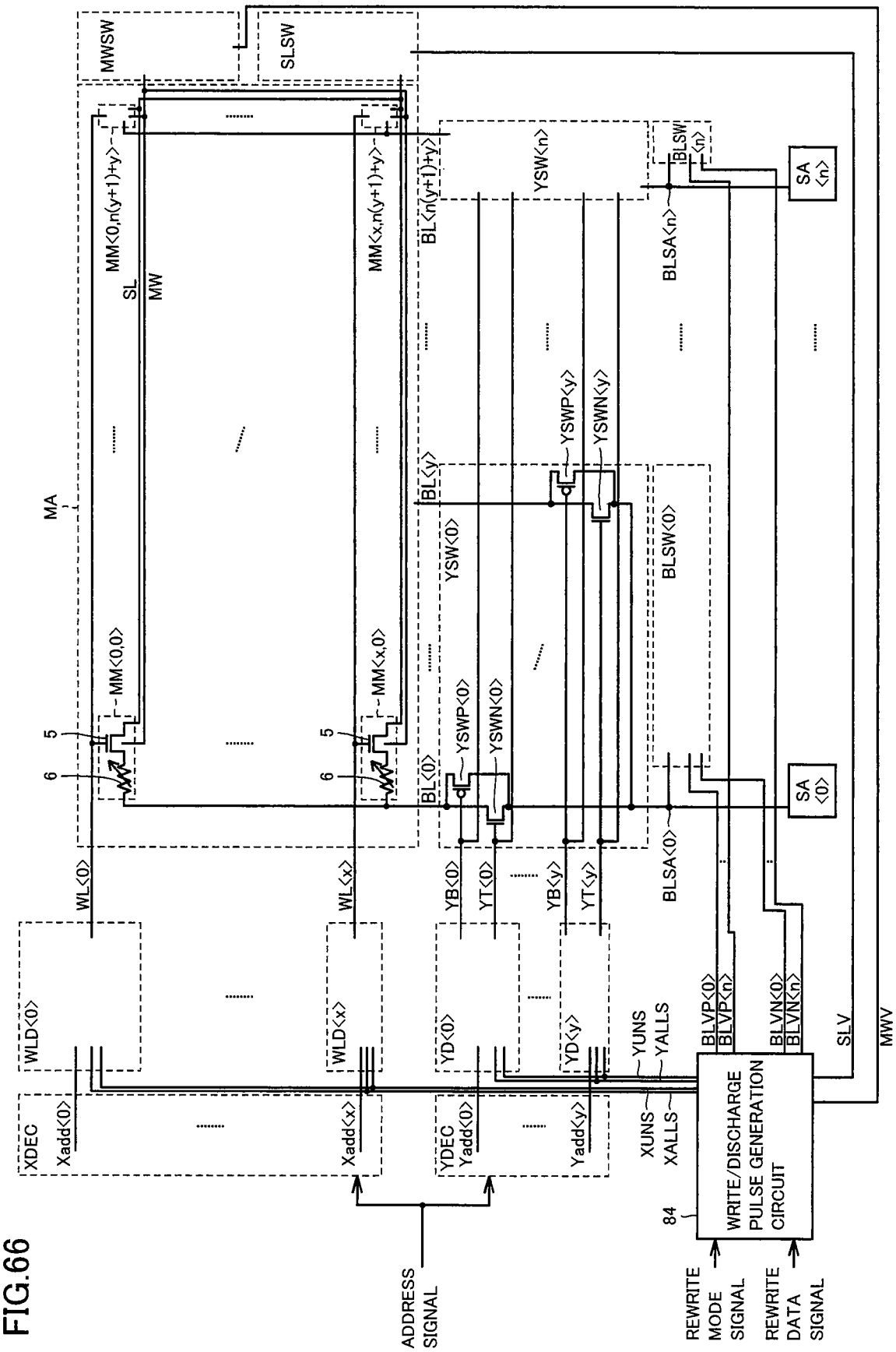
FIG. 66 is a block diagram representing an entire configuration of a phase change memory according to an eighth embodiment of the present invention.
Figure 67:
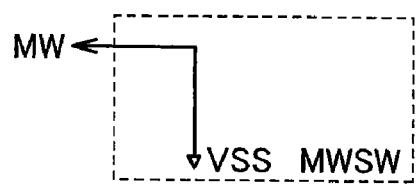
FIG. 67 is a circuit diagram representing a configuration of the well switching circuit shown in FIG. 66.

FIG. 66 is a circuit block diagram representing an entire configuration of a phase change memory according to an eighth embodiment of the present invention, comparable to FIG. 60. The phase change memory of FIG. 66 differs from the phase change memory of FIG. 60 mainly in that N channel MOS transistor 5 and phase change element 6 of each memory cell MM are connected between source line SL and bit line BL, and that write/discharge pulse generation circuit 82 is replaced with a write/discharge pulse generation circuit 84. Further, at well switching circuit MWSW, well line MW is constantly connected to the line of ground voltage VSS, as shown in FIG. 67.

Figure 68:
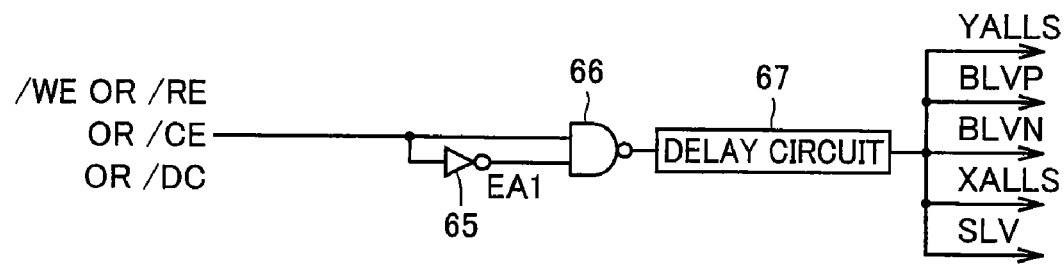
FIG. 68 is a circuit diagram representing a configuration of the write/discharge pulse generation circuit shown in FIG. 69.

FIG. 68 is a circuit block diagram representing the main part of write/discharge pulse generation circuit 84. Referring to FIG. 68, write/discharge pulse generation circuit 84 includes inverter 65, NAND gate 66, and delay circuit 67 connected in a manner similar to that of write/discharge pulse generation circuit 60. It is to be noted that the output signal from delay circuit 67 is used as Y all-select signal YALLS, X all-select signal XALLS, and signals BLVP, BLVN and SLV. Delay circuit 67 may be omitted, and take the output signal from NAND gate 66 as Y all-select signal YALLS, X all-select signal XALLS, and signals BLVP, BLVN and SLV.

Figure 69:
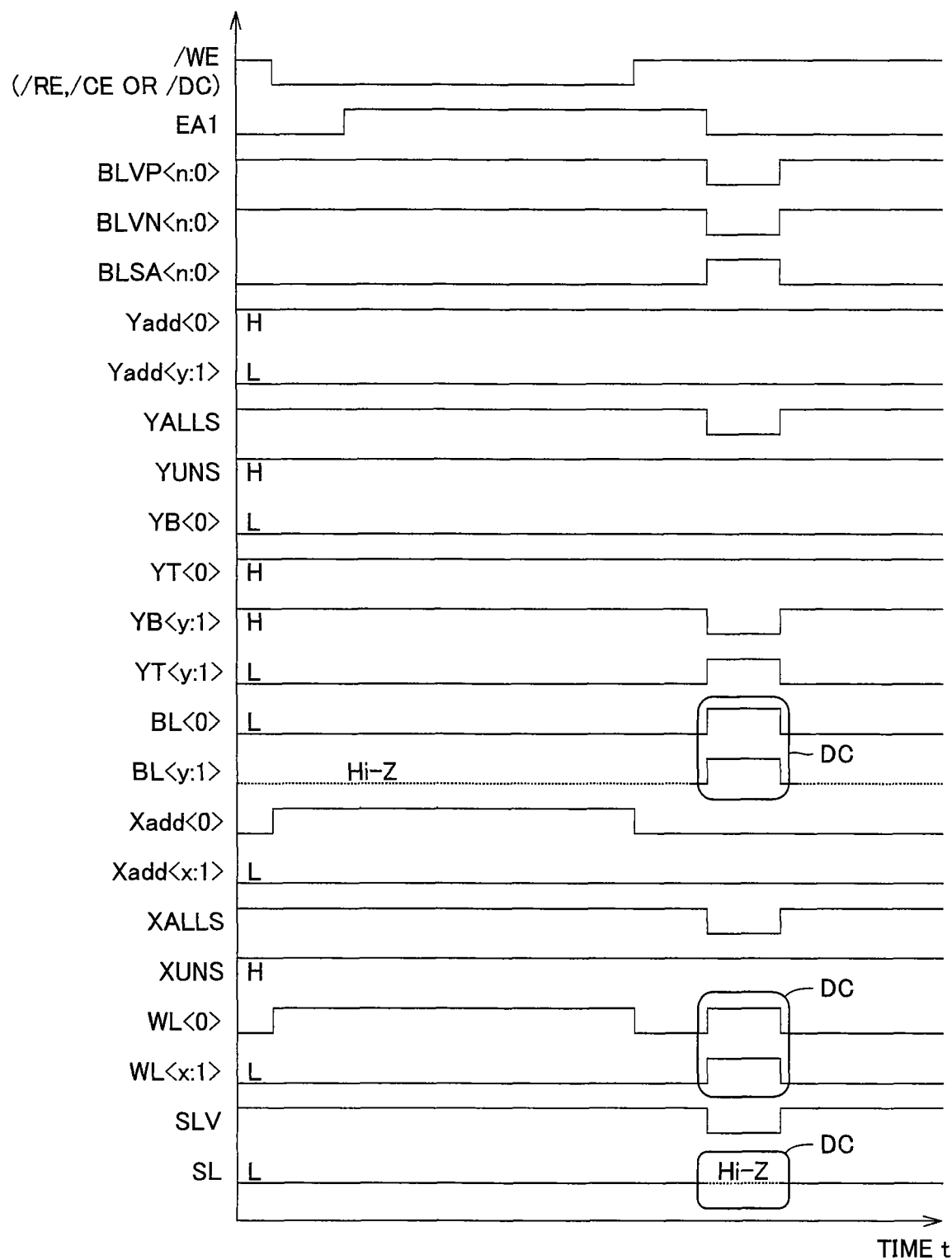
FIG. 69 is a timing chart representing an operation of the phase change memory of FIGS. 66-68.

FIG. 69 is a timing chart representing a discharge operation of the present phase change memory. Referring to FIG. 69, when write activation signal /WE is held at an L level for just a predetermined time, and internal row address signal Xadd <0> is held at an H level for just a predetermined time, word line WL <0> is pulled up to an H level for just a predetermined time. Further, signal EA1 that is an inverted and delayed version of write activation signal /WE is generated. The inverted signal of the logical AND of signals /WE and EA1 becomes signals YALLS, XALLS, BLVP, BLVN, and SLV. Therefore, each of signals YALLS, XALLS, BLVP, BLVN, and SLV is held at an L level for just a predetermined time after word line WL <0> is pulled down to an L level.

In response to signals BLVP <0> to BLVP <n> and BLVN <0> to BLVN <n> attaining an L level, nodes BLSA <0> to BLSA <n> are driven to an H level. In response to Y all-select signal YALLS attaining an L level, bit line select signals YB <0> to YB <y> are driven to an L level and bit line select signals YT <0> to YT <y> are driven to an H level. All bit lines BL <0> to BL <y> are driven to an H level. In response to X all-select signal XALLS attaining an H level, all word lines WL <0> to WL <x> are driven to an H level. In response to signal SLV attaining an L level, source line SL is set at an open state. In response to signal SLV attaining an L level, source line SL is set at an open state. Accordingly, one electrode of phase change element 6 in all memory cells MM is set at an open state, and the other electrode is set at the level of a positive voltage. A discharge operation is carried out on all memory cells MM (refer to FIG. 13).

Since a discharge operation can be carried out independent of a set operation and reset operation in the eighth embodiment, resistance variation at phase change element 6 can be suppressed.

Figure 70:
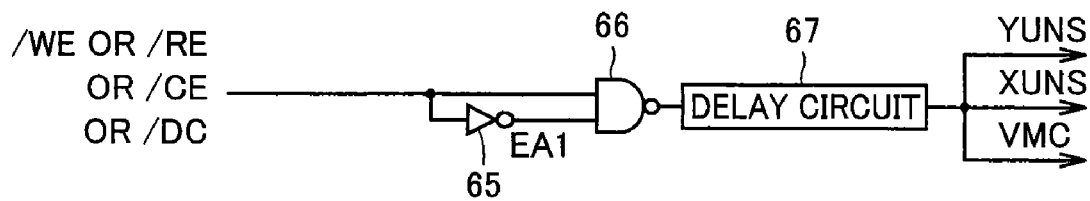
FIG. 70 is a circuit diagram representing a modification of the eighth embodiment.

FIG. 70 is a circuit block diagram representing a modification of the eighth embodiment. Referring to FIG. 70, the output signal from delay circuit 67 of write/discharge pulse generation circuit 82 in this modification is used as Y all-deselect signal YUNS, X all-deselect signal XUNS, and signal VMC. Delay circuit 67 may be omitted, and take the output signal from NAND gate 66 as Y all-deselect signal YUNS, X all-deselect signal XUNS, and signal VMC.

Figure 71:
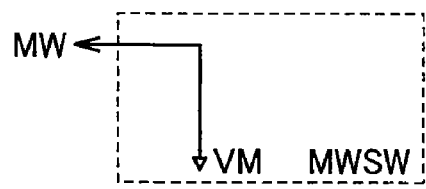
FIG. 71 is a circuit diagram representing a configuration of the well switching circuit of the phase change memory shown in FIG. 70.
Figure 72:
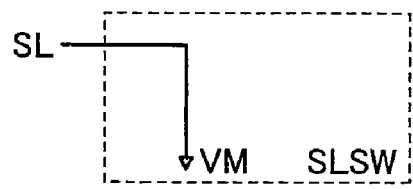
FIG. 72 is a circuit diagram representing a configuration of the source switching circuit of the phase change memory shown in FIG. 70.

Further, at well switching circuit MWSW, well line MW is constantly connected to the line of voltage VM, as shown in FIG. 71. At source switching circuit SLSW, source line SL is constantly connected to the line of voltage VM, as shown in FIG. 72. Word line driver WLD is identical to that used in FIG. 50 or FIG. 55. Voltage VM is set at level of ground voltage VSS and a negative voltage when signal VMC is at an H level and an L level, respectively, by a voltage switching circuit (not shown).

Figure 73:
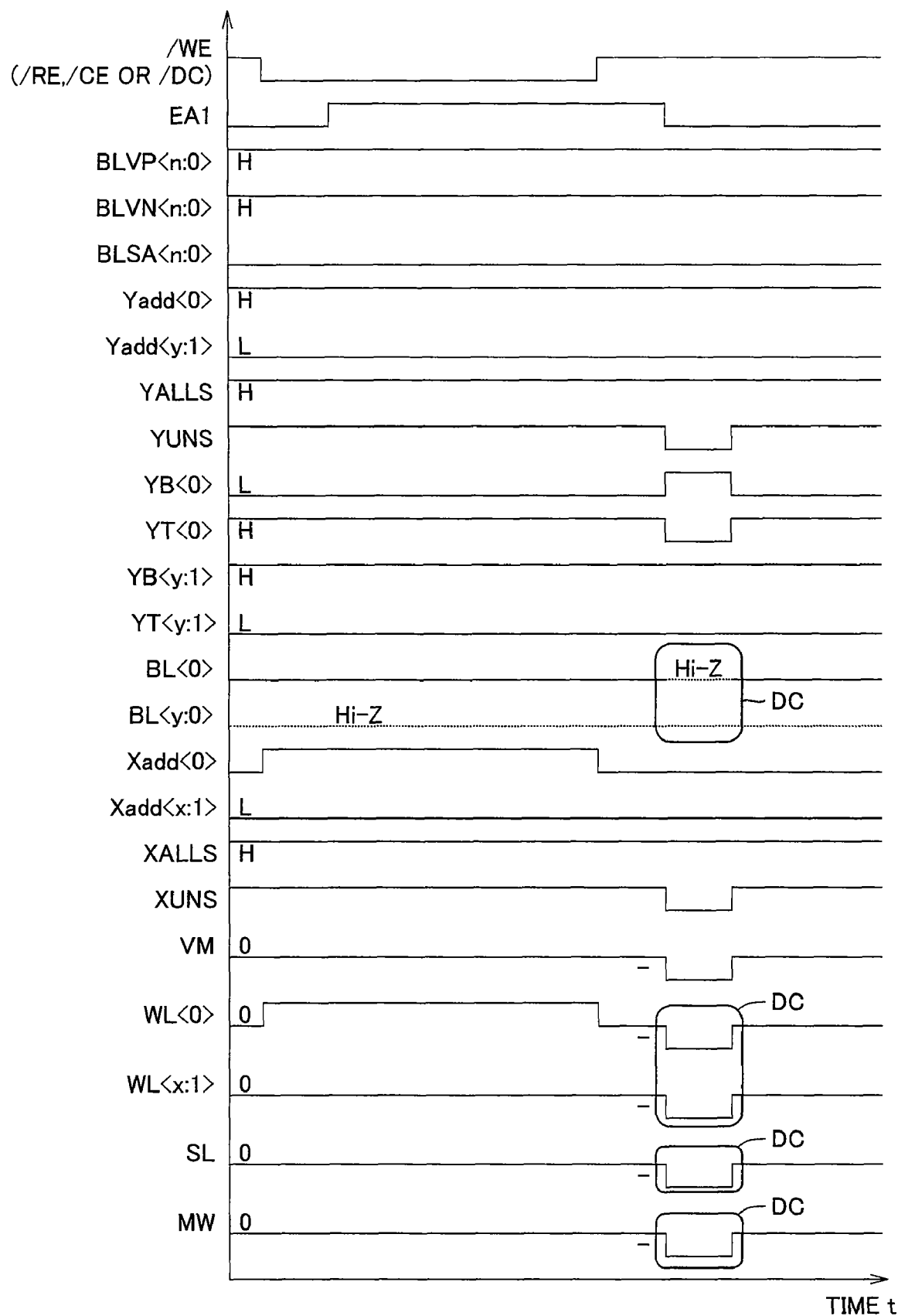
FIG. 73 is a timing chart representing an operation of the phase change memory of FIGS. 70-72.

FIG. 73 is a timing chart representing an operation of the present modification. Referring to FIG. 73, when write activation /WE is held at an L level for just a predetermined time and internal row address signal Xadd <0> is held at an H level for just a predetermined time, word line WL <0> is pulled up to an H level for just a predetermined time. Further, signal EA1 that is an inverted and delayed version of activation signal /WE is generated. The inverted signal of the logical AND of signals /WE and EA1 becomes signals YUNS, XUNS and VMC. Therefore, each of signals YUNS, XUNS and VMC is held at an L level for just a predetermined time after word line WL <0> is pulled down to an L level.

In response to Y all-deselect signal YUNS attaining an L level, bit line select signals YB <0> to YB <y> are driven to an H level and bit line select signals YT <0> to YT <y> are driven to an L level. All bit lines BL <0> to BL <y> are set at an open state. Further, in response to signal VMC attaining an L level, voltage VM is set at the level of a negative voltage, and source line SL and well line MW are set at the level of a negative voltage. In response to X all-deselect signal XUNS attaining an L level, all word lines WL <0> to WL <x> are set at a negative voltage. Accordingly, one electrode of phase change element 6 in all memory cells MM is set at a negative voltage, and the other electrode is set at an open state. A discharge operation is carried out on all memory cells MM (refer to FIG. 13).

Although the present invention has been described and illustrated in detail, it is clearly understood that the same is by way of illustration and example just and is not to be taken by way of limitation, the scope of the present invention being interpreted by the terms of the appended claims.

What is claimed is:

1. A semiconductor device comprising:
   a memory cell including a resistance storage element storing data according to level change of a resistance value,
   a write circuit applying a write voltage according to a logic of write data to said resistance storage element, and setting the resistance value of said resistance storage element in a write operation mode,
   a read circuit applying a read voltage to said resistance storage element to read out stored data from said resistance storage element based on current flowing to said resistance storage element in a readout operation mode, and
   a discharge circuit applying a discharge voltage to said resistance storage element to remove charge trapped in said resistance storage element in a discharge operation mode.

2. The semiconductor device according to claim 1, wherein said resistance storage element includes a phase change element storing data according to level change of a resistance value in association with phase change, and
   said write circuit applies a first write voltage to said phase change element to convert said phase change element to a polycrystalline state when data of a first logic is to be written, and applies a second write voltage to said phase change element to convert said phase change element to an amorphous state when data of a second logic is to be written.

3. The semiconductor device according to claim 2, wherein said phase change element includes a conductive layer and a phase change material layer that are stacked.

4. The semiconductor device according to claim 2, wherein said phase change element includes a conductive layer, an insulation layer, and a phase change material layer that are stacked.

5. The semiconductor device according to claim 1, wherein said discharge circuit applies said discharge voltage to one electrode of said resistance storage element and sets the other electrode to an open state in said discharge operation mode.

6. The semiconductor device according to claim 1, wherein said discharge voltage differs from said write voltage and said read voltage.

7. The semiconductor device according to claim 1, wherein said discharge operation is carried out immediately before and also immediately after at least one of said write operation and said readout operation.

8. The semiconductor device according to claim 1, wherein said discharge operation is carried out immediately before at least one of said write operation and said readout operation.

9. The semiconductor device according to claim 1, wherein said discharge operation is carried out immediately after at least one of said write operation and said readout operation.

10. The semiconductor device according to claim 1, wherein said discharge operation is carried out in a period independent of immediately before and immediately after each of said write operation and said readout operation.

11. The semiconductor device according to claim 1, wherein said memory cell includes only said resistance storage element.

12. The semiconductor device according to claim 1, wherein said memory cell includes a diode and said resistance storage element connected in series.

13. The semiconductor device according to claim 1, wherein said memory cell includes a field effect transistor and said resistance storage element connected in series.

14. The semiconductor device according to claim 1, wherein said memory cell includes a bipolar transistor and said resistance storage element connected in series.

15. A semiconductor device comprising:
a memory cell array including a plurality of memory cells arranged in a plurality of rows and a plurality of columns, a plurality of word lines provided corresponding to said plurality of rows, respectively, and a plurality of bit lines provided corresponding to said plurality of columns, respectively,
each memory cell including a phase change element storing data according to level change of a resistance value in association with phase change, and an N type transistor having a gate connected to a corresponding word line, and connected to a corresponding bit line in series with said phase change element,
a write circuit applying a write voltage according to a logic of write data to a phase change element of a selected memory cell to set the resistance value of said phase change element in a write operation mode,
a read circuit applying a read voltage to a phase change element of a selected memory cell to read out stored data from said phase change element based on current flowing to said phase change element in a readout operation mode, and
a discharge circuit applying a discharge voltage to one electrode of a phase change element in each memory cell and setting the other electrode at an open state to remove charge trapped at each phase change element in a discharge operation mode.

16. The semiconductor device according to claim 15, wherein
said N type transistor has its drain connected to a corresponding bit line via a corresponding phase change element, and receives a ground voltage at its source,
said discharge circuit sets each word line at the ground voltage, and applies a positive voltage to each bit line as said discharge voltage in said discharge operation mode.

17. The semiconductor device according to claim 15, wherein
said memory array further includes a source line provided common to said plurality of memory cells,
said N type transistor has its drain connected to a corresponding bit line via a corresponding phase change element, and its source connected to said source line, and
said discharge circuit sets each word line at a positive voltage and each bit line at an open state, and applies a positive voltage to said source line as said discharge voltage in said discharge operation mode.

18. The semiconductor device according to claim 15, wherein
said memory array further includes a source line and a well line provided common to said plurality of memory cells,
said N type transistor has its drain connected to a corresponding bit line via a corresponding phase change element, its source connected to said source line, and its substrate connected to said well line, and
said discharge circuit sets each word line at a ground voltage and each bit line at an open state, sets said source line at one of a positive voltage and an open state, and applies a positive voltage to said well line as said discharge voltage.

19. The semiconductor device according to claim 15, wherein
said memory array further includes a source line provided common to said plurality of memory cells,
said N type transistor has its drain connected to a corresponding bit line via a corresponding phase change element, and its source connected to said source line, and
said discharge circuit sets each word line at one end of a positive voltage and ground voltage, applies a positive voltage to each bit line as said discharge voltage, and sets said source line at an open state in said discharge operation mode.

20. The semiconductor device according to claim 15, wherein
said memory array further includes a source line and a well line provided common to said plurality of memory cells,
said N type transistor has its drain connected to a corresponding bit line via a corresponding phase change element, its source connected to said source line, and its substrate connected to said well line, and
said discharge circuit sets each word line at a negative voltage and each bit line at an open state, applies a negative voltage to said source line as said discharge voltage, and sets said well line at a negative voltage in said discharge operation mode.

21. The semiconductor device according to claim 15, wherein
said memory array further includes a well line provided common to said plurality of memory cells, said N type transistor has its drain connected to a corresponding bit line, receives a ground voltage at its source via a corresponding phase change element, and has its substrate connected to said well line, said discharge circuit sets each word line at a negative voltage, and applies a negative voltage to each bit line as said discharge voltage, and sets said well line at a negative voltage in said discharge operation mode.

22. The semiconductor device according to claim 15, wherein said memory array further includes a source line provided common to said plurality of memory cells, said N type transistor has its drain connected to a corresponding bit line, and its source connected to said source line via a corresponding phase change element, and said discharge circuit sets each word line at a ground voltage, and applies a positive voltage to said source line as said discharge voltage in said discharge operation mode.

23. The semiconductor device according to claim 15, wherein said memory array further includes a source line and a well line provided common to said plurality of memory cells, said N type transistor has its drain connected to a corresponding bit line, its source connected to said source line via a corresponding phase change element, and its substrate connected to said well line, and said discharge circuit sets each word line at a ground voltage, each bit line at one of a positive voltage and an open state, said source line at an open state, and applies a positive voltage to said well line as said discharge voltage in said discharge operation mode.

24. The semiconductor device according to claim 15, wherein said discharge circuit is rendered active in response to a discharge pulse signal, and further comprises a pulse generation circuit generating said discharge pulse signal in response to one of a write activation signal activating said write circuit, a read activation signal activating said read circuit, a chip activation signal activating said semiconductor device, a module activation signal activating a module in said semiconductor device, and a discharge designation signal designating execution of said discharge operation.

* * * * *